(12) United States Patent
Servalli et al.

(10) Patent No.: US 12,453,099 B2
(45) Date of Patent: Oct. 21, 2025

(54) INTEGRATED ASSEMBLIES AND METHODS OF FORMING INTEGRATED ASSEMBLIES

(71) Applicant: Micron Technology, Inc., Boise, ID (US)

(72) Inventors: Giorgio Servalli, Fara Gera d'Adda (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/680,742

(22) Filed: May 31, 2024

(65) Prior Publication Data
US 2024/0324236 A1    Sep. 26, 2024

Related U.S. Application Data

(63) Continuation of application No. 17/379,012, filed on Jul. 19, 2021, now Pat. No. 12,035,536.

(51) Int. Cl.
| | |
|---|---|
| *H10B 51/50* | (2023.01) |
| *H01L 25/065* | (2023.01) |
| *H10D 30/67* | (2025.01) |
| *H10B 53/30* | (2023.01) |

(52) U.S. Cl.
CPC ......... *H10B 51/50* (2023.02); *H01L 25/0655* (2013.01); *H10D 30/6728* (2025.01); *H10B 53/30* (2023.02)

(58) Field of Classification Search
CPC ..... H10B 51/50; H10B 53/30; H01L 25/0655; H01L 29/78642
See application file for complete search history.

(56) References Cited

U.S. PATENT DOCUMENTS

| | | |
|---|---|---|
| 6,190,957 B1 | 2/2001 | Mochizuki et al. |
| 7,371,627 B1 | 5/2008 | Forbes |
| 7,459,362 B2 | 12/2008 | Juengling |
| 7,646,041 B2 | 1/2010 | Chae et al. |
| 9,245,893 B1 | 1/2016 | Sukekawa |

(Continued)

OTHER PUBLICATIONS

WO PCT/US2022/036917 IPRP, Jan. 18, 2024, Micron Technology, Inc.

(Continued)

*Primary Examiner* — Jeff W Natalini
*Assistant Examiner* — Brandon C Fox
(74) *Attorney, Agent, or Firm* — Wells St. John P.S.

(57) ABSTRACT

Some embodiments include an integrated assembly having first and second pillars of semiconductor material. The first pillar includes a first source/drain region, and the second pillar includes a second source/drain region. First and second bottom electrodes are coupled with the first and second source/drain regions, respectively. The first and second source/drain regions are spaced from one another by an intervening region. First and second leaker-device-structures extend into the intervening region from the first and second bottom electrodes, respectively. Top-electrode-material extends into the intervening region and contacts the first and second leaker-device-structures. Ferroelectric-insulative-material is between the top-electrode-material and the bottom electrodes. Some embodiments include methods of forming integrated assemblies.

26 Claims, 58 Drawing Sheets

(56) References Cited

U.S. PATENT DOCUMENTS

| | | |
|---|---|---|
| 9,837,420 B1 | 12/2017 | Ramaswamy |
| 10,020,360 B1 | 7/2018 | Ramaswamy |
| 11,706,909 B2 | 7/2023 | Tang et al. |
| 11,706,927 B2 | 7/2023 | Servalli et al. |
| 2001/0022372 A1 | 9/2001 | Kanaya et al. |
| 2003/0127676 A1 | 7/2003 | Redecker |
| 2005/0127428 A1 | 6/2005 | Mokhlesi et al. |
| 2006/0002192 A1 | 1/2006 | Forbes et al. |
| 2006/0244023 A1 | 11/2006 | Kanaya |
| 2008/0096341 A1 | 4/2008 | Lai et al. |
| 2008/0128757 A1 | 6/2008 | Chae et al. |
| 2009/0020797 A1 | 1/2009 | Wang |
| 2010/0140696 A1 | 6/2010 | Yedinak et al. |
| 2011/0062504 A1 | 3/2011 | Hamamoto |
| 2011/0284939 A1 | 11/2011 | Chung et al. |
| 2012/0007165 A1 | 1/2012 | Lee et al. |
| 2012/0153365 A1 | 6/2012 | Sung |
| 2013/0043525 A1 | 2/2013 | Yu et al. |
| 2013/0320433 A1 | 12/2013 | Cho et al. |
| 2015/0091070 A1 | 4/2015 | Cho et al. |
| 2017/0346279 A1* | 11/2017 | Son .................. H01F 27/402 |
| 2018/0061468 A1 | 3/2018 | Derner et al. |
| 2018/0122816 A1 | 5/2018 | Ramaswamy |
| 2018/0130515 A1 | 5/2018 | Zawodny |
| 2018/0195049 A1 | 7/2018 | Ramaswamy |
| 2019/0189357 A1* | 6/2019 | Chavan .................. H01G 4/33 |
| 2019/0214455 A1* | 7/2019 | Kang .................. H10D 1/042 |
| 2019/0237470 A1 | 8/2019 | Mine et al. |
| 2019/0333917 A1 | 10/2019 | Ramaswamy |
| 2020/0235111 A1* | 7/2020 | Calderoni .............. H10D 1/682 |
| 2020/0243267 A1 | 7/2020 | Chavan et al. |
| 2020/0286906 A1 | 9/2020 | Karda et al. |
| 2021/0134816 A1 | 5/2021 | Calderoni et al. |
| 2021/0210491 A1 | 7/2021 | Servalli |
| 2022/0262813 A1 | 8/2022 | Karda et al. |

OTHER PUBLICATIONS

WO PCT/US2022/036917 Search Rprt., Jan. 2, 2023, Micron Technology, Inc.

WO PCT/US2022/036917 Writ. Opin., Jan. 2, 2023, Micron Technology, Inc.

\* cited by examiner

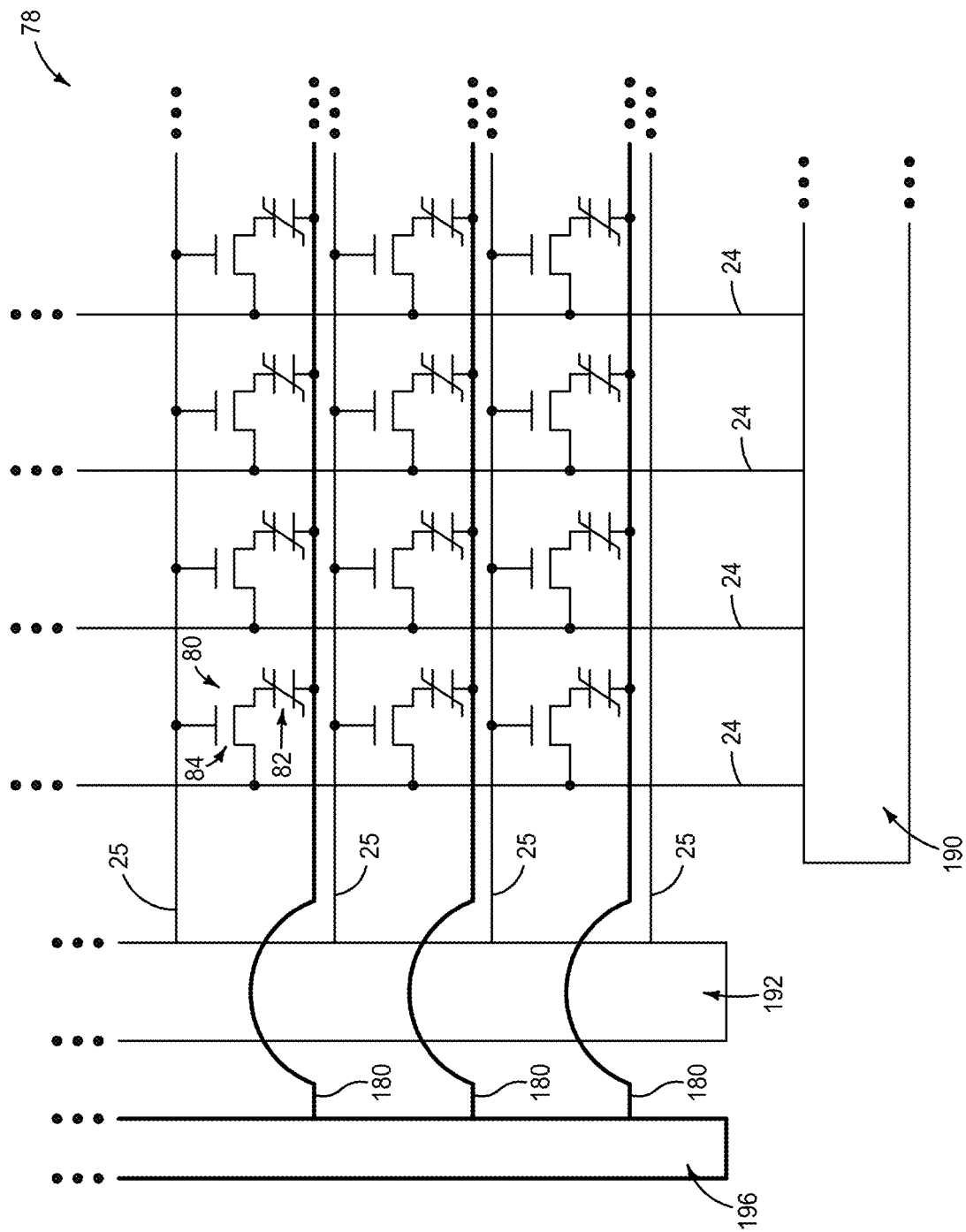

INTEGRATED ASSEMBLIES AND METHODS OF FORMING INTEGRATED ASSEMBLIES

TECHNICAL FIELD

Integrated assemblies. Methods of forming integrated assemblies. Memory devices (e.g., devices comprising FeRAM configurations). Methods of forming memory devices.

BACKGROUND

Memory devices may utilize memory cells which individually comprise an access transistor in combination with a capacitor. In some applications the capacitor may be a ferroelectric capacitor and the memory may be ferroelectric random-access memory (FeRAM).

Computers and other electronic systems (for example, digital televisions, digital cameras, cellular phones, etc.), often have one or more memory devices to store information. Increasingly, memory devices are being reduced in size to achieve a higher density of storage capacity. Even when increased density is achieved, consumers often demand that memory devices also use less power while maintaining high speed access and reliability of data stored on the memory devices.

Leakage within (through) dielectric material of memory cells can be problematic for at least the reasons that such may make it difficult to reliably store data, and may otherwise waste power. Leakage may be become increasingly difficult to control as circuitry is scaled to increasingly smaller dimensions.

It would be desirable to develop architectures which alleviate, or even prevent, undesired leakage; and to develop methods for fabricating such architectures. It would be desirable to develop improved memory architecture, and improved methods of forming memory architecture. It would also be desirable for such methods to be applicable for fabrication of FeRAM.

BRIEF DESCRIPTION OF THE DRAWINGS

FIG. 1 is a top view. FIGS. 1A and 1B are cross-sectional side views along the lines A-A and B-B, respectively, of FIG. 1.

FIGS. 1A-1 and 1B-1 are diagrammatic cross-sectional side views along the lines A-A and B-B, respectively, of FIG. 1, and show materials that may be associated with a gap shown in FIGS. 1A and 1B.

FIG. 2 is a top view. FIGS. 2A and 2B are cross-sectional side views along the lines A-A and B-B, respectively, of FIG. 2.

FIG. 3 is a top view. FIGS. 3A and 3B are cross-sectional side views along the lines A-A and B-B, respectively, of FIG. 3.

FIG. 4 is a top view. FIGS. 4A and 4B are cross-sectional side views along the lines A-A and B-B, respectively, of FIG. 4.

FIG. 5 is a top view. FIGS. 5A and 5B are cross-sectional side views along the lines A-A and B-B, respectively, of FIG. 5.

FIG. 6 is a top view. FIGS. 6A and 6B are cross-sectional side views along the lines A-A and B-B, respectively, of FIG. 6.

FIG. 7 is a top view. FIG. 7C is a three-dimensional view.

FIG. 8 is a top view. FIGS. 8A and 8B are cross-sectional side views along the lines A-A and B-B, respectively, of FIG. 8.

FIG. 9 is a top view. FIGS. 9A and 9B are cross-sectional side views along the lines A-A and B-B, respectively, of FIG. 9.

FIG. 10 is a top view. FIGS. 10A and 10B are cross-sectional side views along the lines A-A and B-B, respectively, of FIG. 10.

FIG. 11 is a top view. FIGS. 11A and 11B are cross-sectional side views along the lines A-A and B-B, respectively, of FIG. 11.

FIG. 12 is a top view. FIGS. 12A and 12B are cross-sectional side views along the lines A-A and B-B, respectively, of FIG. 12.

FIG. 13 is a top view. FIGS. 13A and 13B are cross-sectional side views along the lines A-A and B-B, respectively, of FIG. 13.

FIG. 14 is a top view. FIGS. 14A and 14B are cross-sectional side views along the lines A-A and B-B, respectively, of FIG. 14.

FIG. 15 is a top view. FIGS. 15A and 15B are cross-sectional side views along the lines A-A and B-B, respectively, of FIG. 15. The construction of FIGS. 15-15B may be considered to be a region of an example integrated assembly or a region of an example memory device.

FIG. 25 is a schematic diagram of an example memory array comprising ferroelectric capacitors.

DETAILED DESCRIPTION OF THE ILLUSTRATED EMBODIMENTS

Some embodiments include methods of forming memory architecture (e.g., FeRAM, etc.) in which bottom electrodes are configured as angle plates (e.g., "L-shaped" plates) having vertically-extending legs joining to horizontally-extending legs. Leaker-device-structures may extend laterally between neighboring bottom electrodes, and may be coupled with top-electrode-material. Ferroelectric material may be between the bottom electrodes and the top-electrode-material. Example embodiments are described with reference to FIGS. 1-25.

Figure 1:
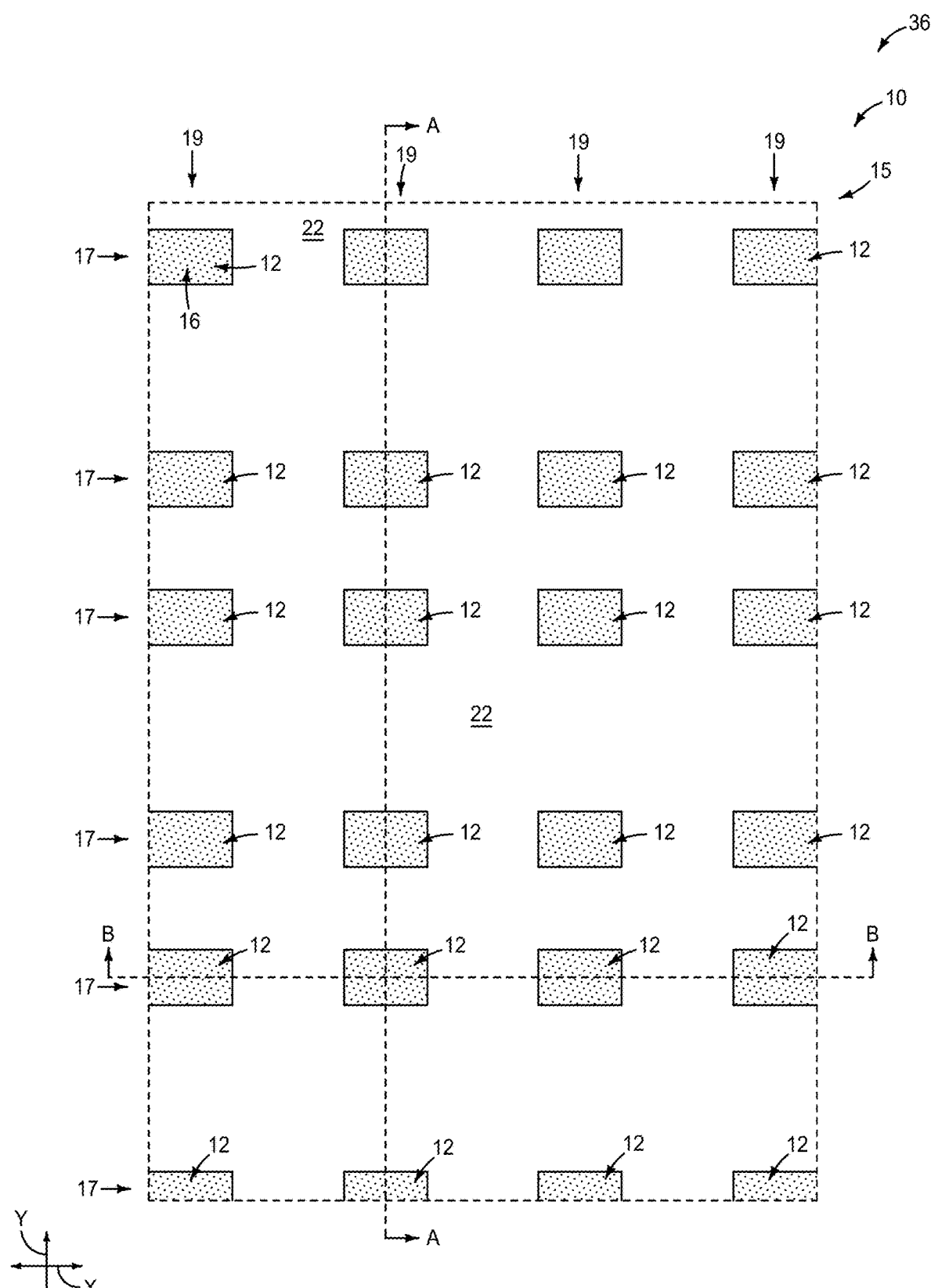
FIGS. 1-1B are diagrammatic views of a region of an example construction at an example process stage of an example method for forming an example integrated assembly.
Figure 1A:
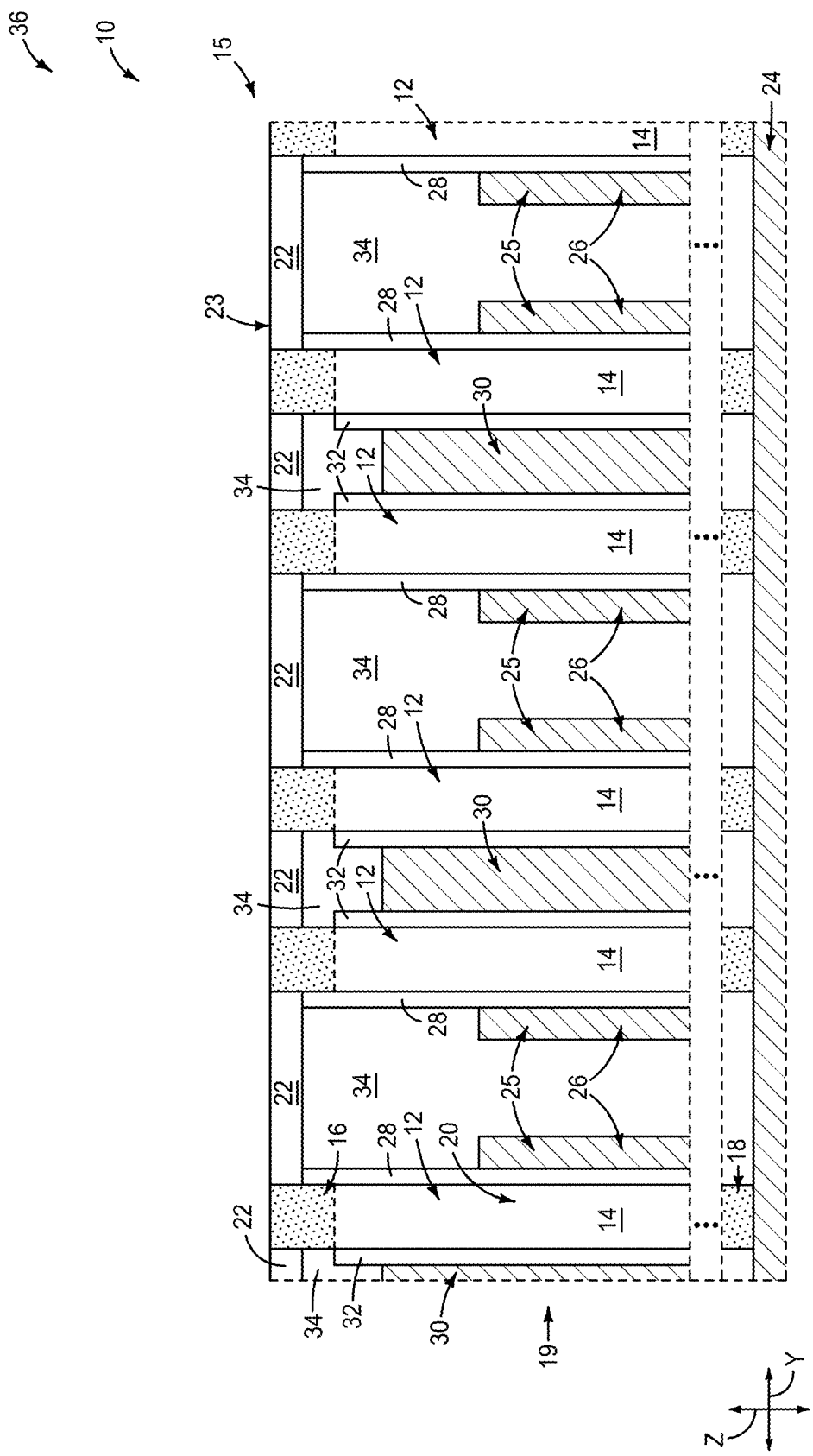
Figure 1B:
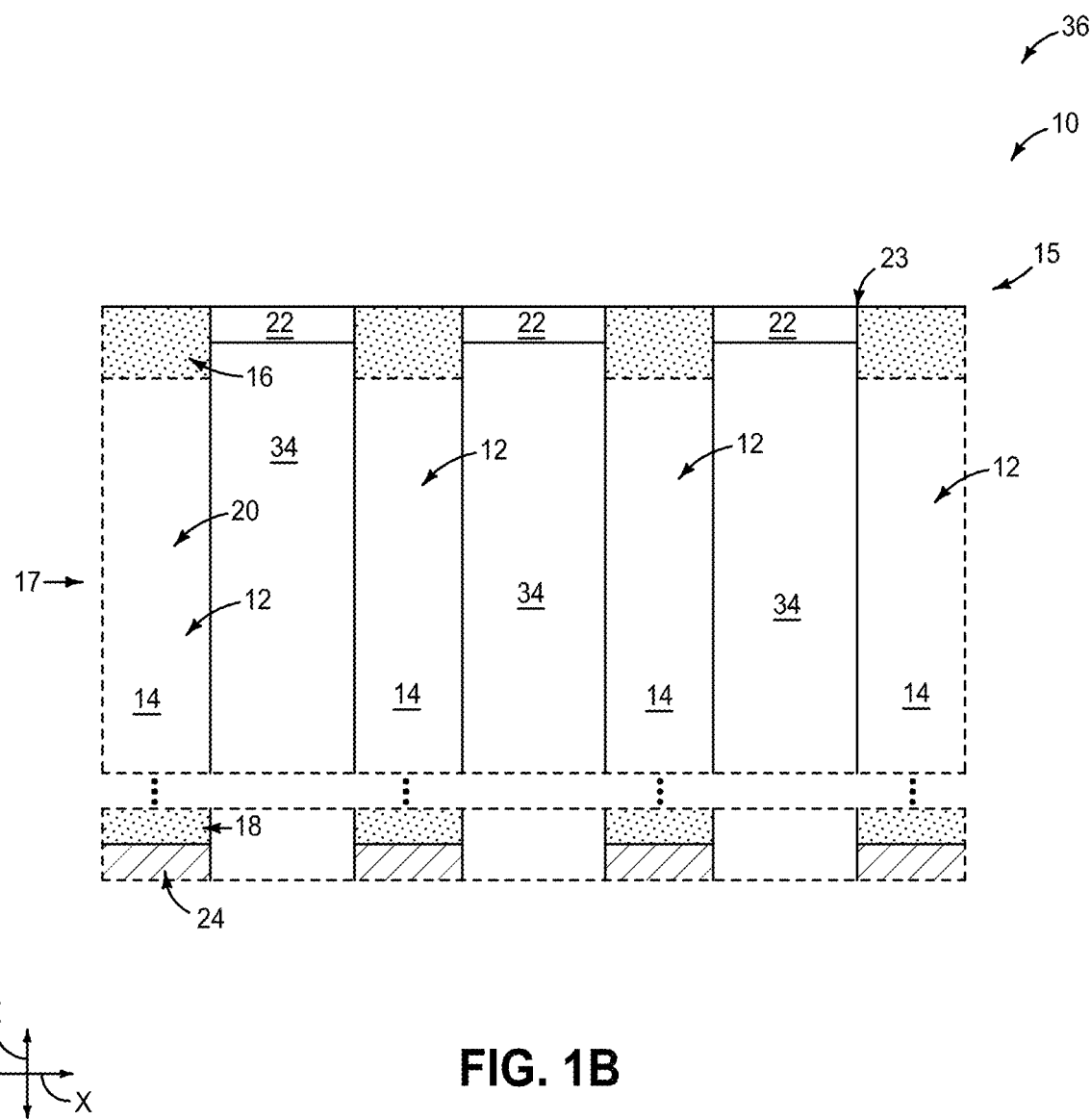
Figures 1, 1A:
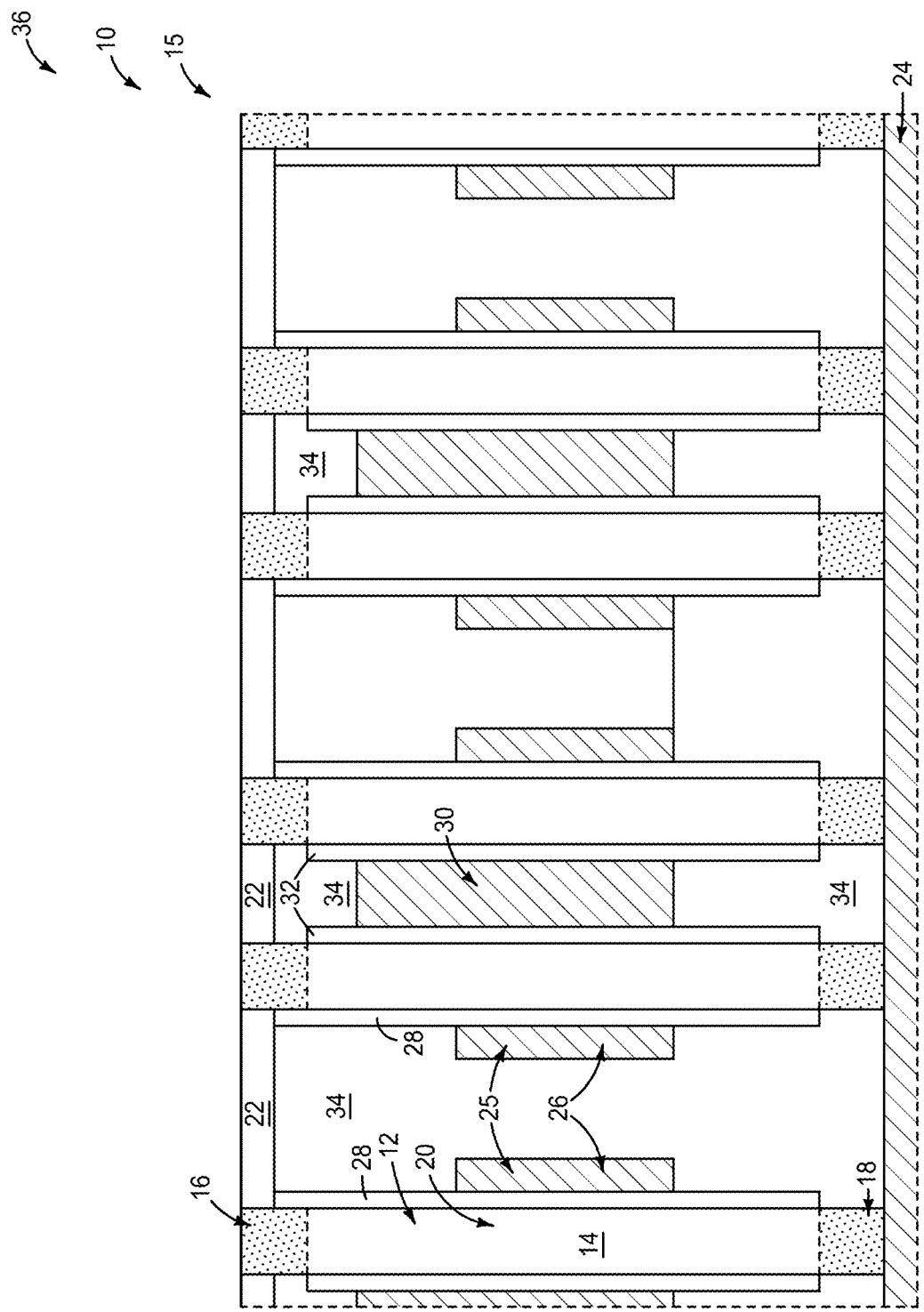
Figures 1, 1B:
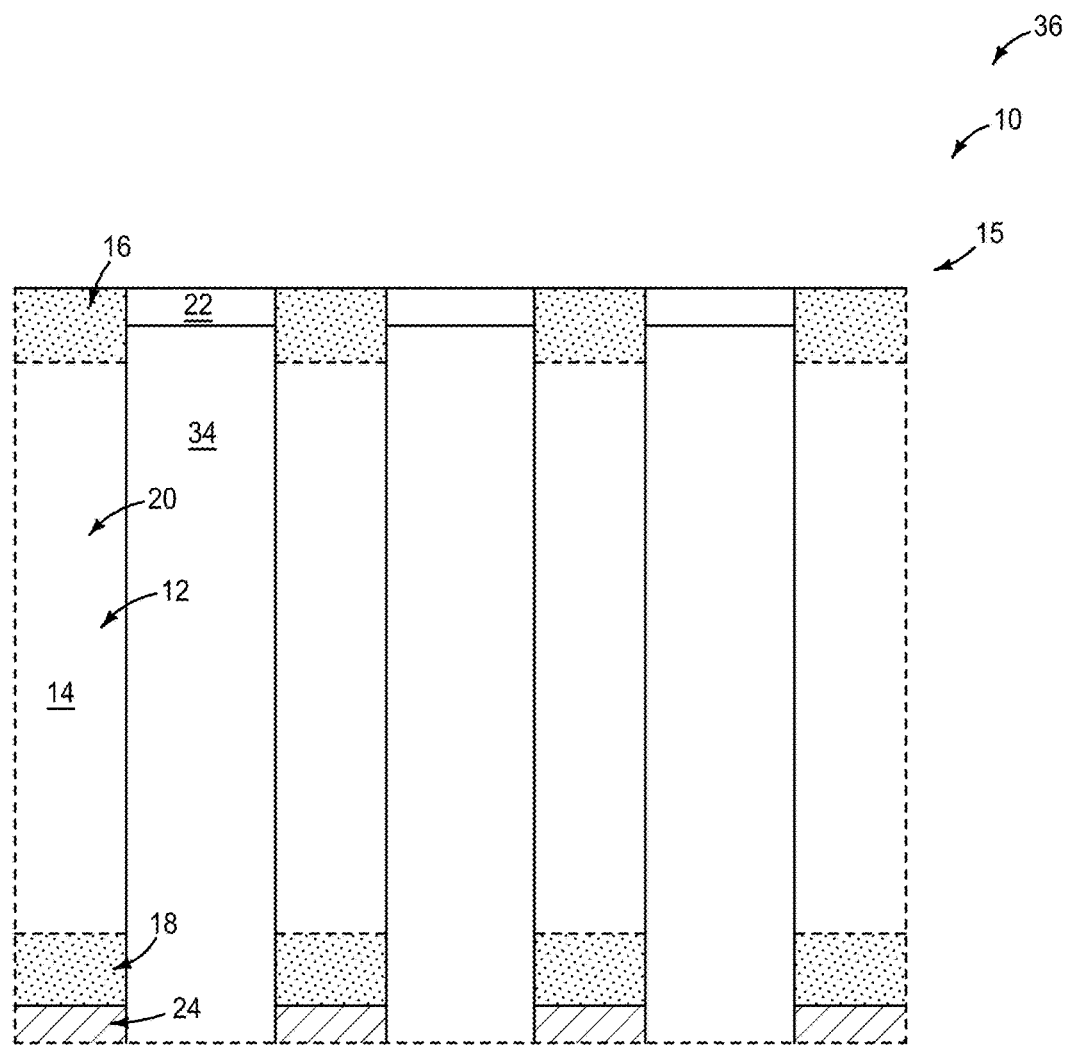

Referring to FIGS. 1-1B, a construction 10 includes vertically-extending pillars 12. The pillars 12 comprise semiconductor material 14. The pillars 12 are all substantially identical to one another, with the term "substantially identical" meaning identical to within reasonable tolerances of fabrication and measurement.

The semiconductor material 14 may comprise any suitable composition(s), and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 14 may comprise, consist essentially of, or consist of appropriately-doped silicon. The silicon may be in any suitable form, and in some embodiments may be monocrystalline, polycrystalline and/or amorphous.

Each of the pillars 12 includes a channel region 20 between an upper source/drain region 16 and a lower source/drain region 18. Stippling is utilized in the drawings to indicate that the source/drain regions 16 and 18 are heavily doped. In some embodiments, the source/drain regions 16 and 18 may be n-type doped by incorporating one or both of phosphorus and arsenic into the semiconductor material (e.g., silicon) 14 of the pillars 12. In some embodiments, one or both of the source/drain regions 16 and 18 may comprise additional conductive material besides the conductively-doped semiconductor material 14. For instance, one or both of the source/drain regions 16 and 18 may include metal silicide (e.g., titanium silicide, tungsten silicide, etc.) and/or other suitable conductive materials (e.g., titanium, tungsten, etc.). In some embodiments, the pillars 12 may be considered to be capped by the upper source/drain regions 16, with the term "capped" indicating that the upper source/drain regions may or may not include the semiconductor material 14 of the pillars 12.

The pillars 12 may be considered to be arranged in an array 15. The array may be considered to comprise rows 17 extending along an indicated x-axis direction, and to comprise columns 19 extending along an indicated y-axis direction.

Insulative material 22 extends between the upper source/drain regions 16. The insulative material 22 may comprise any suitable composition(s); and in some embodiments may comprise, consist essentially of, or consist of silicon nitride, silicon dioxide, aluminum oxide, etc. In some embodiments, the insulative material 22 may be referred to as a first insulative material.

A planarized upper surface 23 extends across the insulative material 22 and the source/drain regions 16. The planarized surface 23 may be formed utilizing chemical-mechanical polishing (CMP) and/or any other suitable process(es). In some embodiments, the surface 23 may be referred to as an upper surface of the construction 10.

The construction includes conductive structures (digit lines) 24 under the pillars 12. The digit lines 24 extend along the column direction (the illustrated y-axis direction) and are electrically coupled with the lower source/drain regions 18 of the pillars. The digit lines may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the illustrated embodiment, the digit lines are physically against the lower source/drain regions 18. In some embodiments, the digit lines may comprise metal (e.g., titanium, tungsten, etc.), the source/drain regions 18 may comprise conductively-doped silicon, and metal silicide may be present where the silicon of the source/drain regions 18 interfaces with the digit lines 24.

Gating structures (wordlines) 25 are alongside the pillars 12 and comprise gates 26. The gates 26 are spaced from the pillars by dielectric material (also referred to as gate dielectric material) 28. The gating structures 25 extend along the row direction (i.e., along the illustrated x-axis direction), and thus extend in and out of the page relative to the cross-sectional view of FIG. 1A.

The gating structures 25 (and associated gates 26) may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The dielectric material 28 may comprise any suitable composition(s); and in some embodiments may comprise, consist essentially of, or consist of one or more of silicon nitride, silicon dioxide, aluminum oxide, hafnium oxide, etc.

The dielectric material 28 is provided between the gates 26 and the channel regions 20, and may extend to any suitable vertical dimension. In the shown embodiment the dielectric material 28 extends upwardly beyond the uppermost surfaces of the gates 26. In other embodiments the dielectric material 28 may or may not extend vertically beyond the gates 26.

The gates (transistor gates) 26 may be considered to be operatively adjacent to (operatively proximate to) the channel regions 20 such that a sufficient voltage applied to an individual gate 26 (specifically along a wordline 25 comprising the gate) will induce an electric field on a channel region near the gate which enables current flow through the channel region to electrically couple the source/drain regions on opposing sides of the channel region with one another. If the voltage to the gate is below a threshold level, the current will not flow through the channel region, and the source/drain regions on opposing sides of the channel region will not be electrically coupled with one another. The selective control of the coupling/decoupling of the source/drain regions through the level of voltage applied to the gate may be referred to as gated coupling of the source/drain regions. In some embodiments, the pillars 12 may be considered to be configured as active regions of access devices, with such access devices corresponding to access transistors in the illustrated embodiment.

Shield lines 30 are alongside the pillars 12, and are spaced from the pillars by dielectric material 32. The shield lines may be electrically coupled with ground or any other suitable reference voltage. The shield lines 30 extend along the row direction (i.e., along the illustrated x-axis direction).

The shield lines 30 may be considered to be within regions between the pillars 12 along the cross-sectional view of FIG. 1A.

The dielectric material 32 may comprise any suitable composition(s); and in some embodiments may comprise, consist essentially of, or consist of one or more of silicon dioxide, silicon nitride, aluminum oxide, hafnium oxide, etc. In the shown embodiment the dielectric material 32 extends vertically beyond the shield lines 30. In other embodiments the dielectric material 32 may or may not extend vertically beyond the shield lines 30.

The shield lines 30 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

In the shown embodiment, each of the pillars 12 shown along the cross-section of FIG. 1A has one side adjacent a gate 26, and has an opposing side adjacent a shield line 30.

In the shown embodiment, insulative material 34 is over the gates 26 and the shield lines 30. The insulative material 34 may comprise any suitable composition(s); and may, for example, comprise silicon dioxide, silicon nitride, aluminum oxide, etc. In some embodiments the material 34 may comprise a same composition as one or both of the dielectric materials 28 and 32, and in other embodiments the material 34 may comprise a different composition than at least one of the dielectric materials 28 and 32.

Each of the pillars 12 is coupled to one of the wordlines 25 and one of the digit lines 24; and accordingly each of the pillars 12 may be considered to be uniquely addressed by one of the wordlines and one of the digit lines.

The construction 10 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base may correspond to a semiconductor substrate containing one or more materials associated with integrated circuit fabrication. Such materials may include, for example, one or more of refractory metal materials, barrier materials, diffusion materials, insulator materials, etc.

In some embodiments, the construction 10 of FIGS. 1-1B may be considered to represent a portion of an integrated assembly 36.

In the embodiment of FIGS. 1A and 1B, a gap is provided within the construction 10 to break a region of the pillars 12 above the lower source/drain regions 18. The gap enables the view of construction 10 to be collapsed into a smaller area, which leaves more room for additional materials formed over the construction 10 at subsequent process stages. It is to be understood that the pillars 12 extend across the illustrated gap. FIGS. 1A-1 and 1B-1 show views along the same cross-sections as FIG. 1A and FIG. 1B, and show the construction 10 without the gap of FIGS. 1A and 1B.

FIGS. 1A-1 and 1B-1 are provided to assist the reader in understanding the arrangement of construction 10. The views of FIGS. 1A and 1B (i.e., the views with the gaps in construction 10) will be used for the remaining figures of this disclosure.

Figure 2:
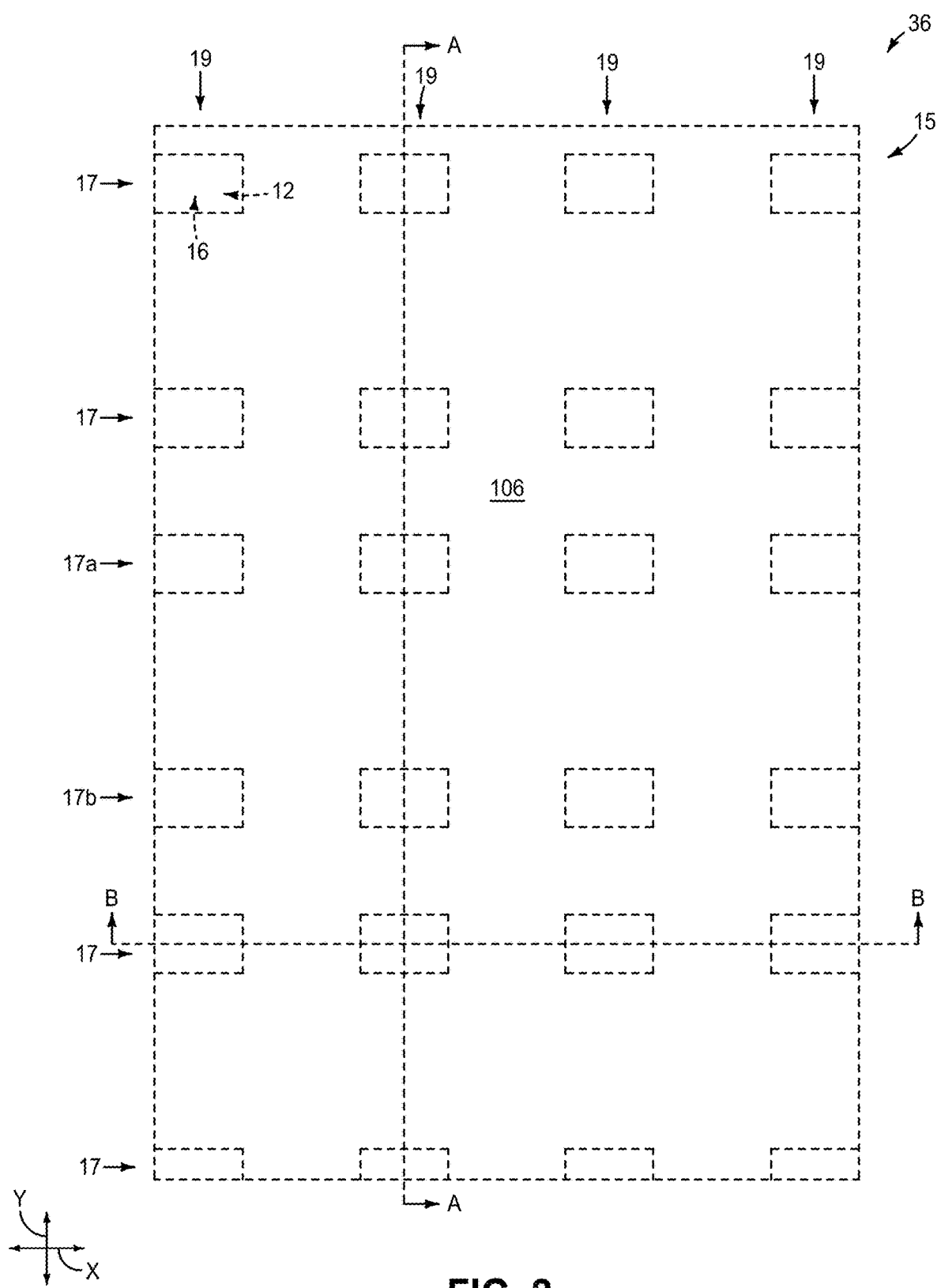
FIGS. 2-2B are diagrammatic views of the region of FIGS. 1-1B at an example process stage following that of FIGS. 1-1B.
Figure 2A:
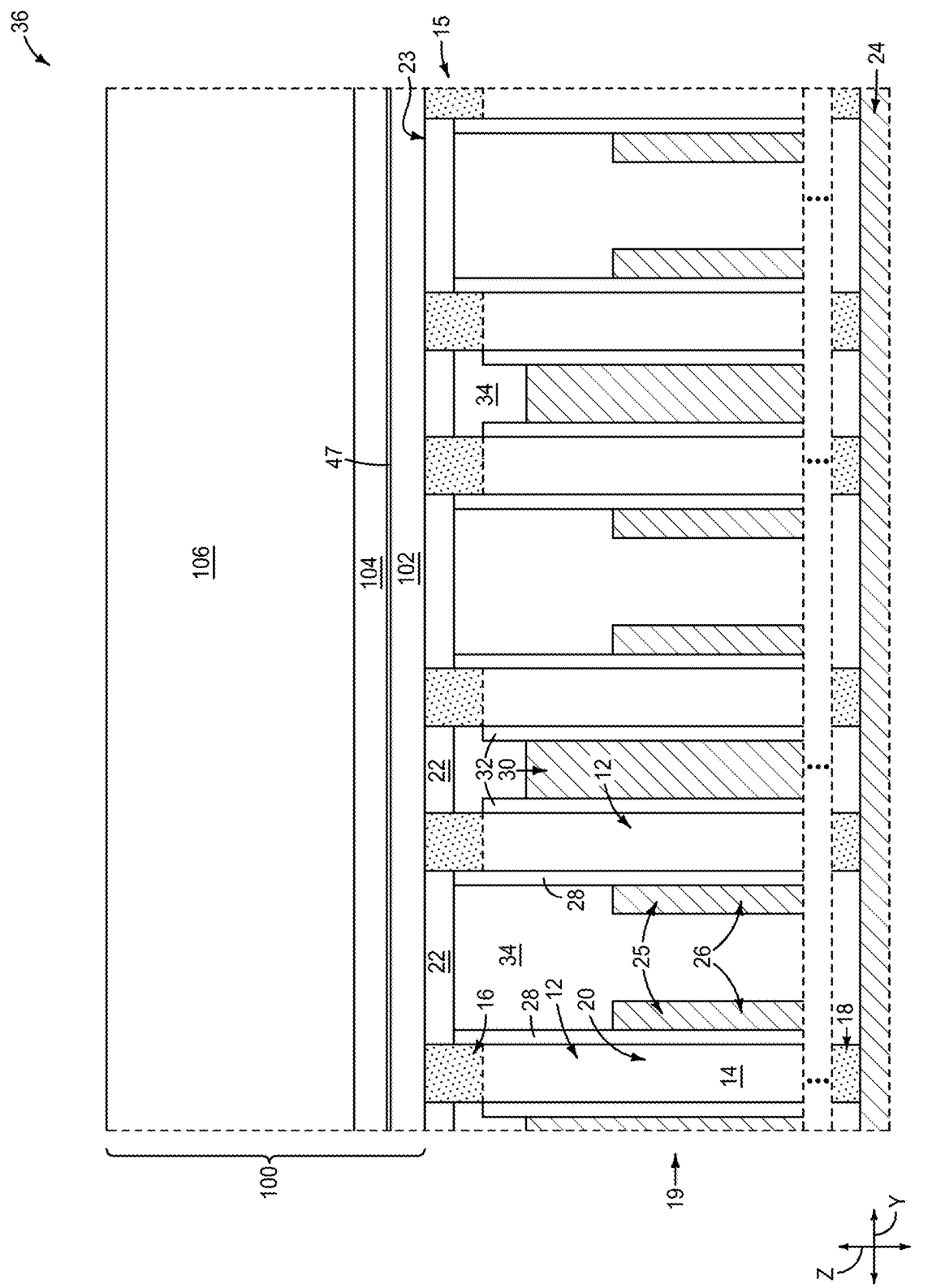
Figure 2B:
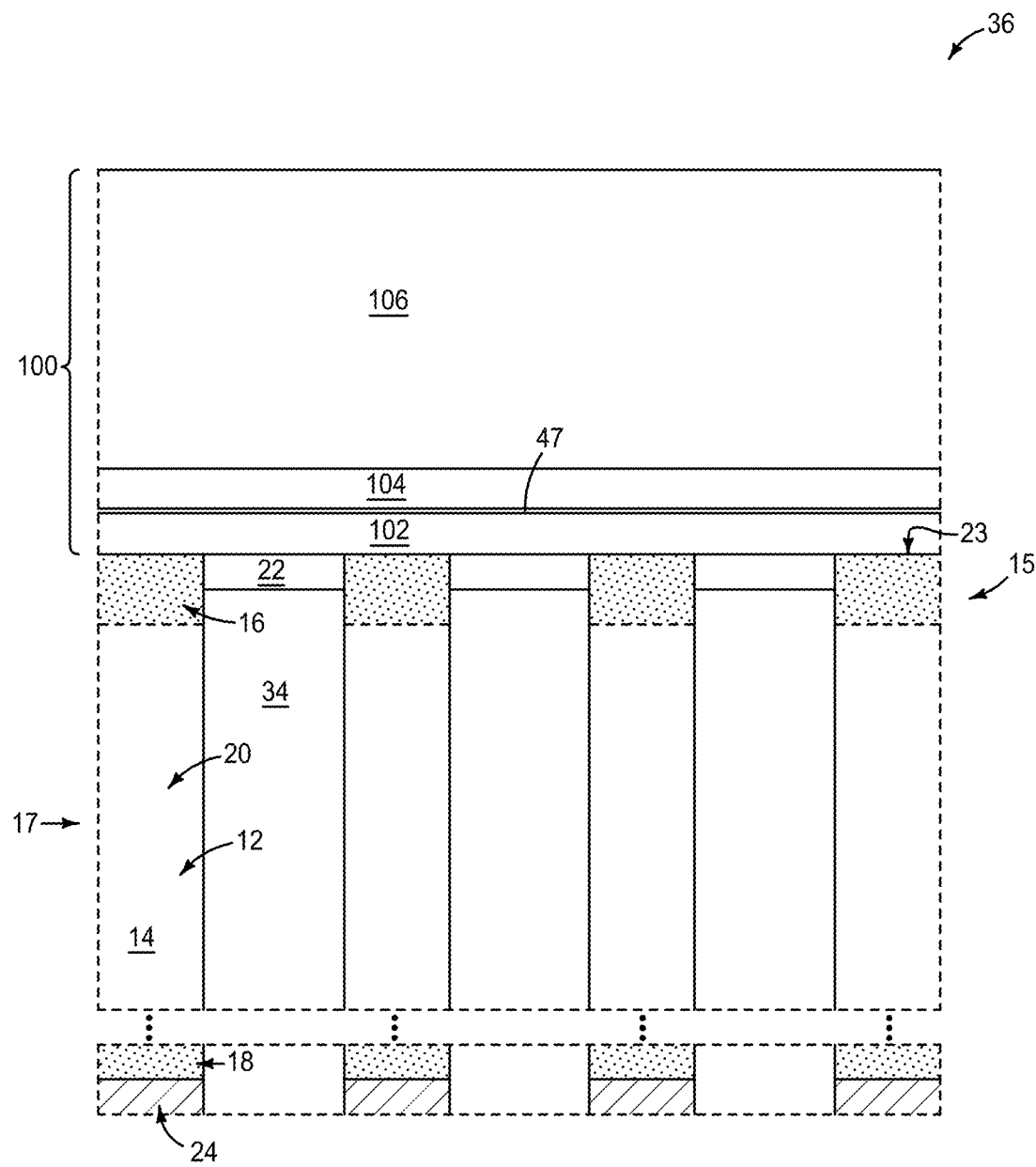

Referring to FIGS. 2-2B, the assembly 36 is shown at a process stage subsequent to that of FIGS. 1-1B. A stack 100 is formed over the planarized upper surface 23. The stack 100 includes a first material 102, a leaker-device-material 47, a second material 104 and a third material 106. The source/drain regions 16 and associated pillars 12 are shown in dashed-line (phantom) view in FIG. 2 to indicate that they are under other materials.

The first, second and third materials 102, 104 and 106 may comprise any suitable composition(s). The first and second materials 102 and 104 may comprise a same composition as one another, and the third material 106 may comprise a different composition relative to that of the first and second materials 102 and 104. In some embodiments, the first and second materials 102 and 104 may comprise, consist essentially of, or consist of silicon nitride, and the third material 106 may comprise, consist essentially of, or consist of silicon dioxide.

The leaker-device-material 47 may comprise any suitable composition or combination of compositions. In some embodiments, the leaker-device-material 47 may comprise, consist essentially of, or consist of one or more of titanium, nickel and niobium in combination with one or more of germanium, silicon, oxygen, nitrogen and carbon. In some embodiments, the leaker device material may comprise, consist essentially of, or consist of one or more of Si, Ge, SiN, TiSiN, TiO, TiN, NiO, NiON and TiON, where the chemical formulas indicate primary constituents rather than particular stoichiometries. In some embodiments, the leaker-device-material may comprise, consist essentially of, or consist of titanium, oxygen and nitrogen. In some embodiments, the leaker-device-material may comprise amorphous silicon, niobium monoxide, silicon-rich silicon nitride, etc., either alone or in any suitable combination.

In some embodiments, the leaker-device-material 47 may be a continuous layer having a thickness within a range of from about 2 angstroms (Å) to about 20 Å. In some embodiments, the leaker-device-material may be a continuous layer having a thickness within a range of from about 6 Å to about 15 Å.

In the illustrated embodiment of FIGS. 2A and 2B, the leaker-device-material 47 is within a bottom half (lower portion) of the stack 100. In some embodiments, the leaker-device-material may be within a lower third of the stack 100, a lower quarter of the stack 100, etc.

Figure 3:
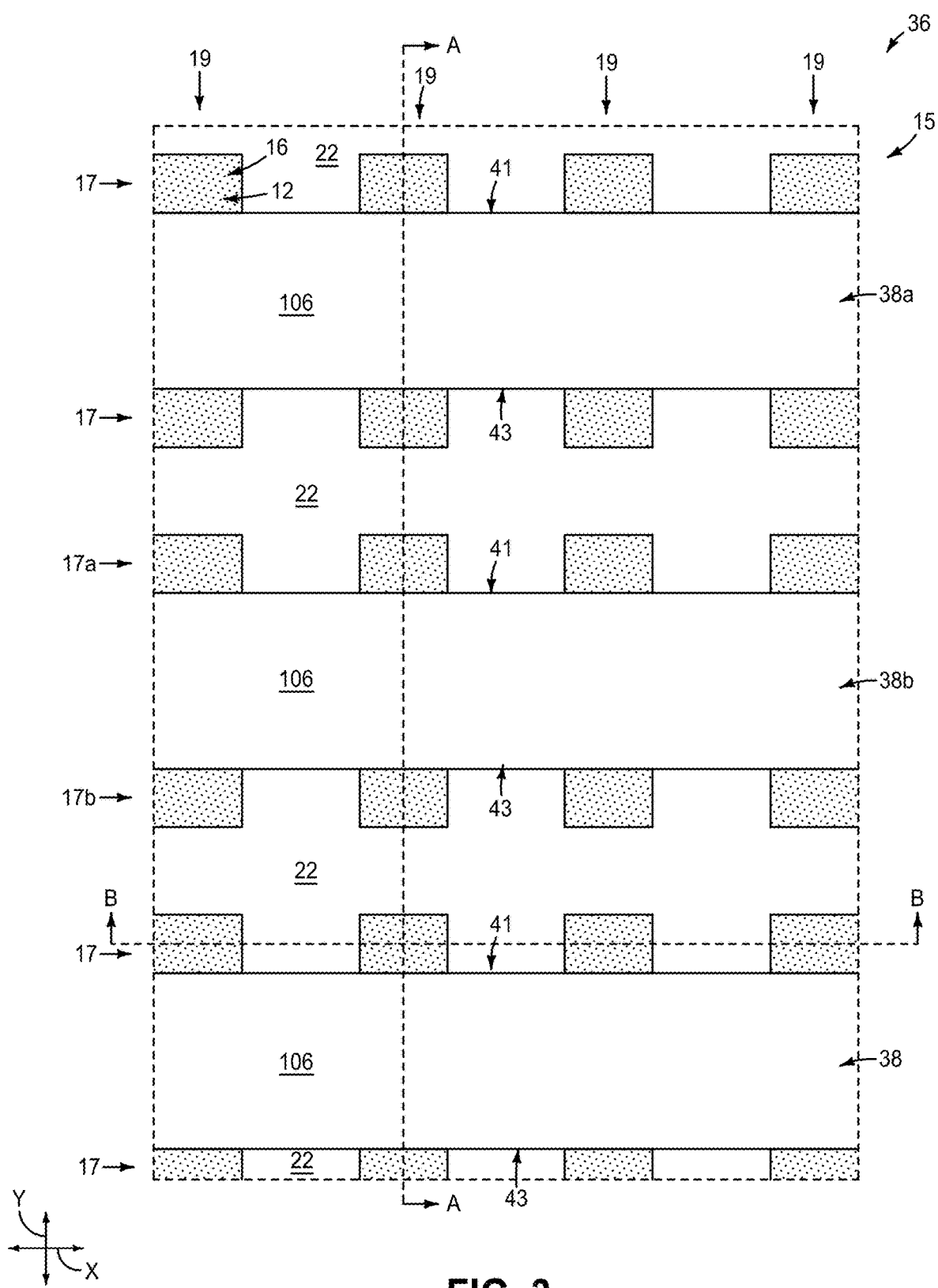
FIGS. 3-3B are diagrammatic views of the region of FIGS. 1-1B at an example process stage following that of FIGS. 2-2B.
Figure 3A:
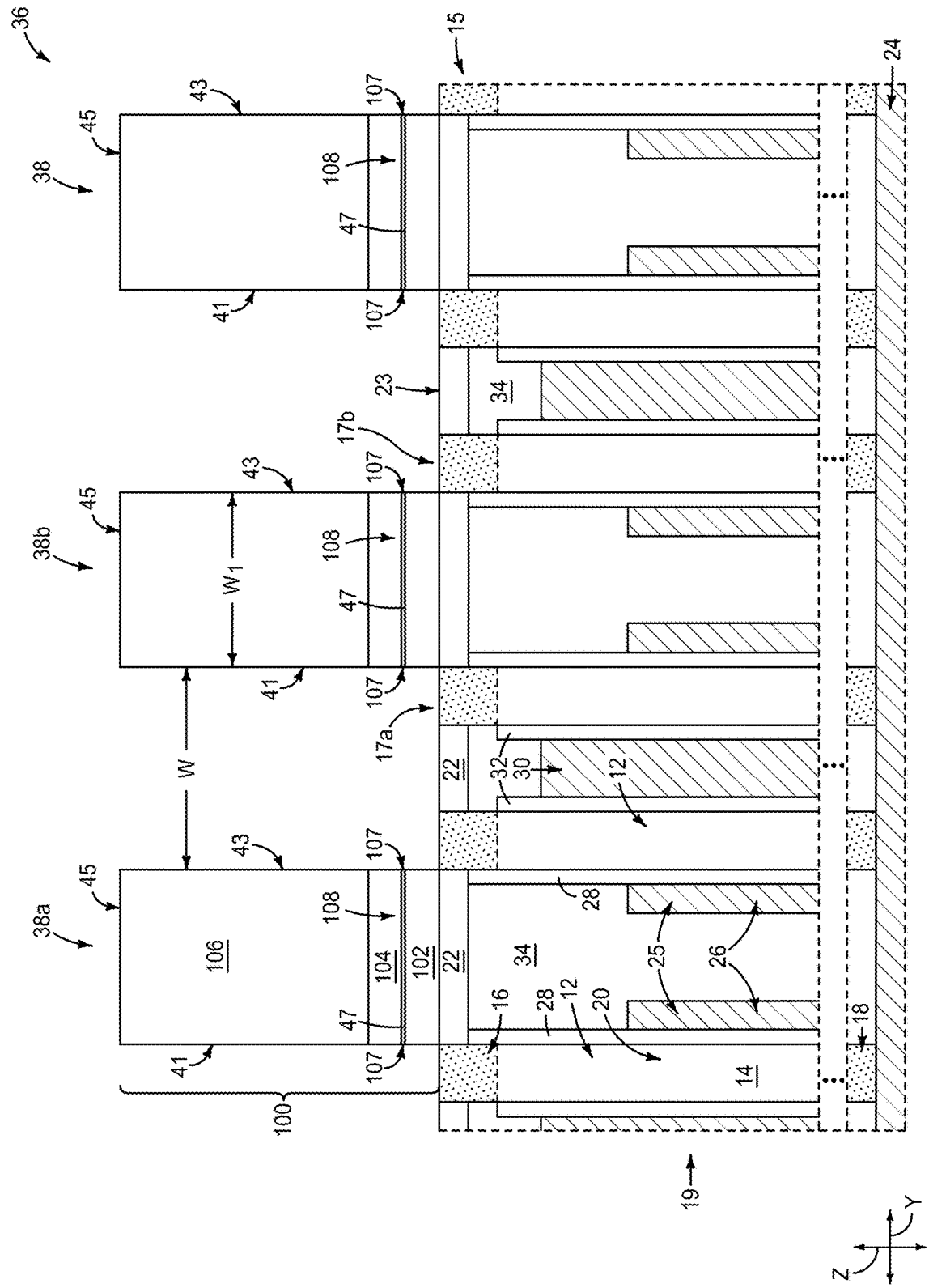
Figure 3B:
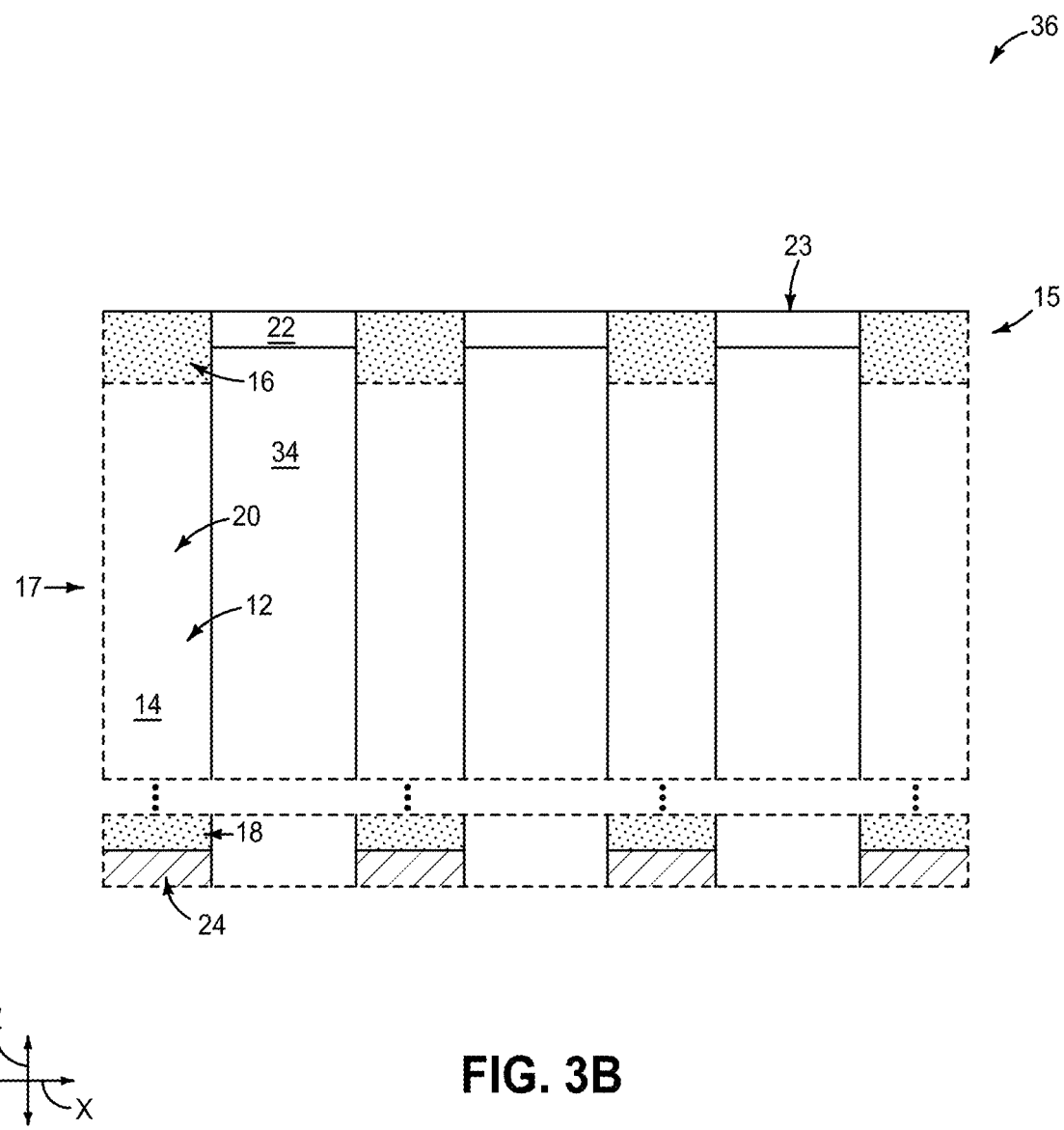

Referring to FIGS. 3-3B, the stack 100 is patterned into linear structures (rails, beams) 38, with such linear structures being over the upper surface 23. A pair of the illustrated linear structures 38 are labeled 38a and 38b so that they may be distinguished relative to one another.

The linear structures 38 extend along the row direction (the illustrated x-axis direction), and are formed to be between rows of the pillars 12. Each of the linear structures 38 has a pair of opposing lateral surfaces 41 and 43. The surfaces 41 and 43 may be referred to as first and second lateral sides, respectively, of the linear structures 38. Each of the linear structures also has a top surface 45.

Each of the linear structures may be considered to include a region 108 of the leaker-device-material 47, with such regions of the leaker-device-material 47 extending laterally through the linear structures 38. Outer edges 107 of the leaker-device-material 47 (or alternatively considered, of the regions 108 of the leaker-device-material) are along the first and second lateral sides 41 and 43 of the linear structures 38.

Each of the linear structures 38 may be considered to be associated with a pair of the rows 17 of the pillars 12, with such associated rows being along the sides 41 and 43. For instance, a pair of the rows 17 are labeled as 17a and 17b in FIGS. 3 and 3A, and such rows are along the sides 41 and 43 of the linear structure 38b (and may be considered to be associated with such linear structure). The linear structures 38 may or may not laterally overlap portions of the source/drain regions 16 of the associated columns 17.

In the illustrated embodiment, the sidewall surfaces 41 and 43 are substantially vertical and extend substantially orthogonally relative to the substantially horizontal upper surface 23. The term "substantially vertical" means vertical to within reasonable tolerances of fabrication and measurement, the term "substantially orthogonal" means orthogonal to within reasonable tolerances of fabrication and measurement, and the term "substantially horizontal" means horizontal to within reasonable tolerances of fabrication and measurement.

FIG. 3A shows the linear structures 38a and 38b spaced from one another by a gap having width W. The width W may be any suitable dimension, and in some embodiments may be within a range of from about 20 nanometers (nm) to about 100 nm. The structures 38 have widths $W_1$ along the cross-section of FIG. 3A. In some embodiments, a ratio of $W_1$:W may be within a range of from about 1:2 to about 1:1.

Figure 4:
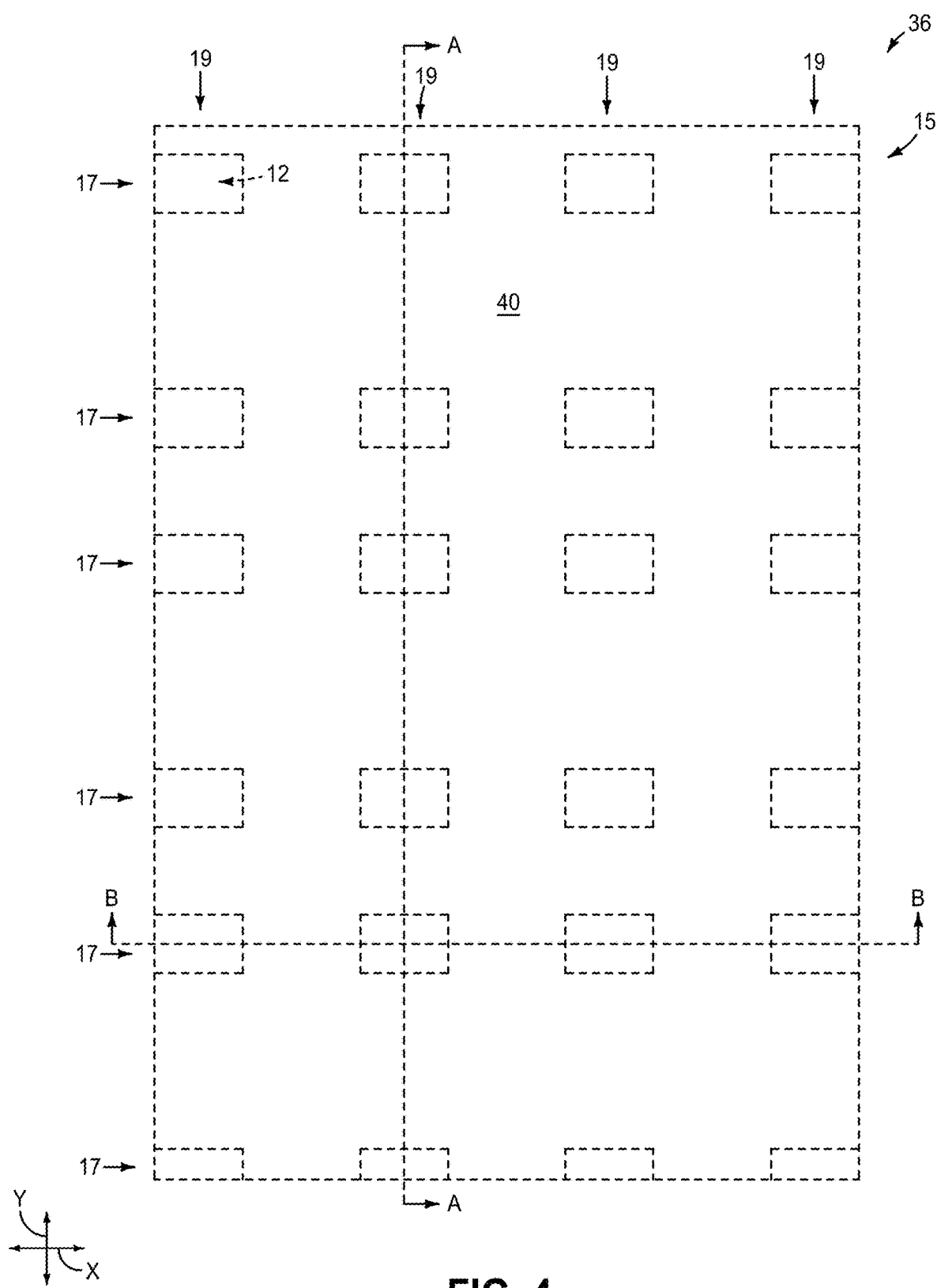
FIGS. 4-4B are diagrammatic views of the region of FIGS. 1-1B at an example process stage following that of FIGS. 3-3B.
Figure 4A:
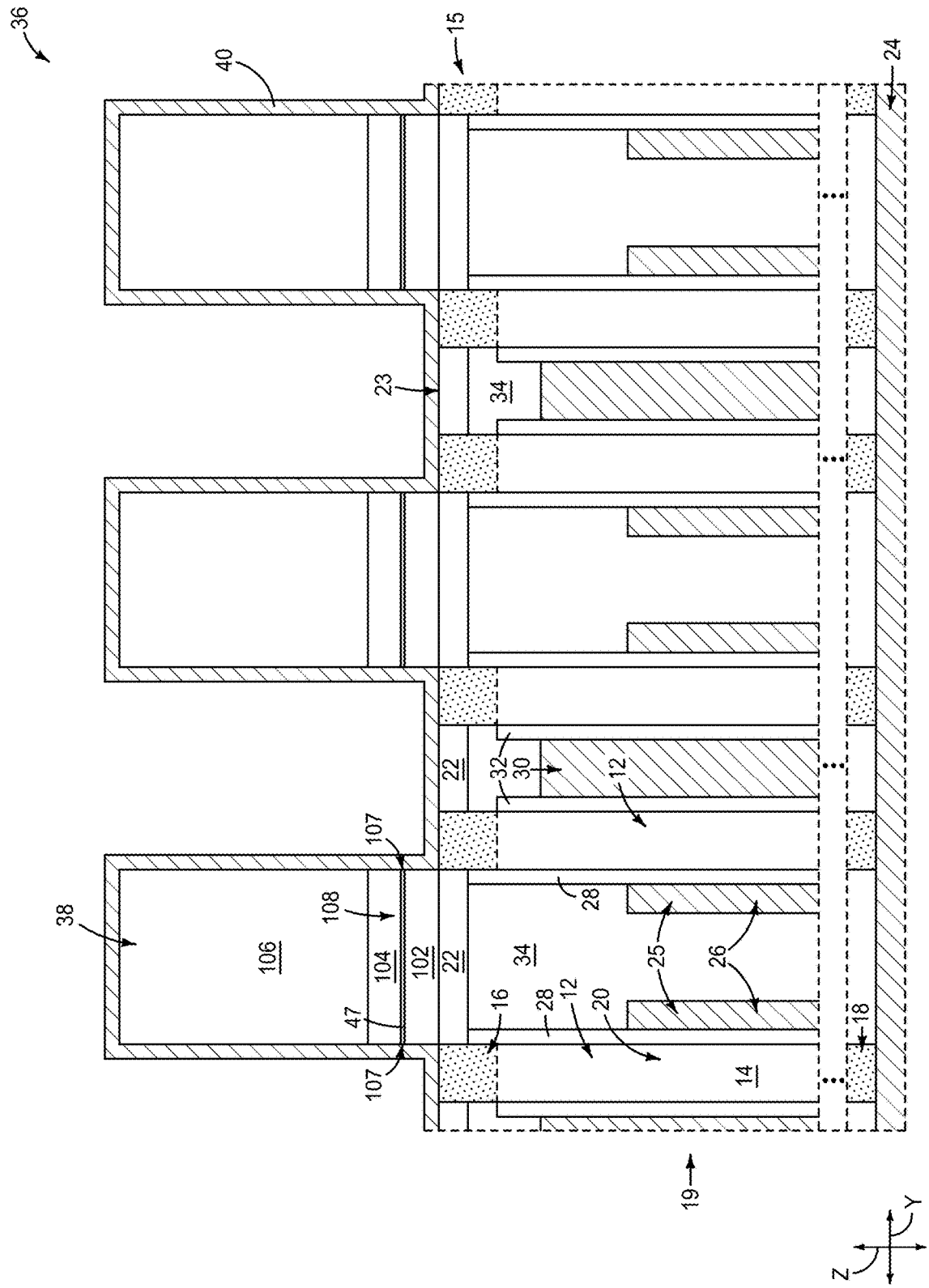
Figure 4B:
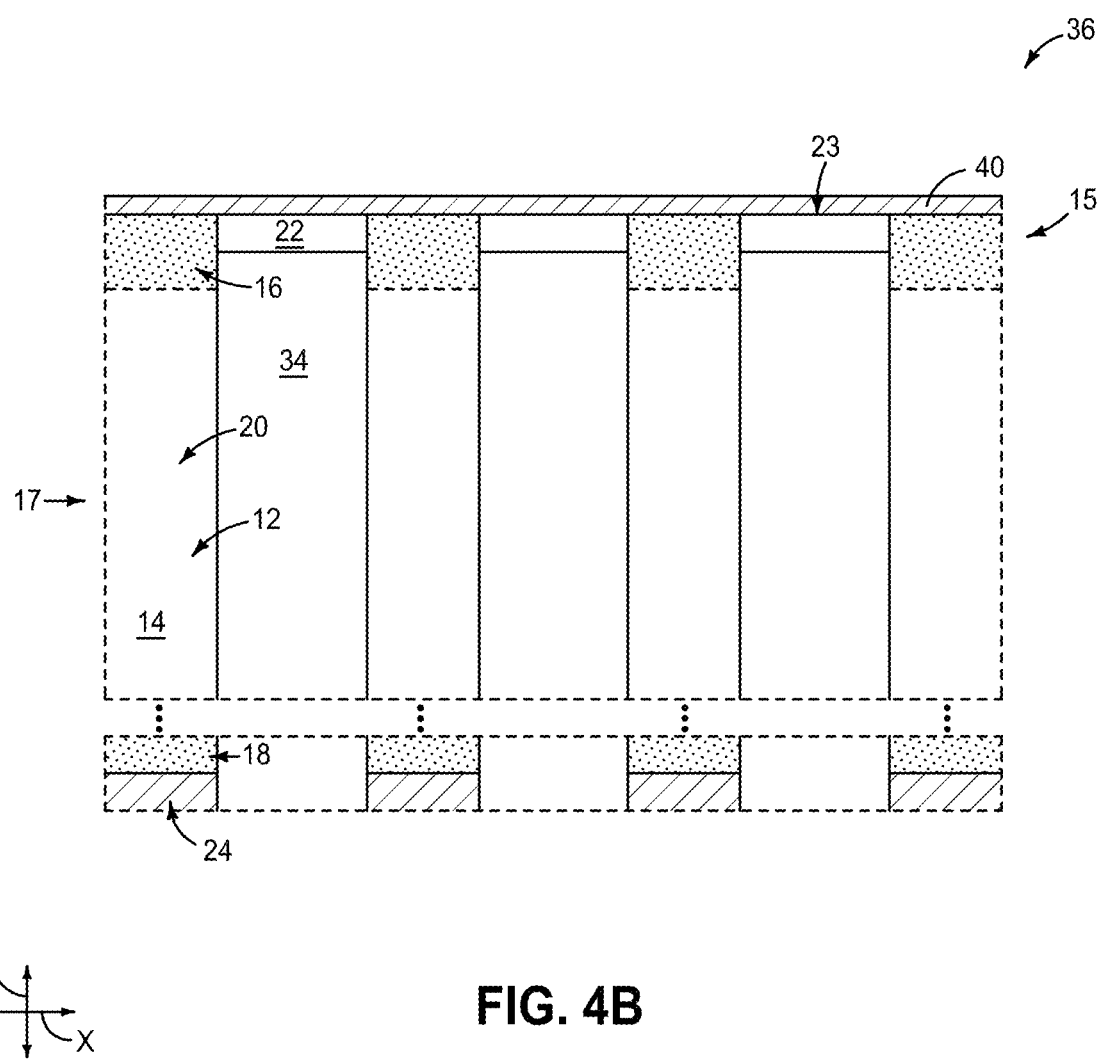

Referring to FIGS. 4-4B, bottom-electrode-material 40 is formed to extend conformally along the linear structures 38, and along regions of the upper surface 23 between the linear structures. The bottom-electrode-material 40 extends across the upper source/drain regions 16, and is electrically coupled with such source/drain regions. In the illustrated embodiment, the bottom-electrode-material 40 is directly against upper surfaces of the source/drain regions 16, and is directly against the outer edges 107 of the leaker-device-material 47 (or alternatively considered, the bottom-electrode-material 40 is directly against the outer edges 107 of the regions 108 of the leaker-device-material). The bottom-electrode-material 40 may have any suitable thickness. In some embodiments, the material 40 may have a thickness within a range of from about 1 nm to about 5 nm.

The bottom-electrode-material 40 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the bottom-electrode-material 40 may comprise, consist essentially of, or consist of titanium nitride.

Figure 5:
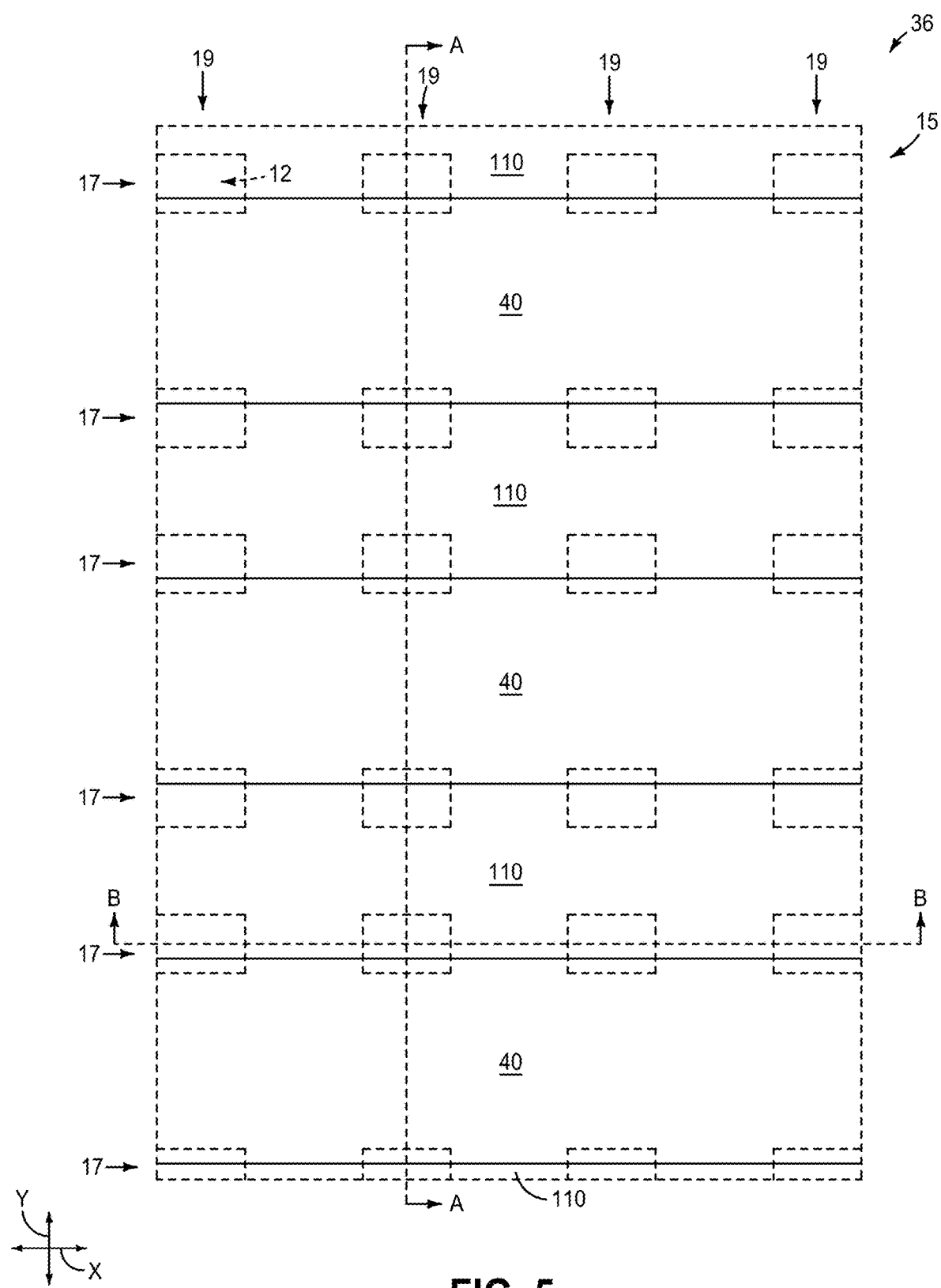
FIGS. 5-5B are diagrammatic views of the region of FIGS. 1-1B at an example process stage following that of FIGS. 4-4B.
Figure 5A:
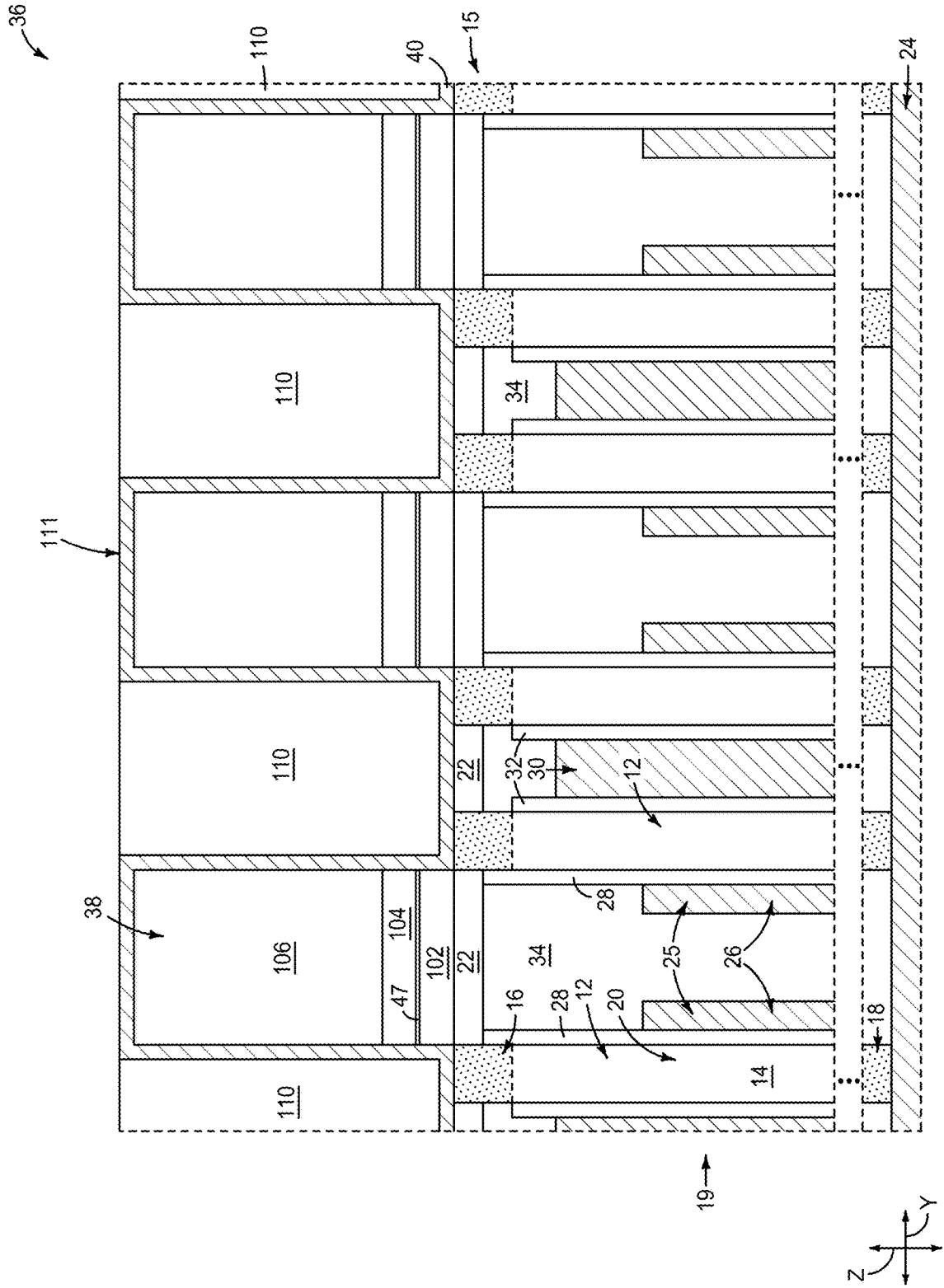
Figure 5B:
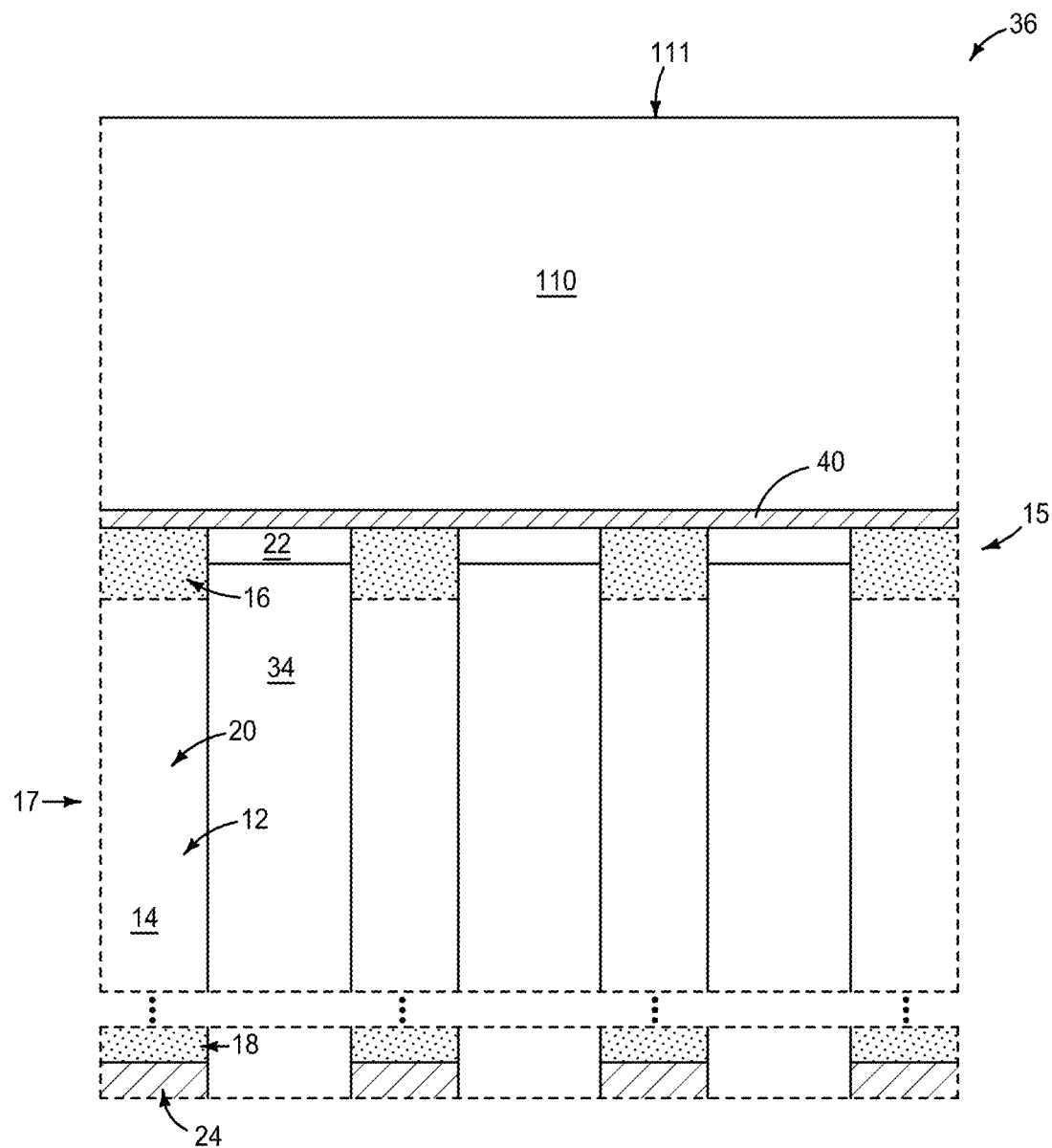

Referring to FIGS. 5-5B, fill material 110 is formed across the assembly 36, and then a planarized surface 111 is formed to extend across the materials 110 and 40.

The material 110 may comprise any suitable composition(s), and in some embodiments may comprise, consist essentially of, or consist of carbon (e.g., amorphous carbon).

The planarized surface 111 may be formed with any suitable processing, such as, for example, CMP.

Figure 6:
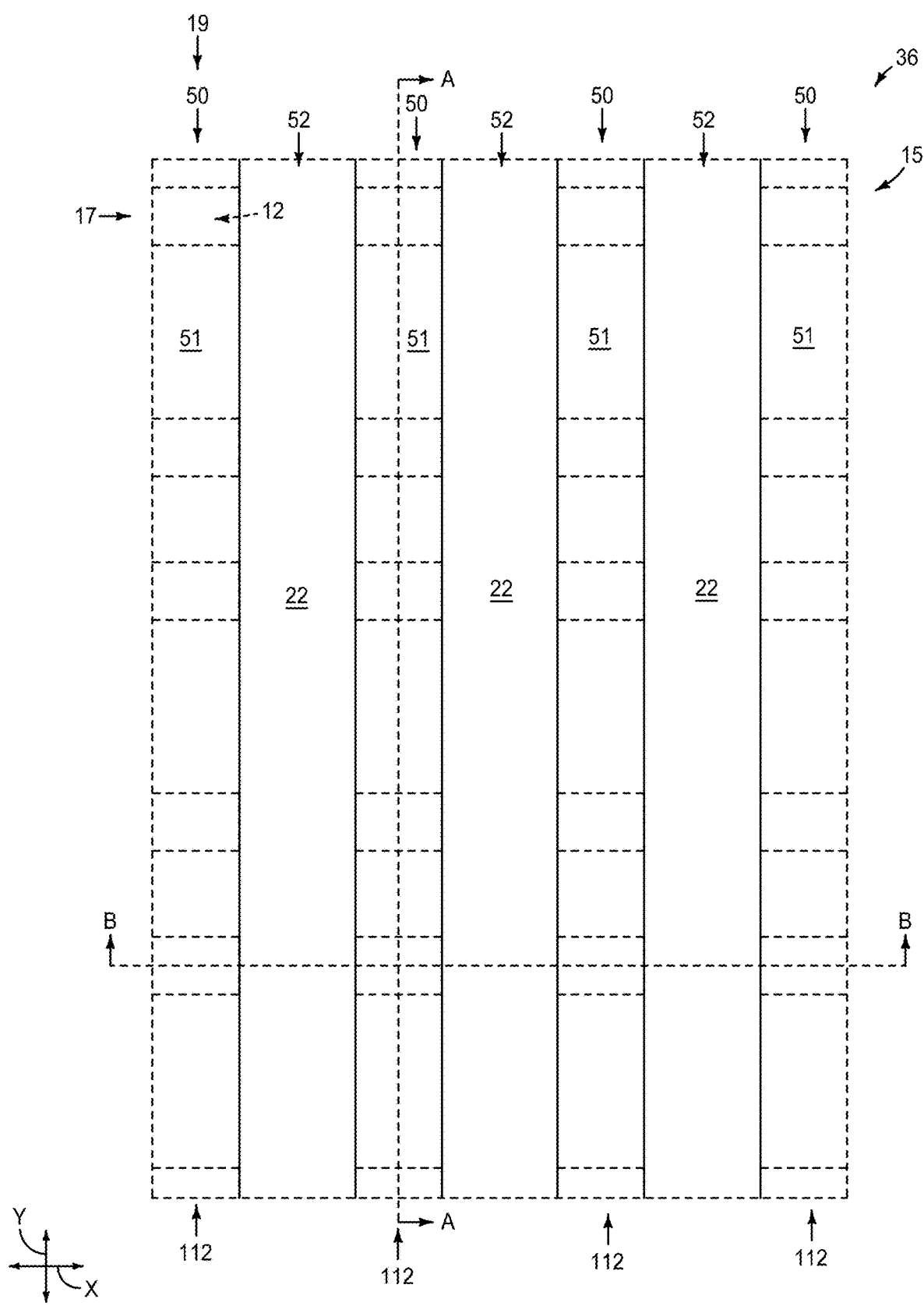
FIGS. 6-6B are diagrammatic views of the region of FIGS. 1-1B at an example process stage following that of FIGS. 5-5B.
Figure 6A:
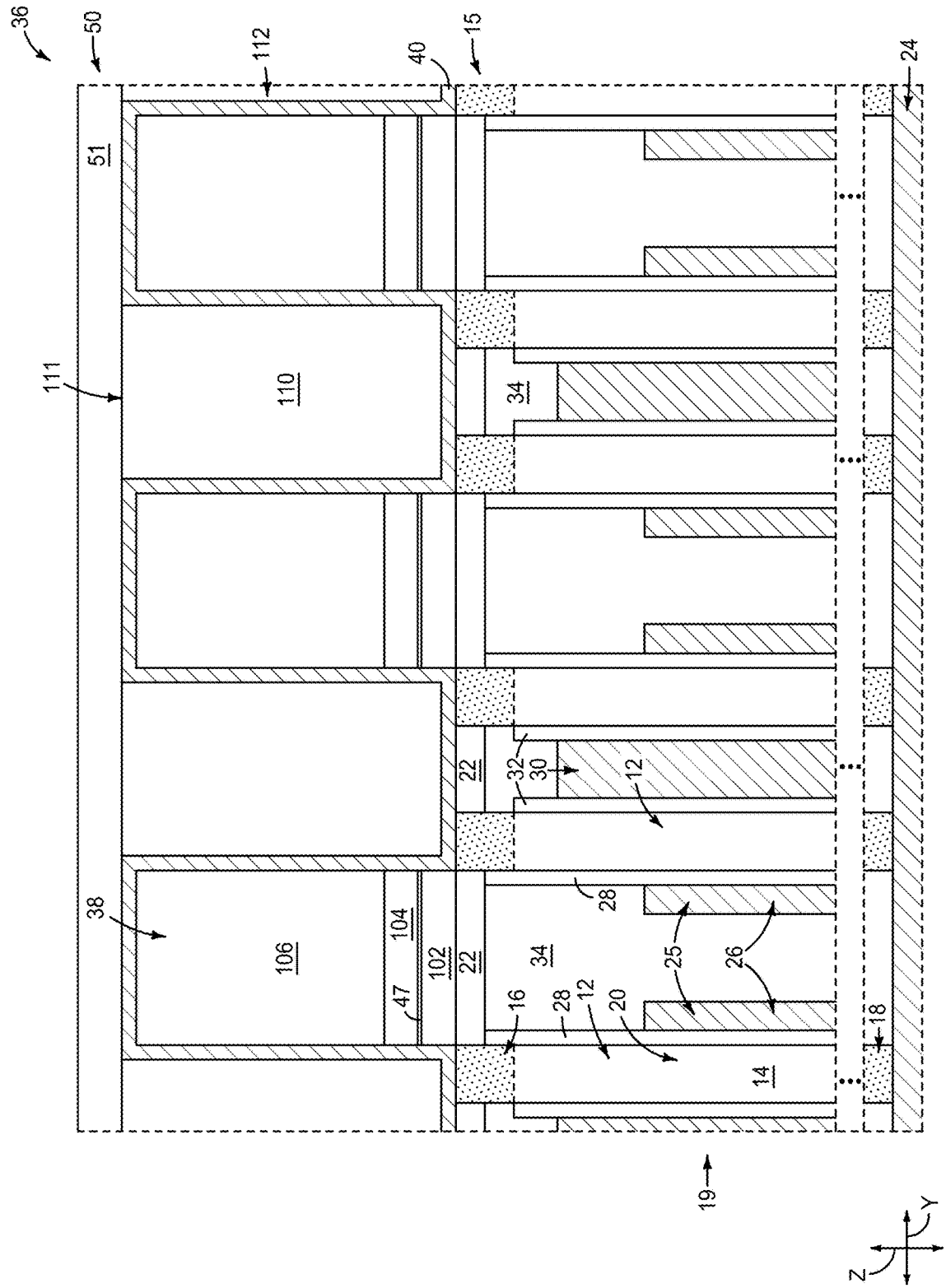
Figure 6B:
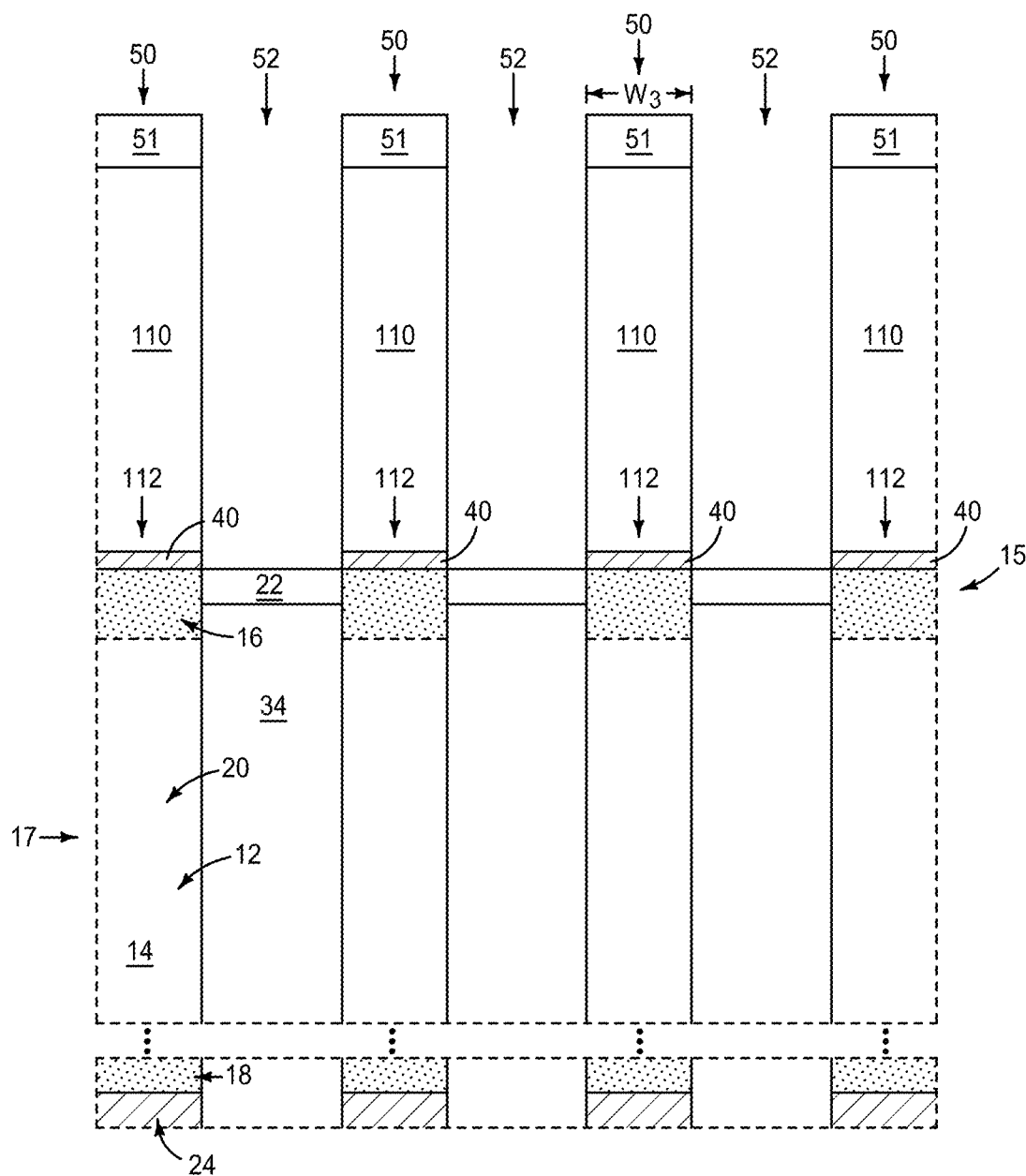

Referring to FIGS. 6-6B, mask structures (beams, rails) 50 are formed on the planar surface 111, and extend along the column direction (the illustrated y-axis direction). The mask structures 50 may comprise any suitable composition(s) 51; and in some embodiments may comprise, consist essentially of, or consist of carbon-containing material (e.g., amorphous carbon, resist, etc.).

The mask structures 50 are spaced from one another by intervening gaps 52.

The mask structures 50 may have any suitable dimensions; and may, for example, have widths $W_3$ along the cross-section of FIG. 6B within a range of from about 10 nm to about 30 nm.

The gaps 52 are extended through the materials 40 and 110, and to an upper surface of the insulative material 22. In other embodiments (not shown), the gaps 52 may punch into the material 22, or even through the material 22 and into the underlying insulative material 34.

The gaps 52 are extended through the materials 40 and 110 with any suitable processing, including, for example, one or more anisotropic (dry) etches, a wet etch and/or metal oxidation to etch through the material 40, etc. Such patterns the bottom-electrode-material 40 into strips 112 (visible in FIG. 6A, and also in FIG. 7C which is described below). The strips 112 extend along the y-axis (column direction).

Figure 7:
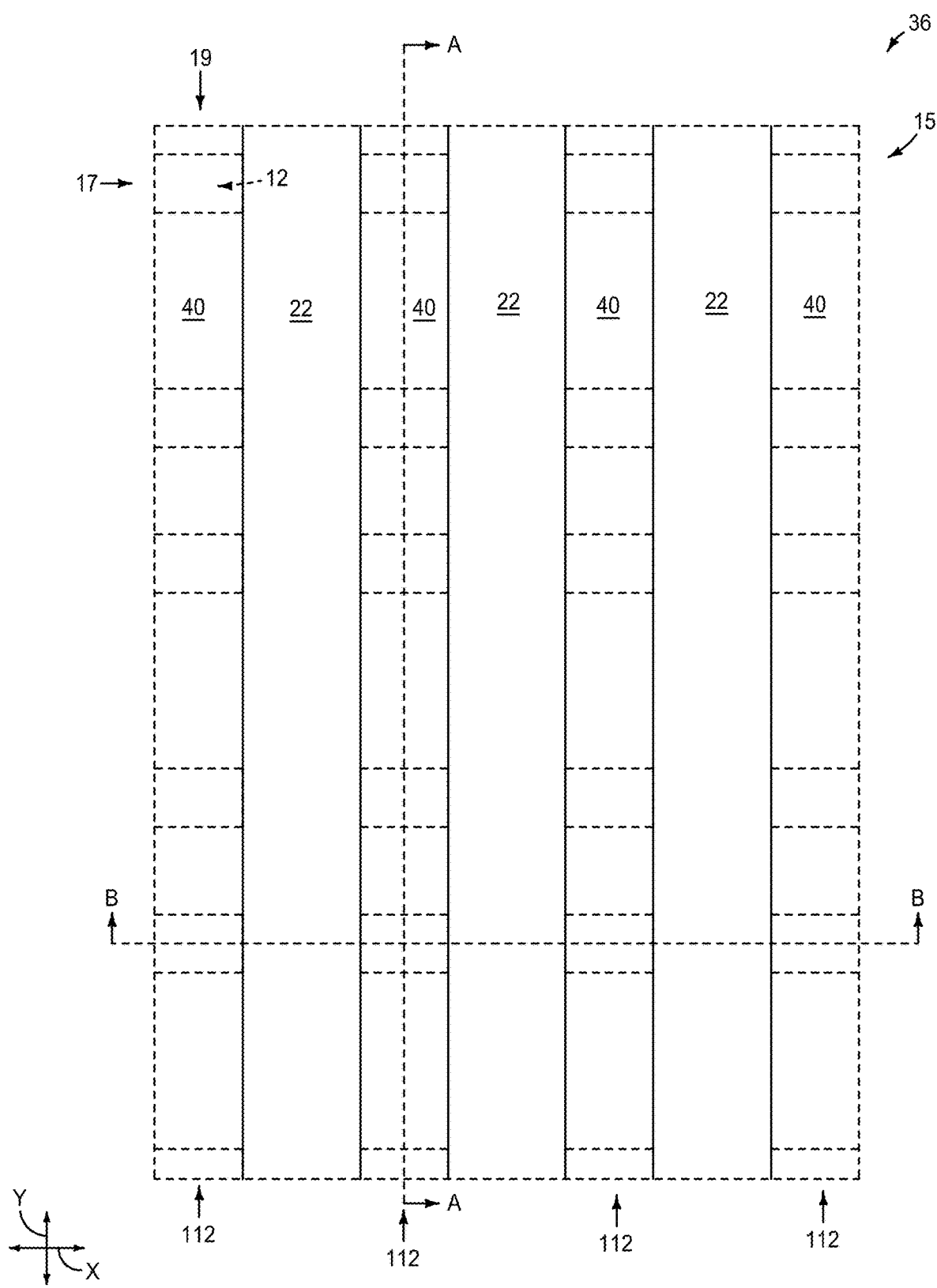
FIGS. 7-7C are diagrammatic views of the region of FIGS. 1-1B at an example process stage following that of FIGS. 6-6B.
Figure 7A:
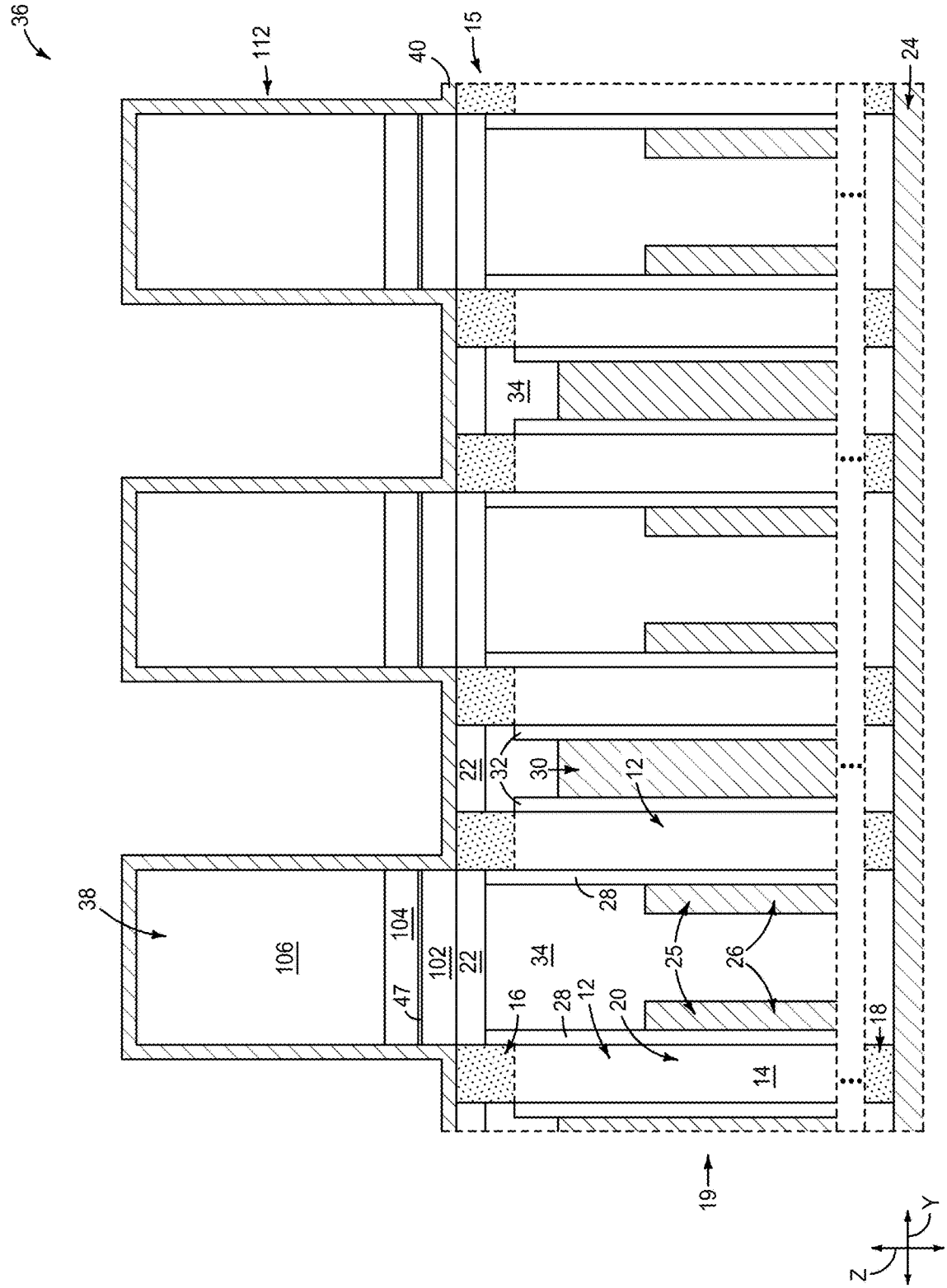
FIGS. 7A and 7B are cross-sectional side views along the lines A-A and B-B, respectively, of FIG. 7.
Figure 7B:
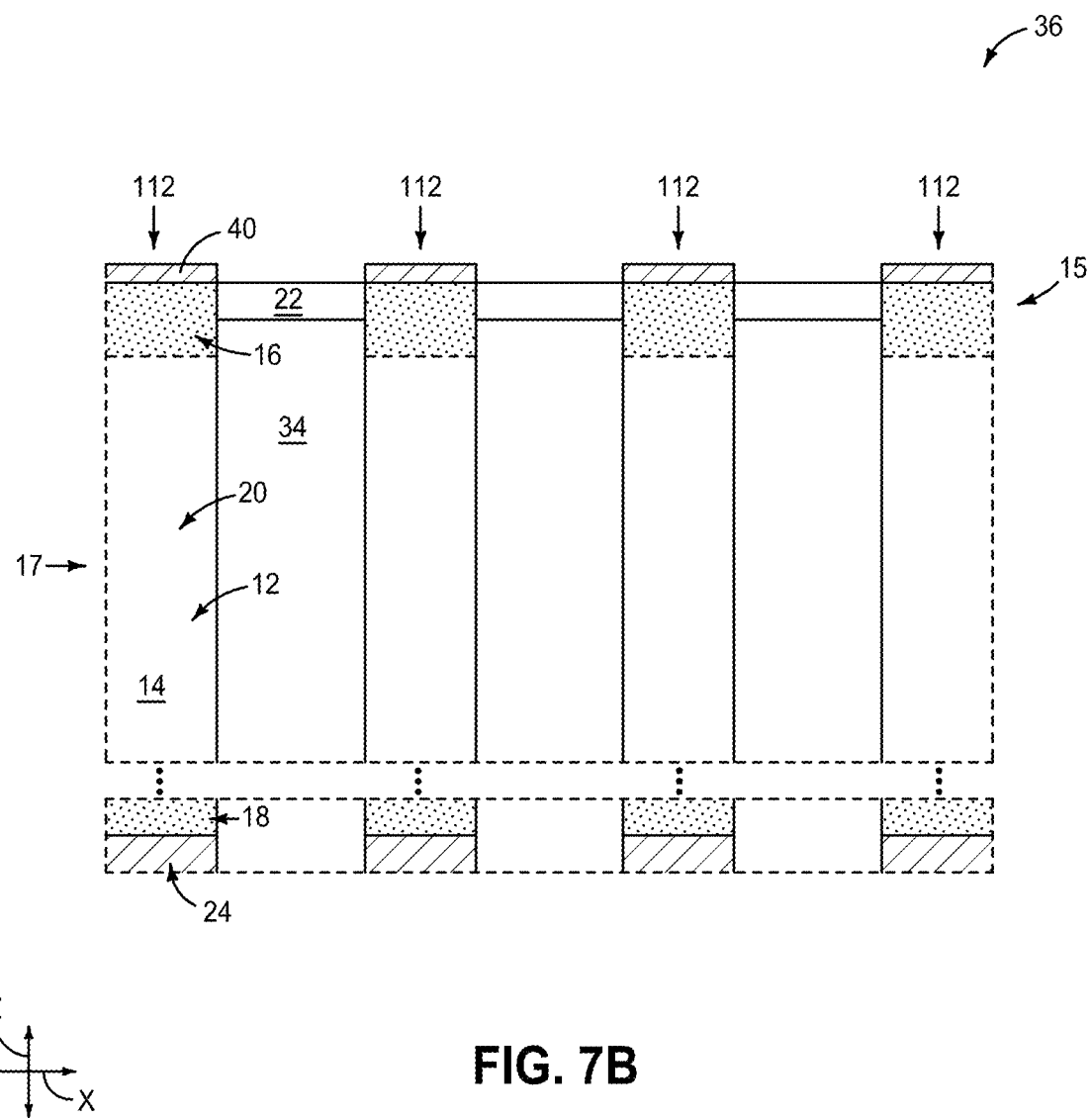
Figure 7C:
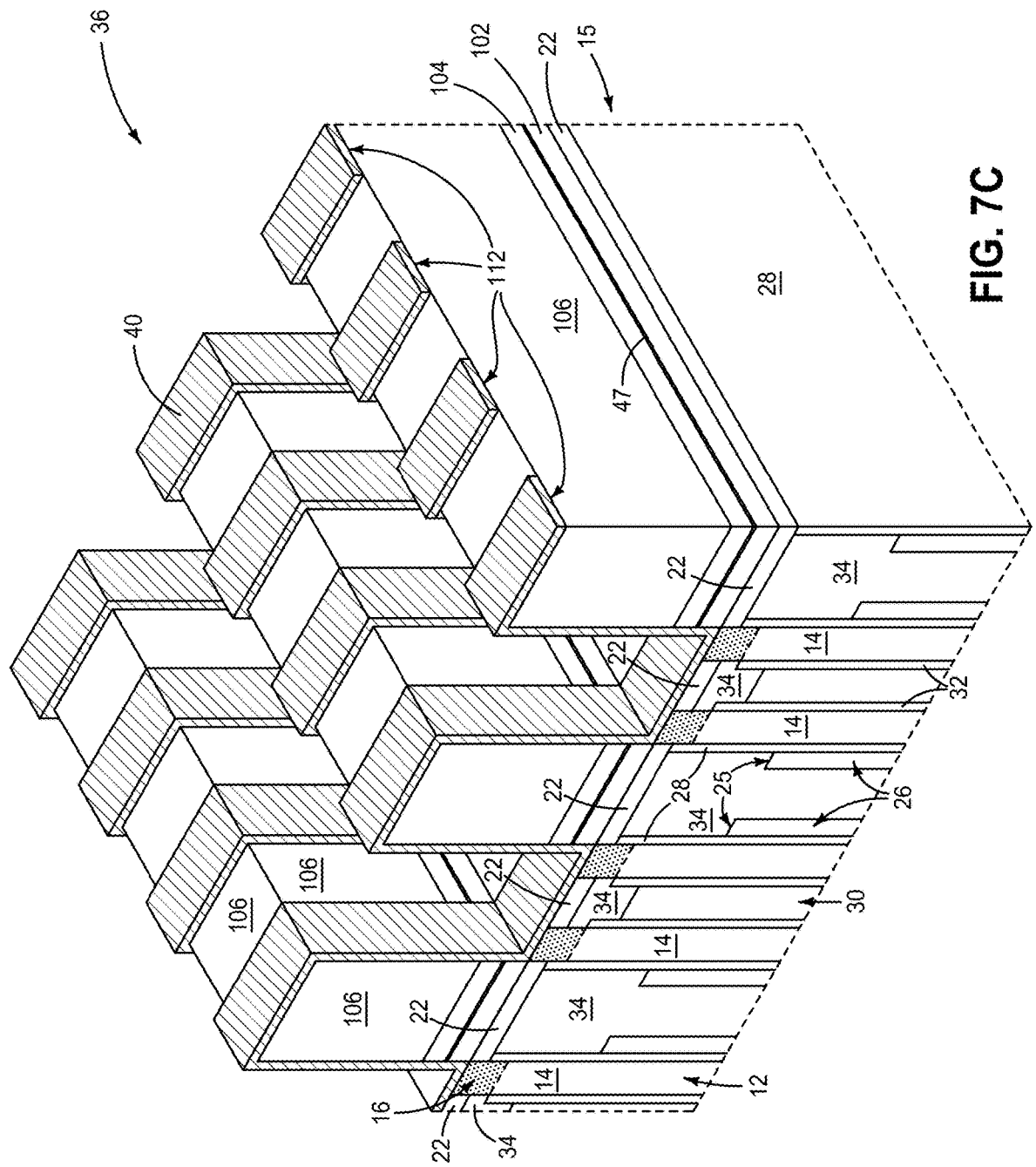

Referring to FIGS. 7-7C, the materials 51 and 110 are removed with one or more suitable etches, which exposes the strips 112 of the bottom-electrode-material 40.

Figure 8:
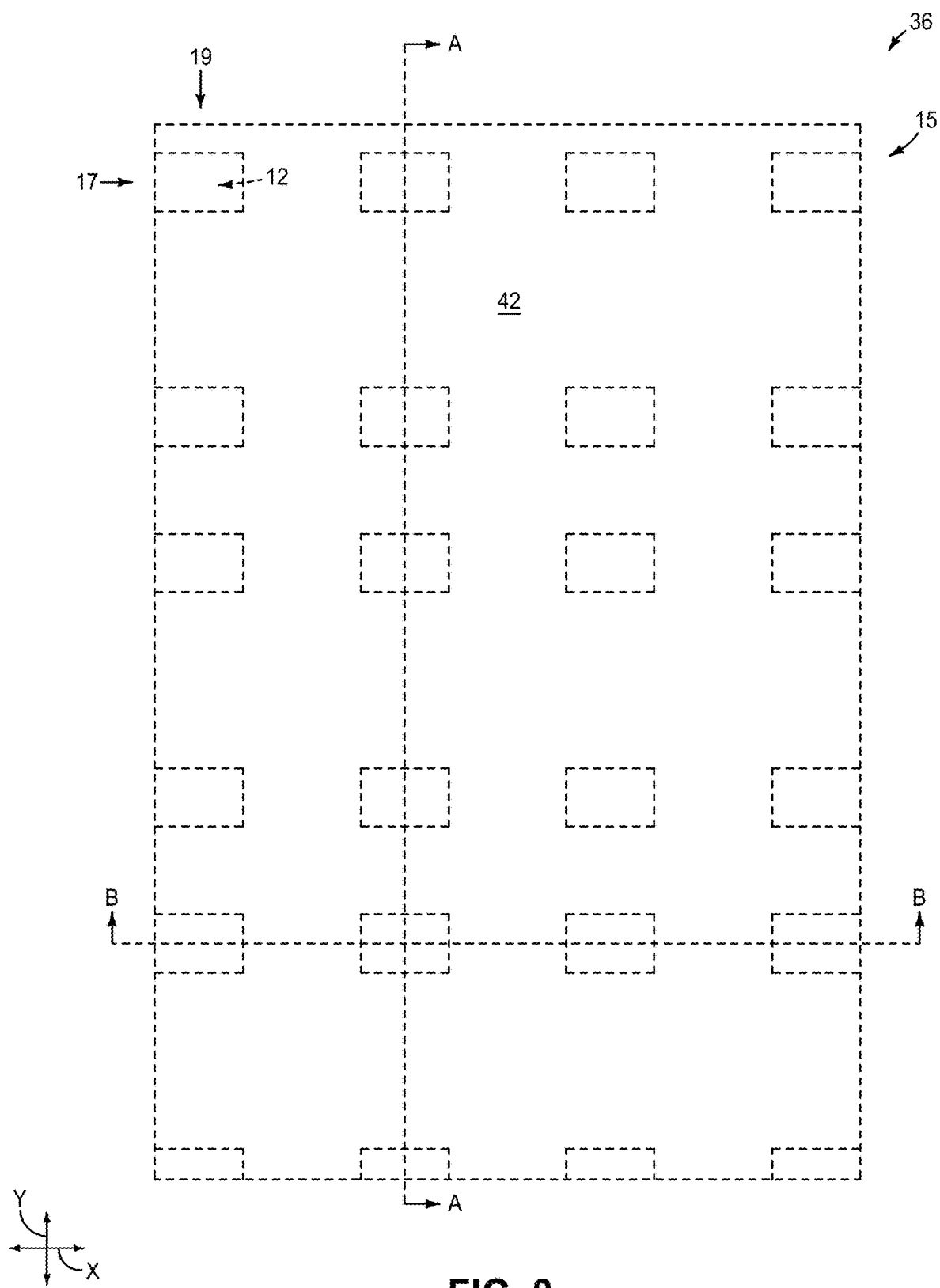
FIGS. 8-8B are diagrammatic views of the region of FIGS. 1-1B at an example process stage following that of FIGS. 7-7C.
Figure 8A:
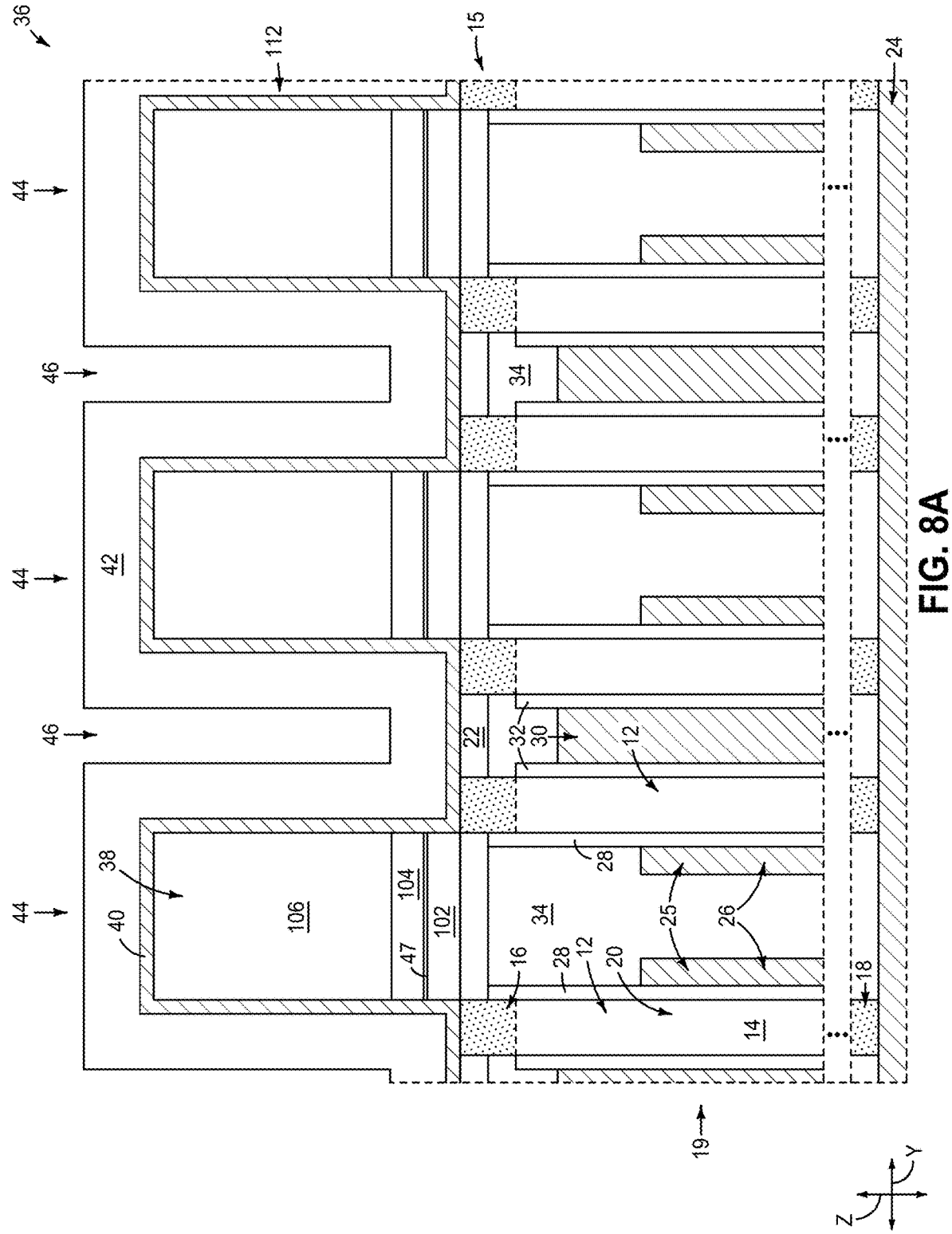
Figure 8B:
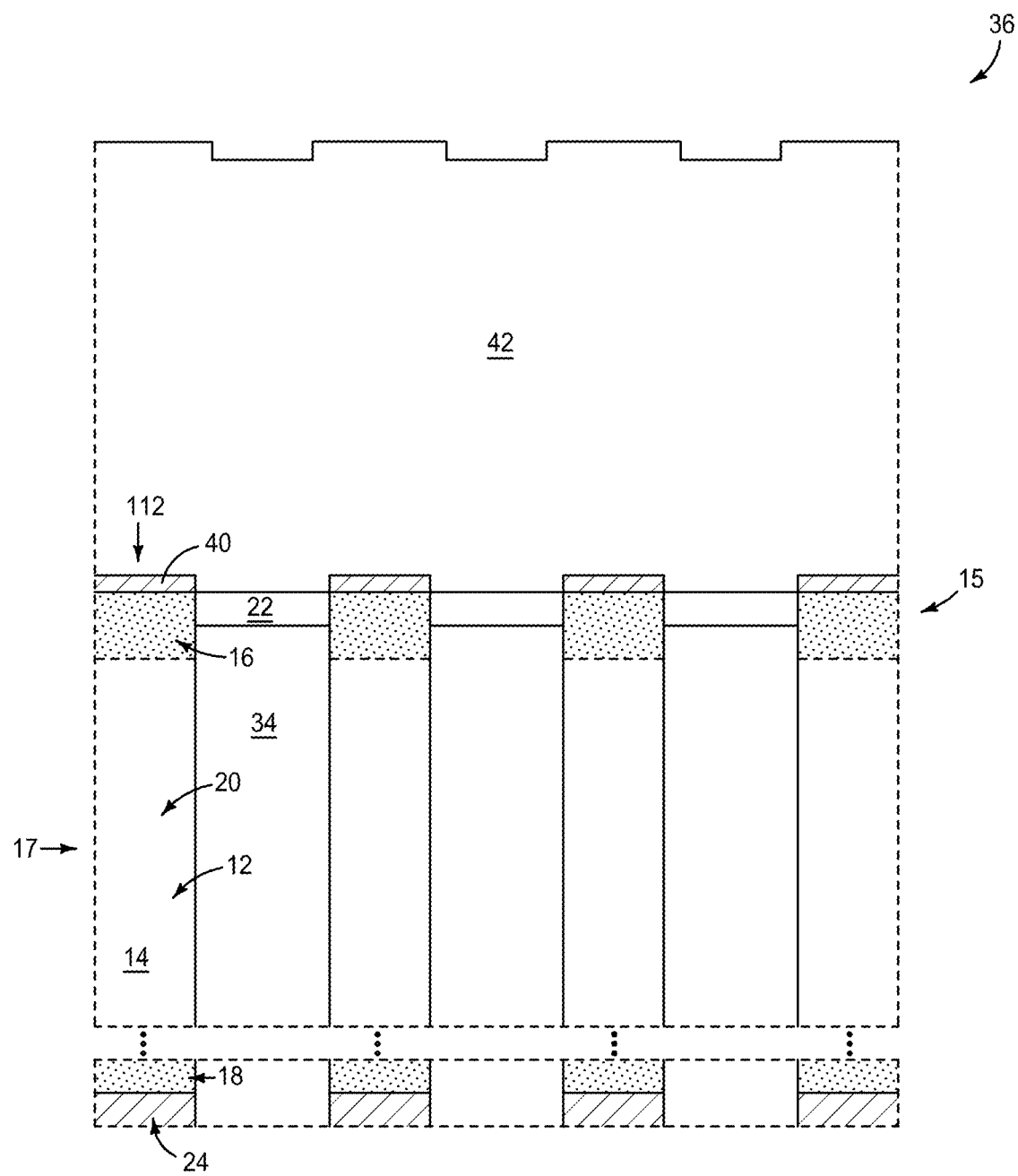

Referring to FIGS. 8-8B, a patterning material 42 is formed over the strips 112 of the bottom-electrode-material 40, and over regions between such strips. The patterning material 42 has an undulating topography which includes peaks 44 over the structures 38, and valleys 46 between the peaks (as shown in FIG. 8A). The material 42 may be formed to any suitable thickness (e.g., a thickness within a range of from about 10 nm to about 30 nm); and may comprise any suitable composition(s). In some embodiments, the material 42 may comprise, consist essentially of, or consist of one or more of silicon dioxide, silicon nitride and silicon oxynitride.

Figure 9:
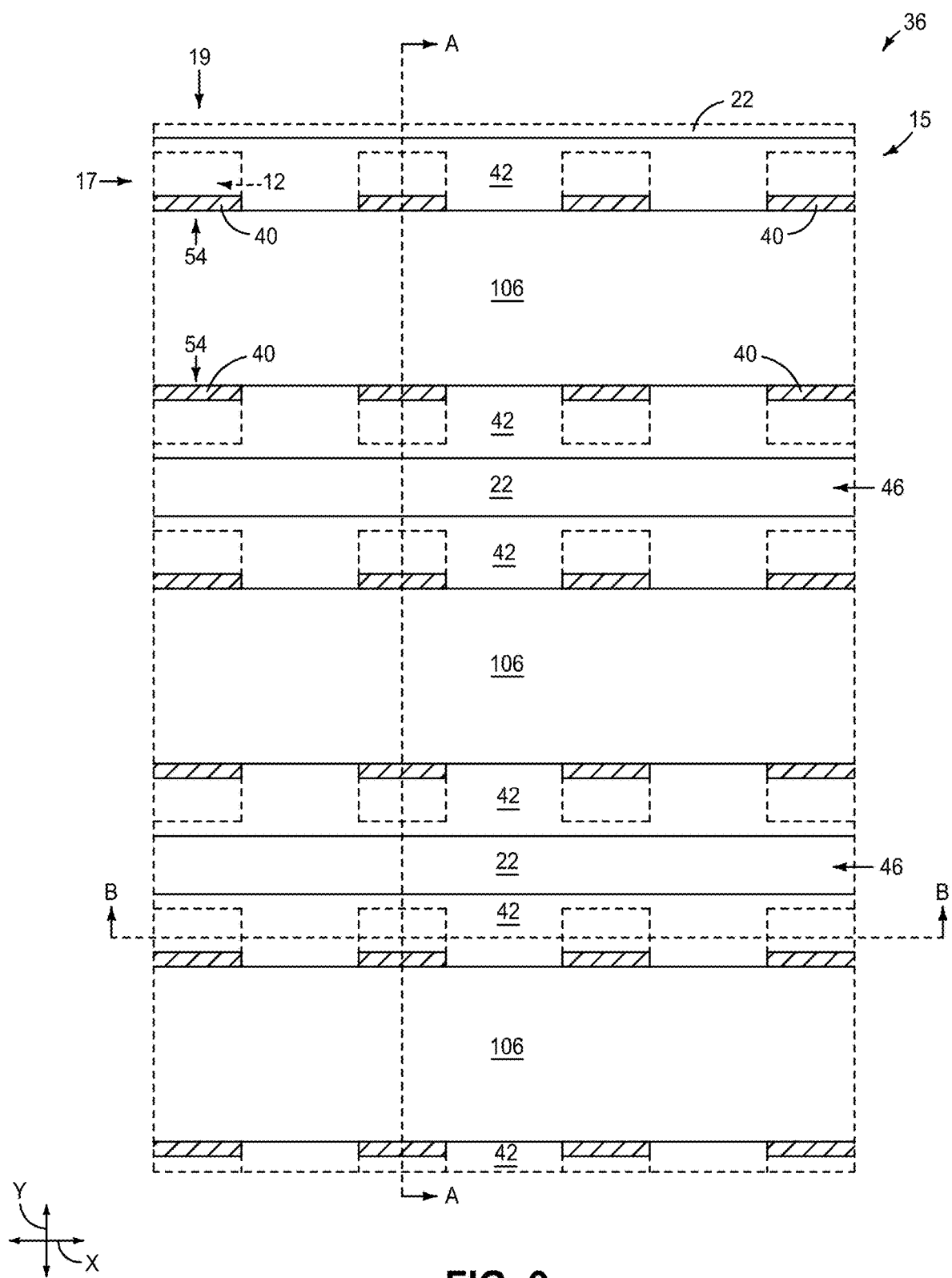
FIGS. 9-9B are diagrammatic views of the region of FIGS. 1-1B at an example process stage following that of FIGS. 8-8B.
Figure 9A:
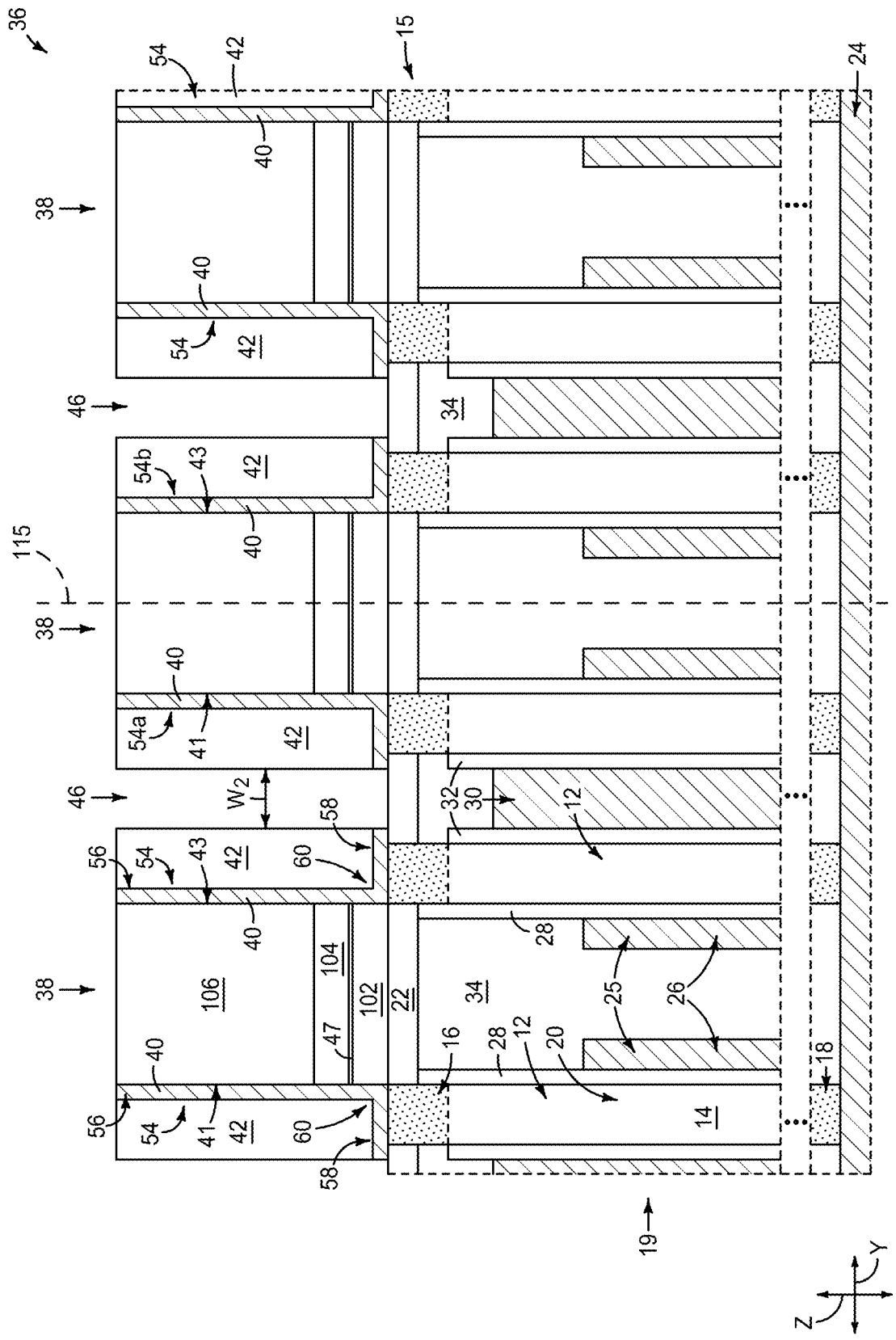
Figure 9B:
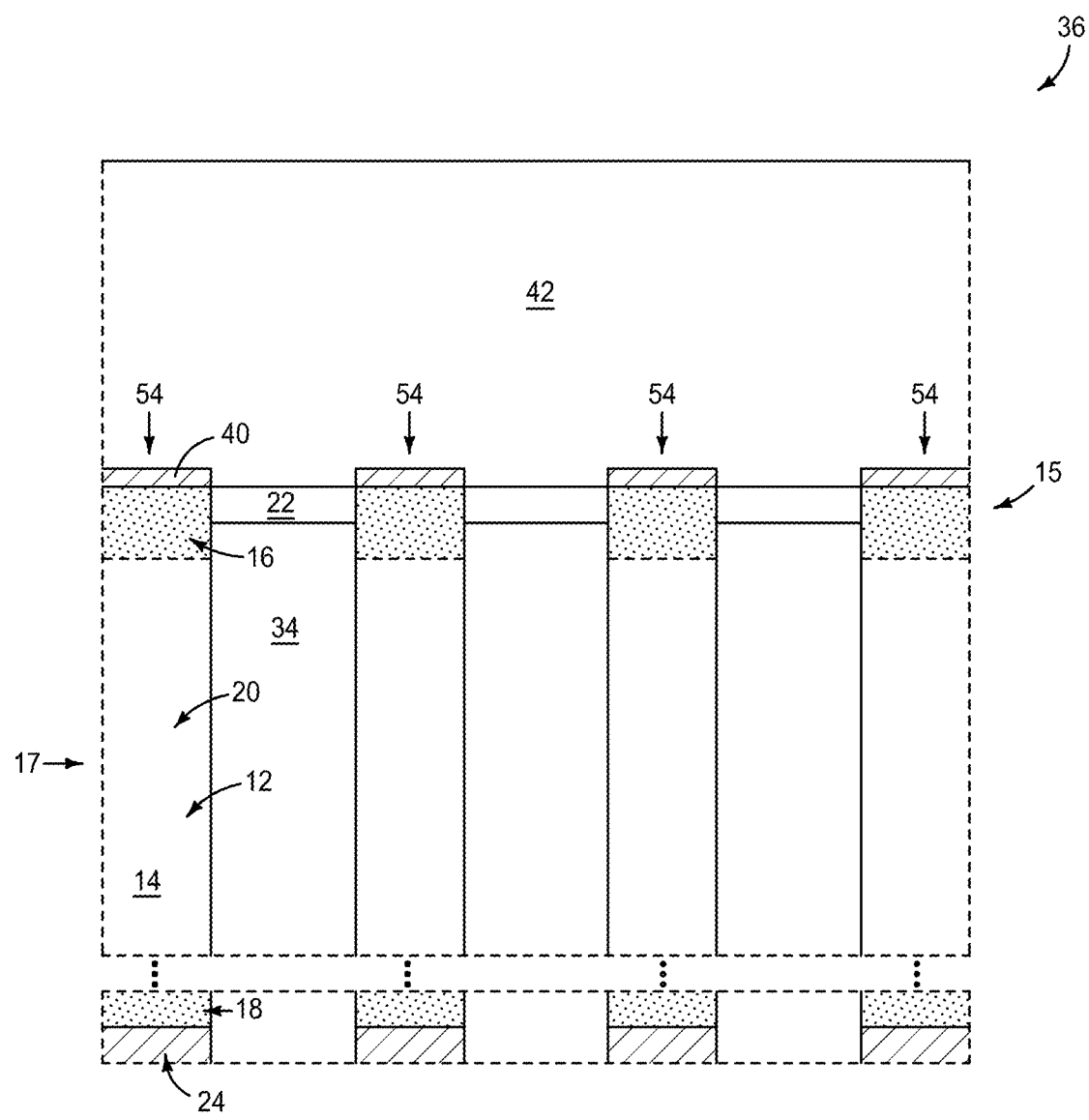
Figure 9B:
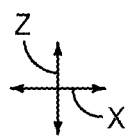

Referring to FIGS. 9-9B, the assembly 36 is subjected to one or more etches, and possibly also planarization, to remove the materials 40 and 42 from over the linear structures (insulative structures) 38; and to extend the valleys 46 through the materials 40 and 42, and to the insulative material 22. The valleys 46 thus become openings 46 which extend through the materials 42 and 40 to the material 22. In the illustrated embodiment, the openings 46 stop at an upper surface of the material 22. In other embodiments, the openings 46 may penetrate into the material 22 (or may even penetrate through the material 22 and stop at the underlying material 34).

The illustrated embodiment shows the upper surfaces of materials 106, 40 and 42 being substantially coplanar. In other embodiments at least one of such upper surfaces may be at a different elevational level relative to one or more of the others of such upper surfaces.

The illustrated openings 46 may have any suitable widths $W_2$ along the cross-section of FIG. 9A, and in some embodiments such widths may be within a range of from about 10 nm to about 50 nm.

The processing of FIGS. 6-6B (which patterns the bottom electrode material 40 into the strips 112 which extend along the y-axis direction), together with the subsequent processing of FIGS. 9-9B (which subdivides the strips utilizing the openings 46 that extend along the x-axis direction), may be considered to pattern the bottom-electrode-material 40 into bottom-electrode-structures (bottom electrodes) 54. Each of the bottom-electrode-structures is over one of the source/drain regions 16, and may be considered to be associated with a corresponding one of the vertically-extending pillars 12.

Each of the bottom-electrode-structures 54 has a vertical segment 56 along one of sidewalls (41, 43) of a linear structure 38, and has a horizontal segment 58 along a source/drain region 16. The horizontal segments 58 join to the vertical segments 56 at corners 60. The corners 60 may be about 90° (i.e., may be approximately right angles), with the term "about 90°" meaning 90° to within reasonable tolerances of fabrication and measurement. In some embodiments, the term about 90° may mean 90°±10°.

In some embodiments, the horizontal segments 58 may be referred to as first segments and the vertical segments 56 may be referred to as second segments. The first and second segments 58 and 56 may or may not be substantially orthogonal to one another, depending on whether the sidewalls (41, 43) are vertical (as shown) or tapered.

In the illustrated embodiment, the vertical segments 56 are longer than the horizontal segments 58. In other embodiments, the segments 56 and 58 may be about the same length as one another, or the horizontal segments 58 may be longer than the vertical segments 56.

The bottom-electrode-structures 54 may be considered to be configured as angle plates, and in the shown embodiment are in one-to-one correspondence with the upper source/drain regions 16. Each of the bottom electrodes 54 may be considered to be electrically coupled with an associated source/drain region 16 of an associated pillar 12.

In some embodiments, a bottom electrode along a first side 41 of a linear structure 38 (e.g., the bottom electrode labeled 54*a*) may be referred to as a first bottom electrode, and the bottom electrode along the opposing side 43 of the linear structure (e.g., the bottom electrode labeled 54*b*) may be referred to as a second bottom electrode. The first bottom electrode (e.g., 54*a*) may be considered to be substantially a mirror image of the second bottom electrode (e.g., 54*b*) across a plane 115 centrally located between the first and second bottom electrodes, where the term "substantial mirror image" means a mirror image to within reasonable tolerances of fabrication and measurement.

Figure 10:
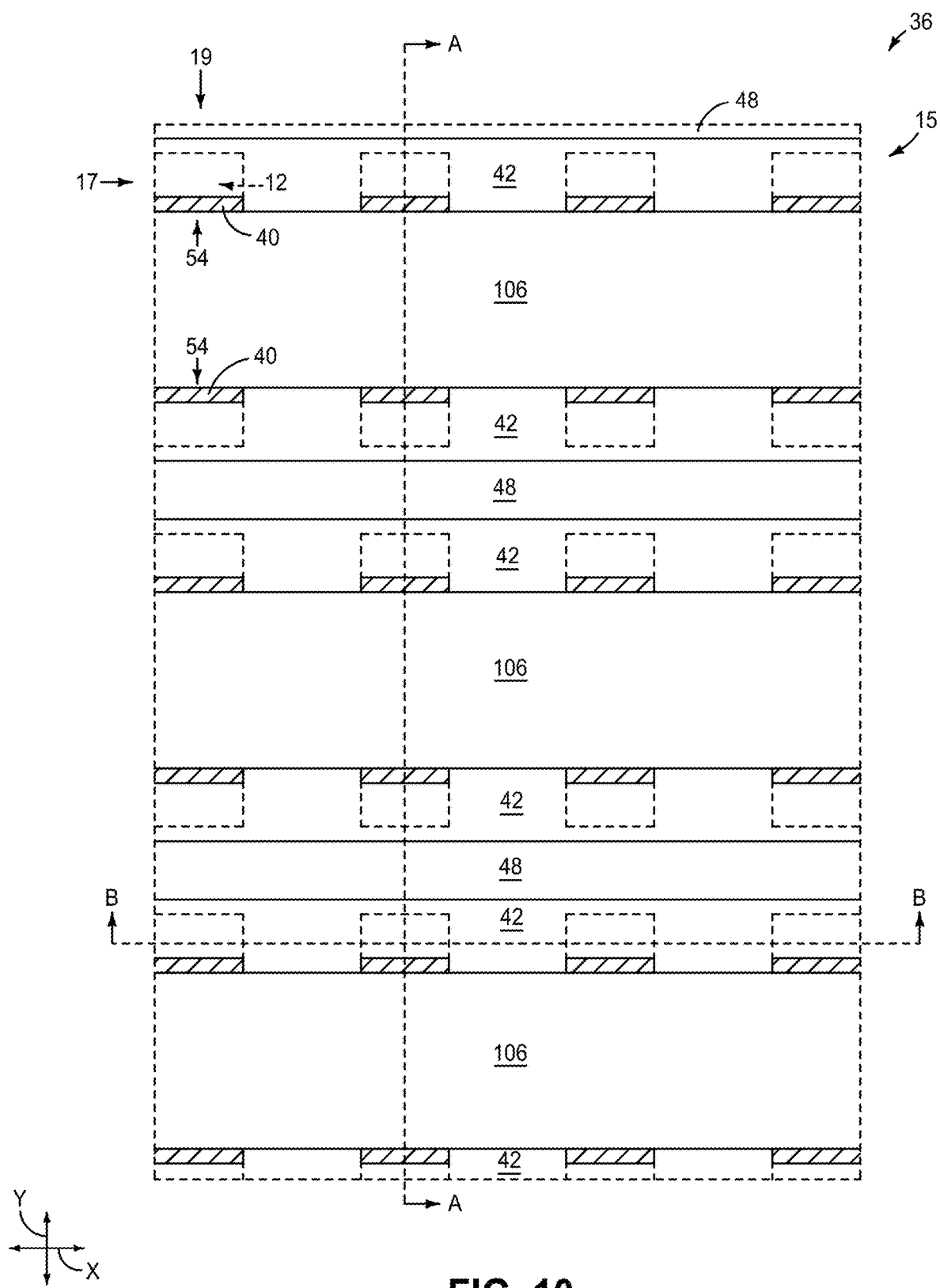
FIGS. 10-10B are diagrammatic views of the region of FIGS. 1-1B at an example process stage following that of FIGS. 9-9B.
Figure 10A:
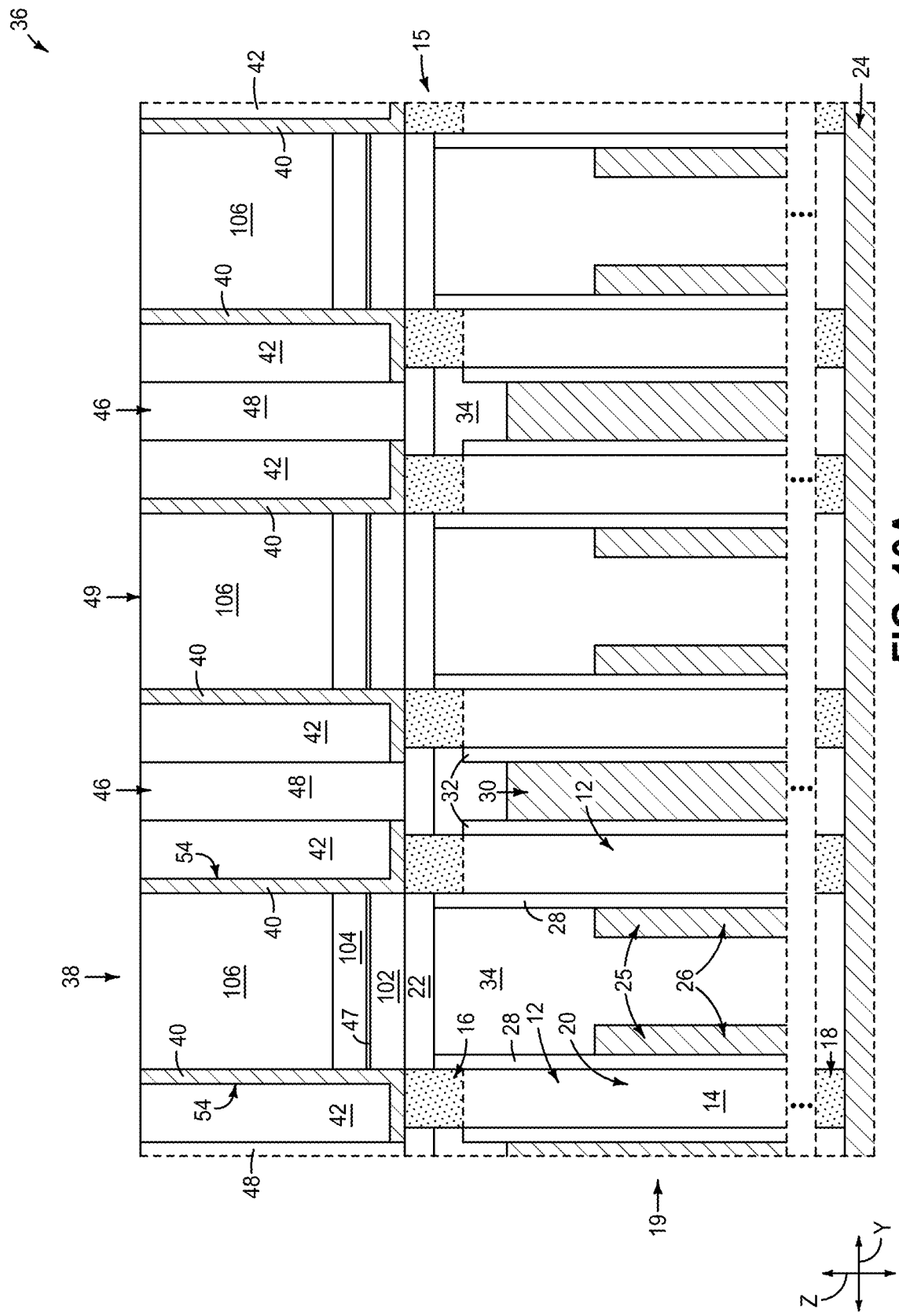
Figure 10B:
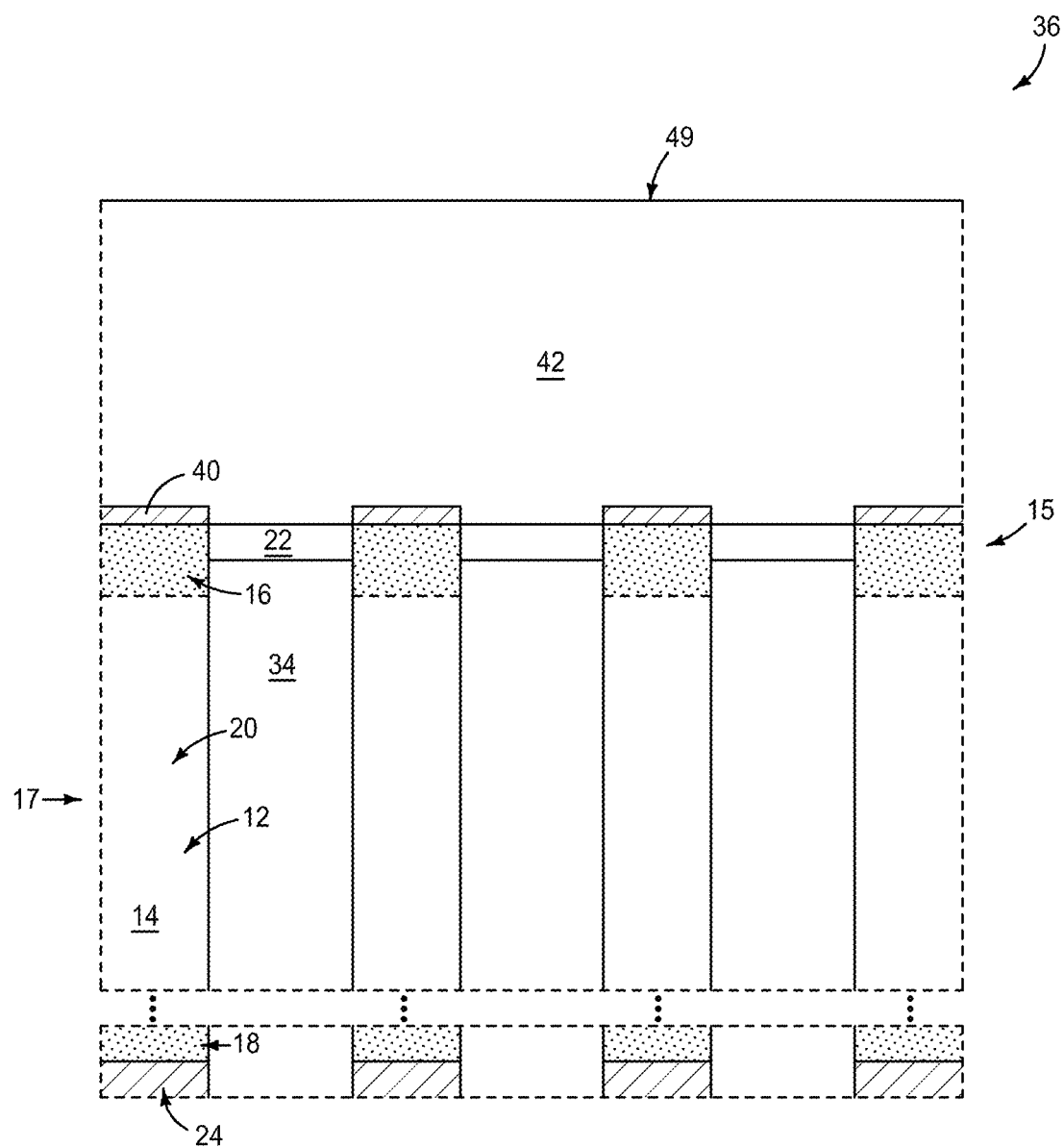

Referring to FIGS. 10-10B, fill material 48 is formed within the openings 46. Subsequently, CMP and/or other suitable planarization is utilized to form a planar (planarized) surface 49 extending across the materials 40, 42, 48 and 106.

The fill material 48 may comprise any suitable composition(s); and in some embodiments may comprise, consist essentially of, or consist of one or more of silicon dioxide, silicon nitride and silicon oxynitride. Accordingly, the fill material 48 may or may not be a same composition as the patterning material 42.

Figure 11:
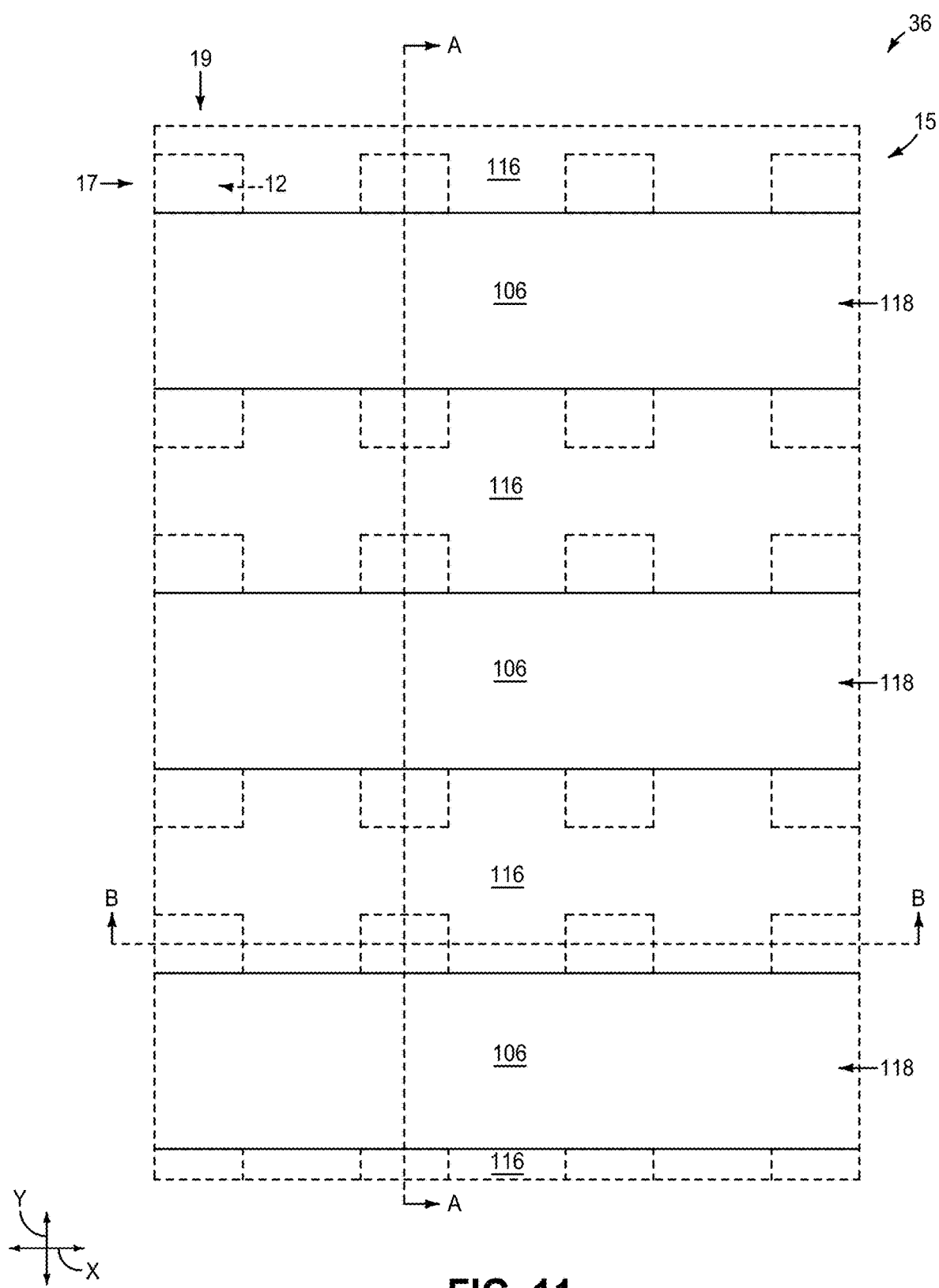
FIGS. 11-11B are diagrammatic views of the region of FIGS. 1-1B at an example process stage following that of FIGS. 10-10B.
Figure 11A:
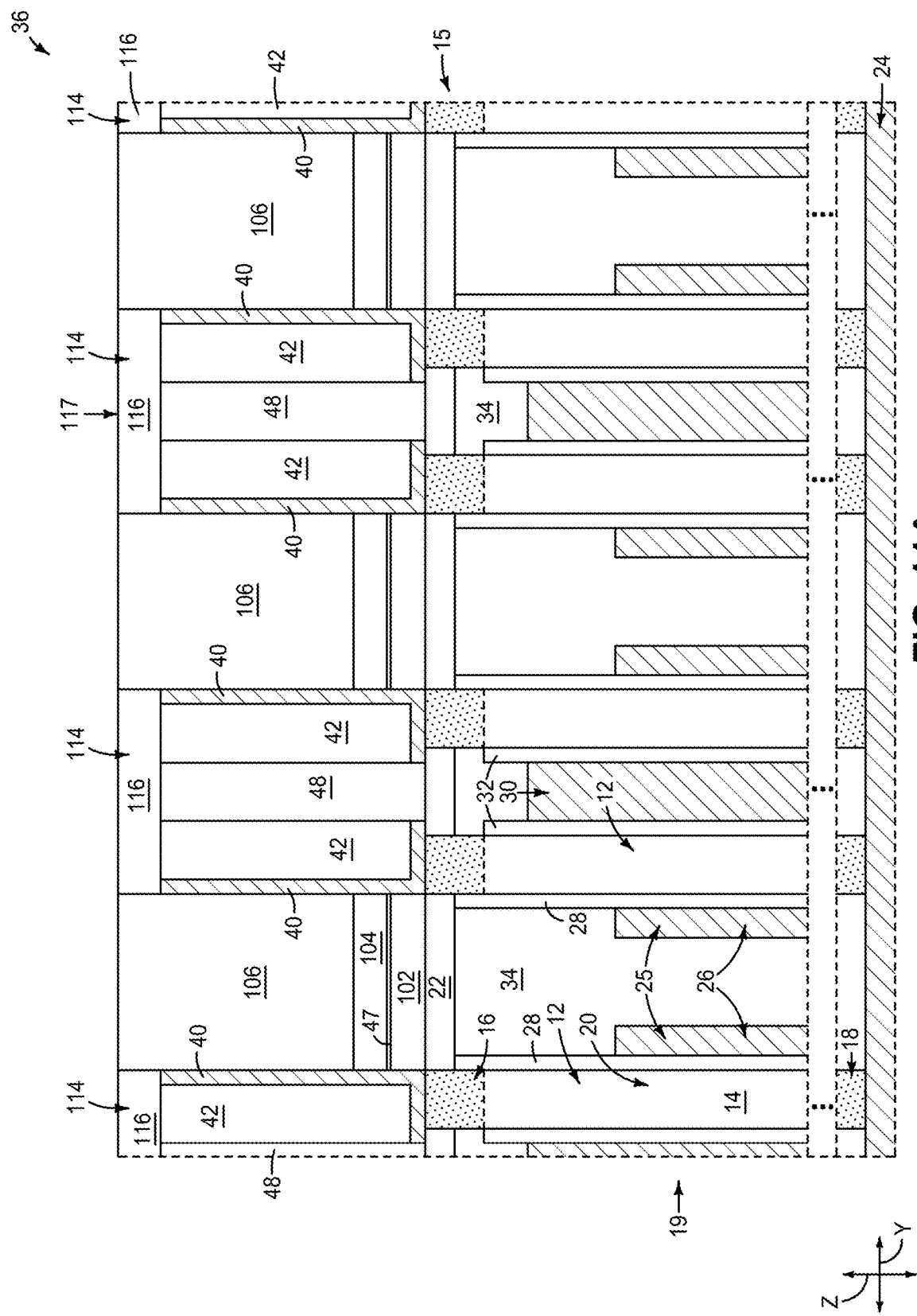
Figure 11B:
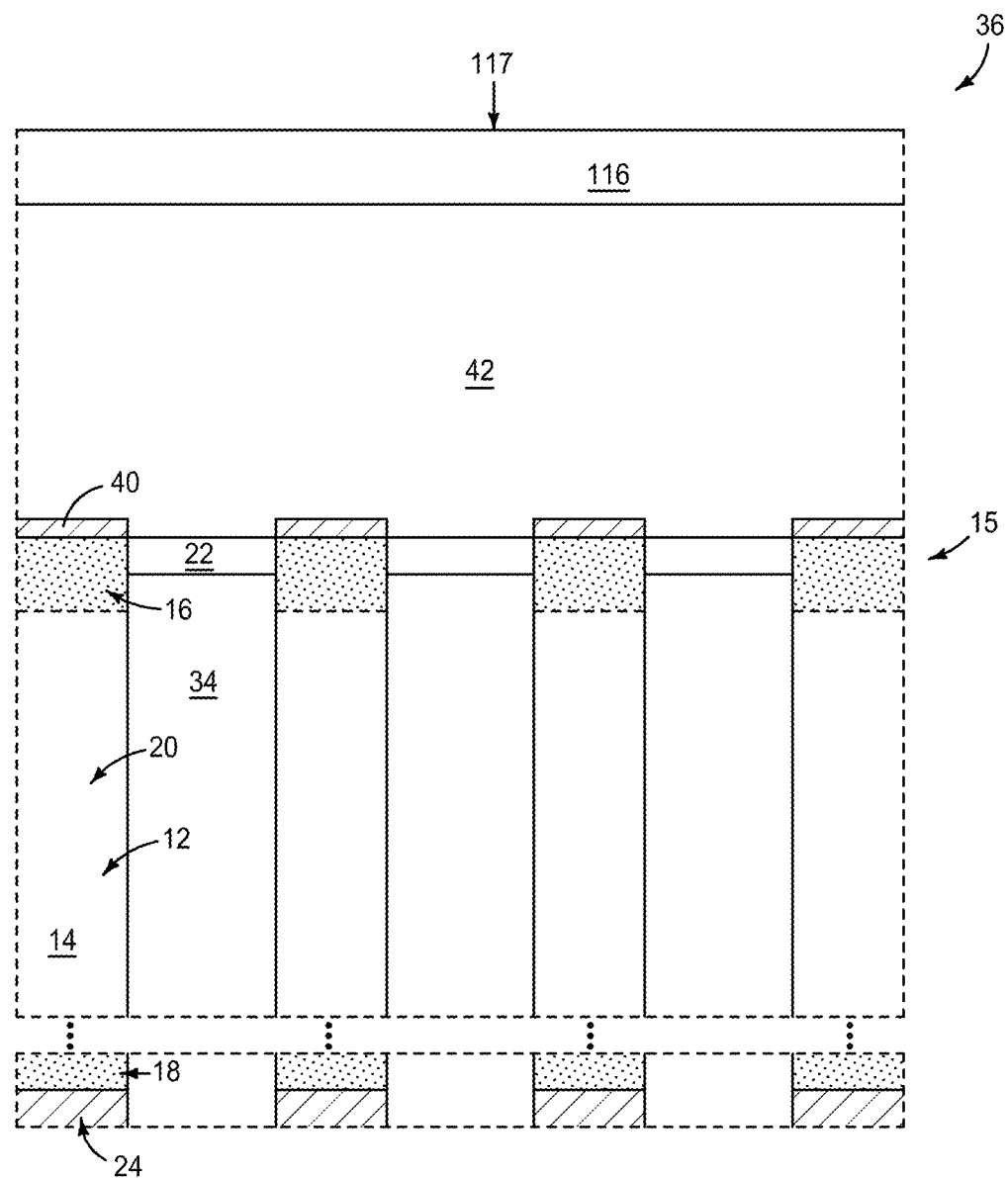

Referring to FIGS. 11-11B, the materials 42, 48 and 40 are recessed relative to the material 106 to form cavities 114 (shown in FIG. 11A), and then fill material 116 is formed within the cavities.

The cavities 114 may be formed with one or more suitable etches. For instance, in some embodiments the materials 42 and 48 may be recessed with a first etch, and then the material 40 may be recessed with a subsequent second etch. Alternatively, the material 40 may be recessed with the first etch, and the materials 42 and 48 may be recessed with the second etch.

The fill material 116 may be selectively etchable relative to the materials 40, 42 and 48, and the material 106 may be selectively etchable relative to the material 116. The material 116 may comprise any suitable composition(s), and in some embodiments may comprise, consist essentially of, or consist of one or more of carbon-doped silicon dioxide, boron-doped silicon dioxide, silicon oxynitride, etc.

A planarized (planar) upper surface 117 extends across the materials 106 and 116. The planarized surface 117 may be formed with any suitable processing, including, for example, CMP.

Figure 12:
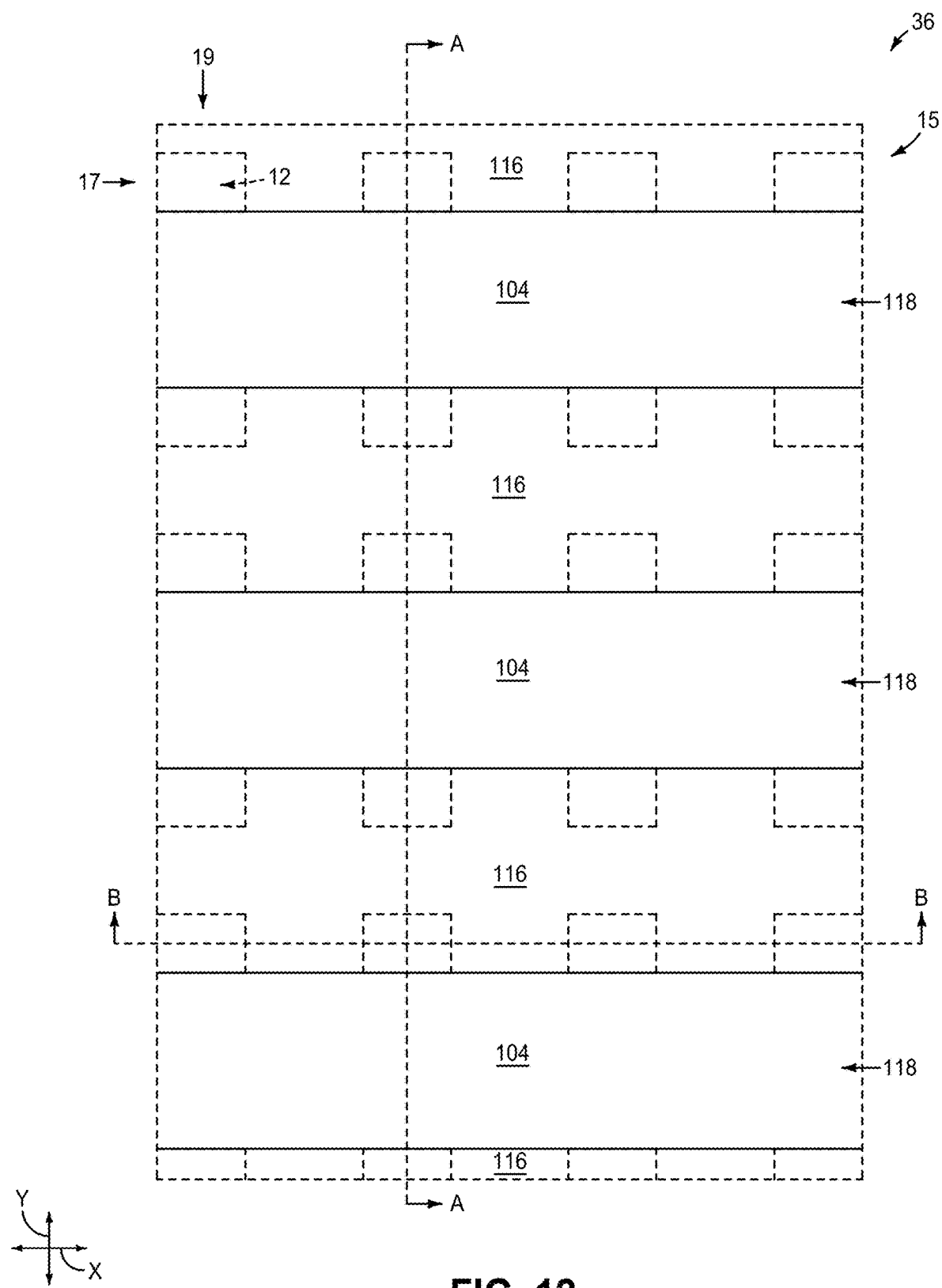
FIGS. 12-12B are diagrammatic views of the region of FIGS. 1-1B at an example process stage following that of FIGS. 11-11B.
Figure 12A:
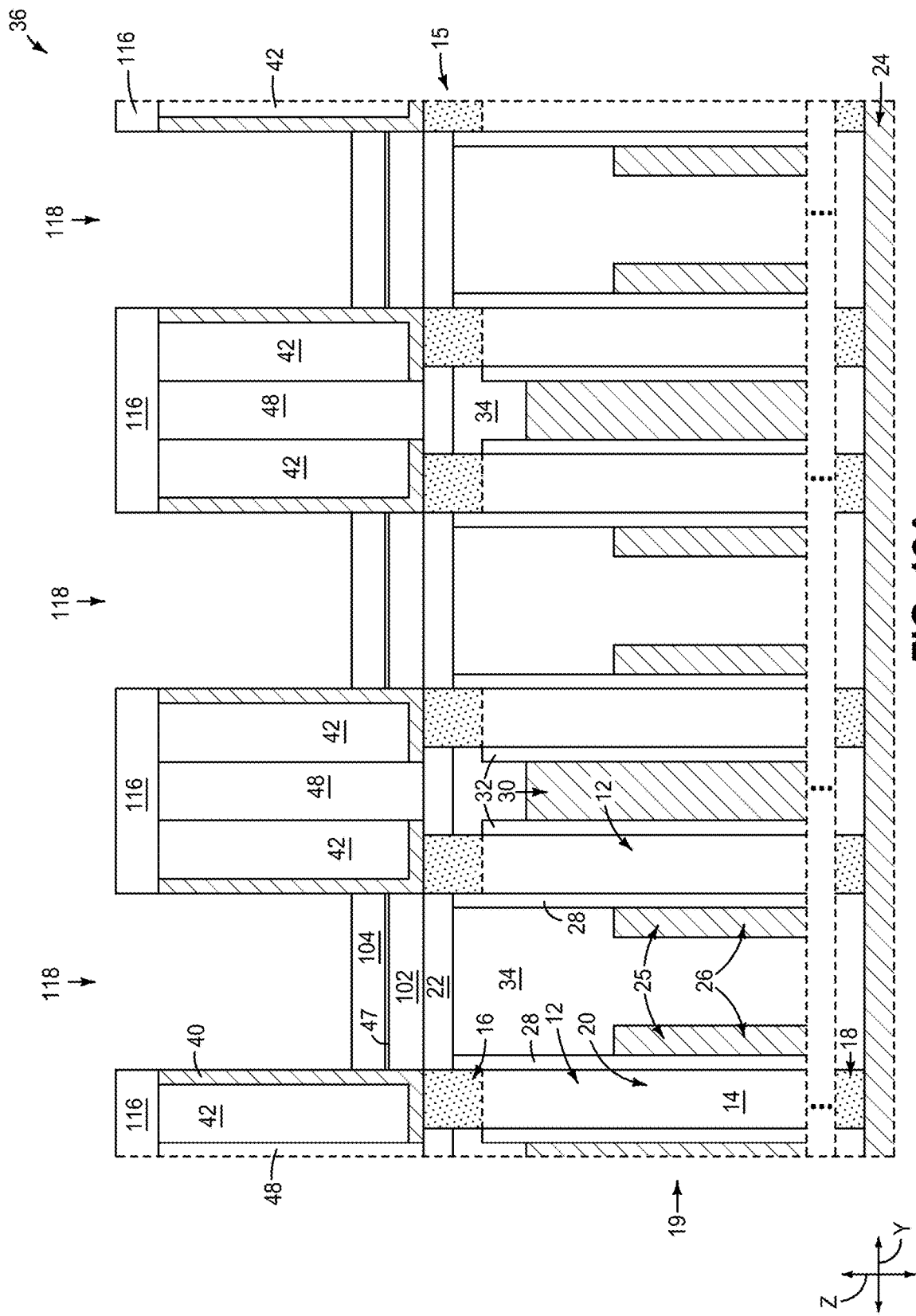
Figure 12B:
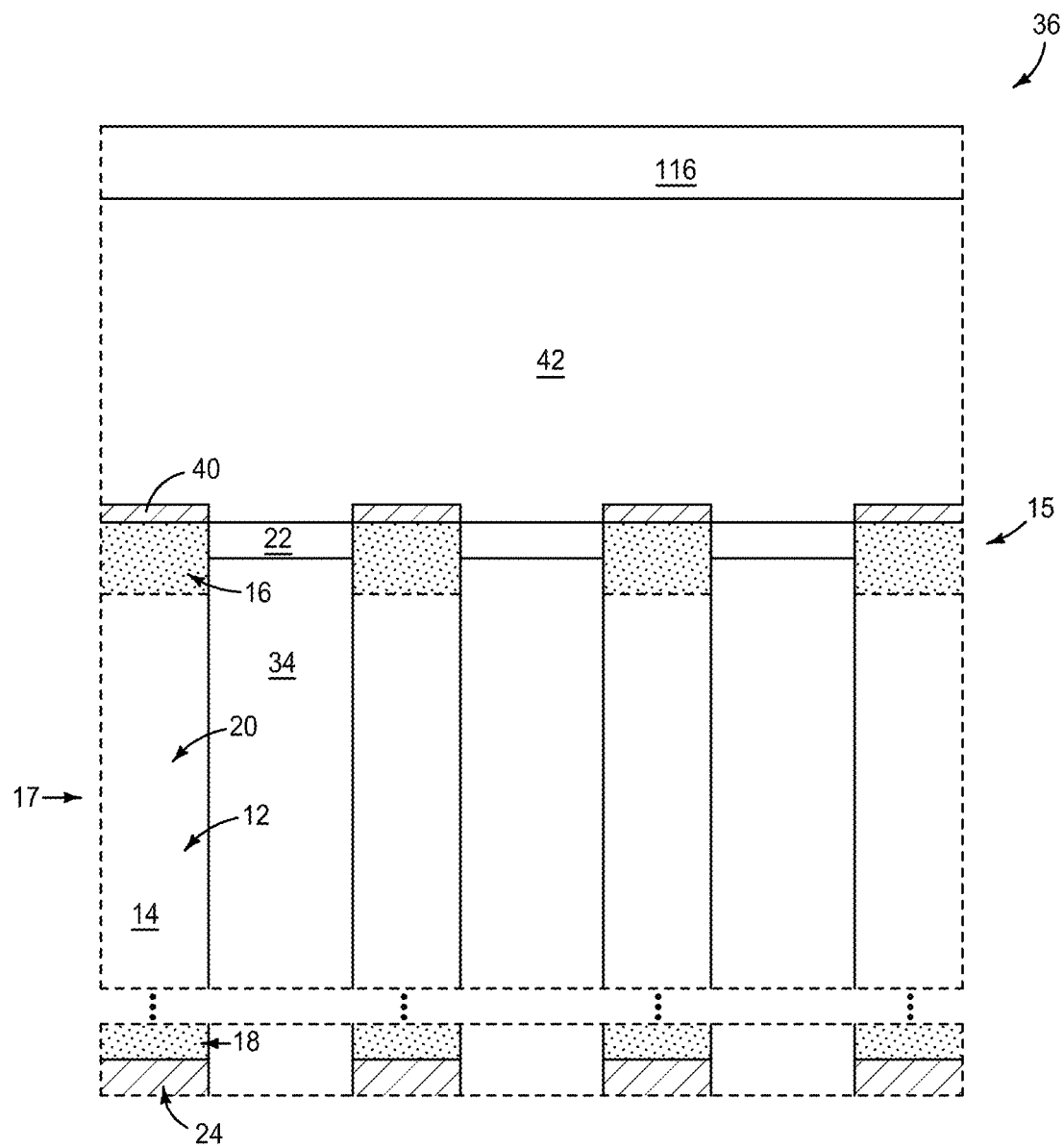

Referring to FIGS. 12-12B, the material 106 (FIG. 11A) is selectively removed relative to the materials 40 and 116 to form trenches 118. Such trenches extend along the row direction (x-axis direction), as shown in FIG. 12.

Figure 13:
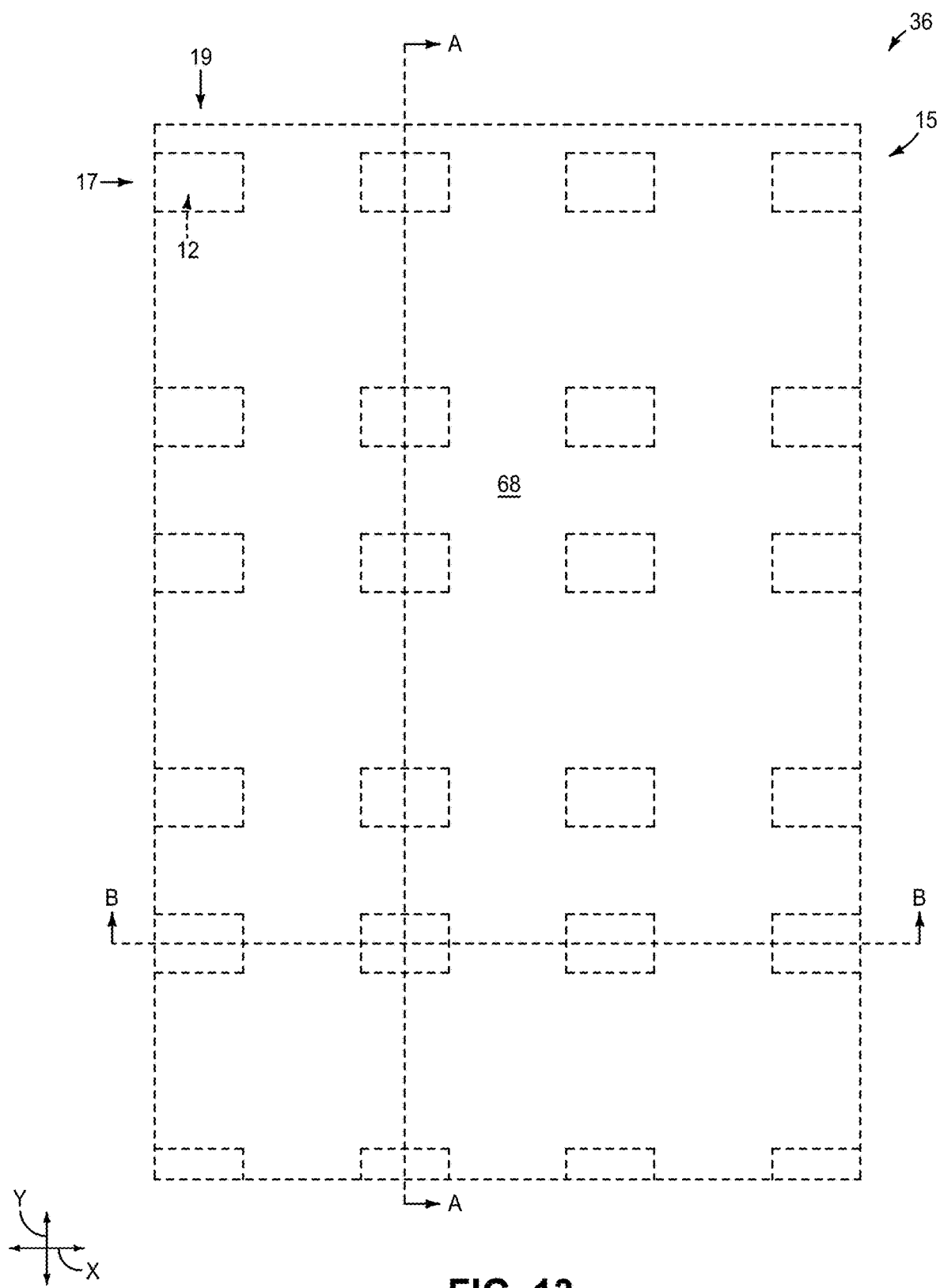
FIGS. 13-13B are diagrammatic views of the region of FIGS. 1-1B at an example process stage following that of FIGS. 12-12B.
Figure 13A:
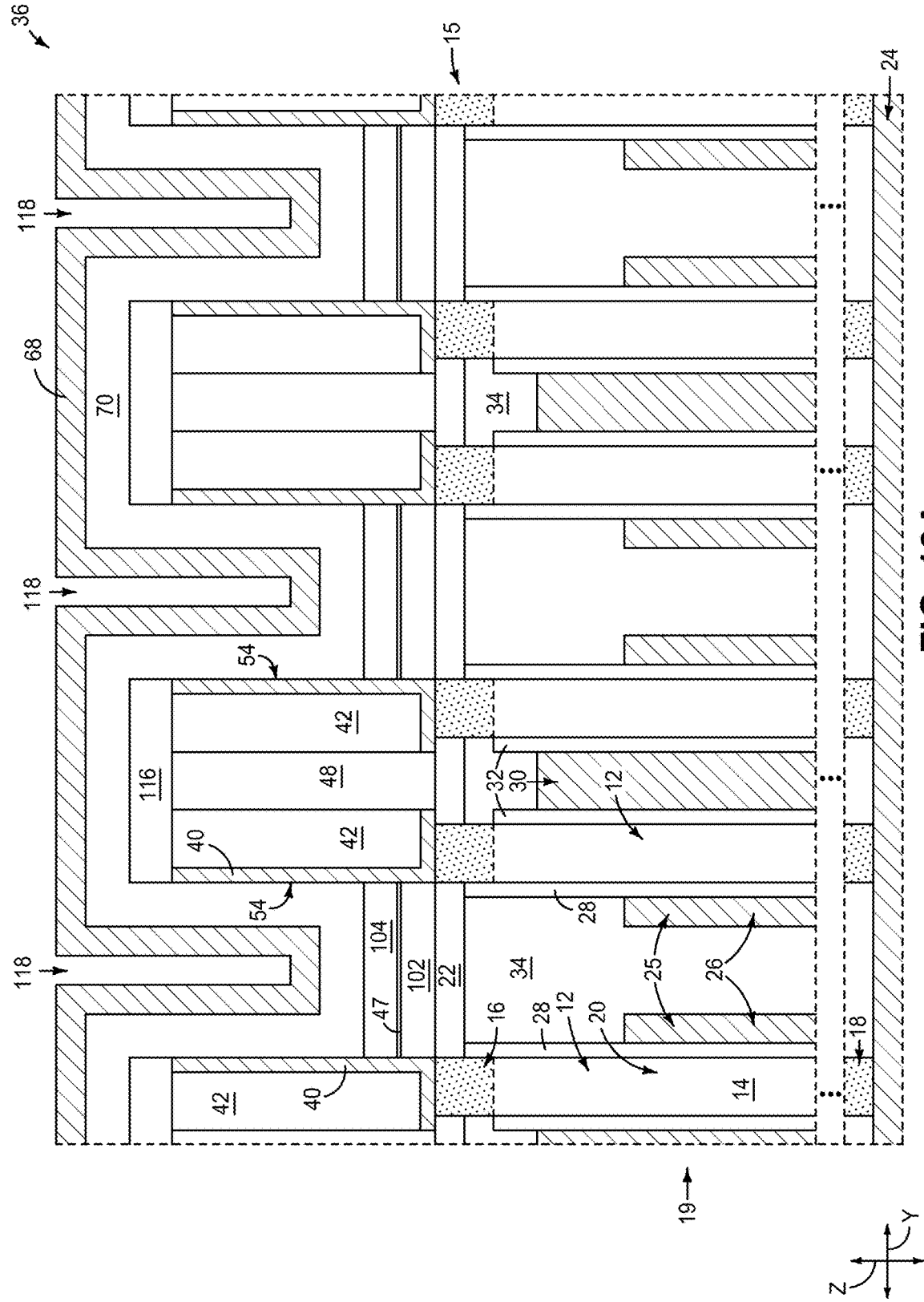
Figure 13B:
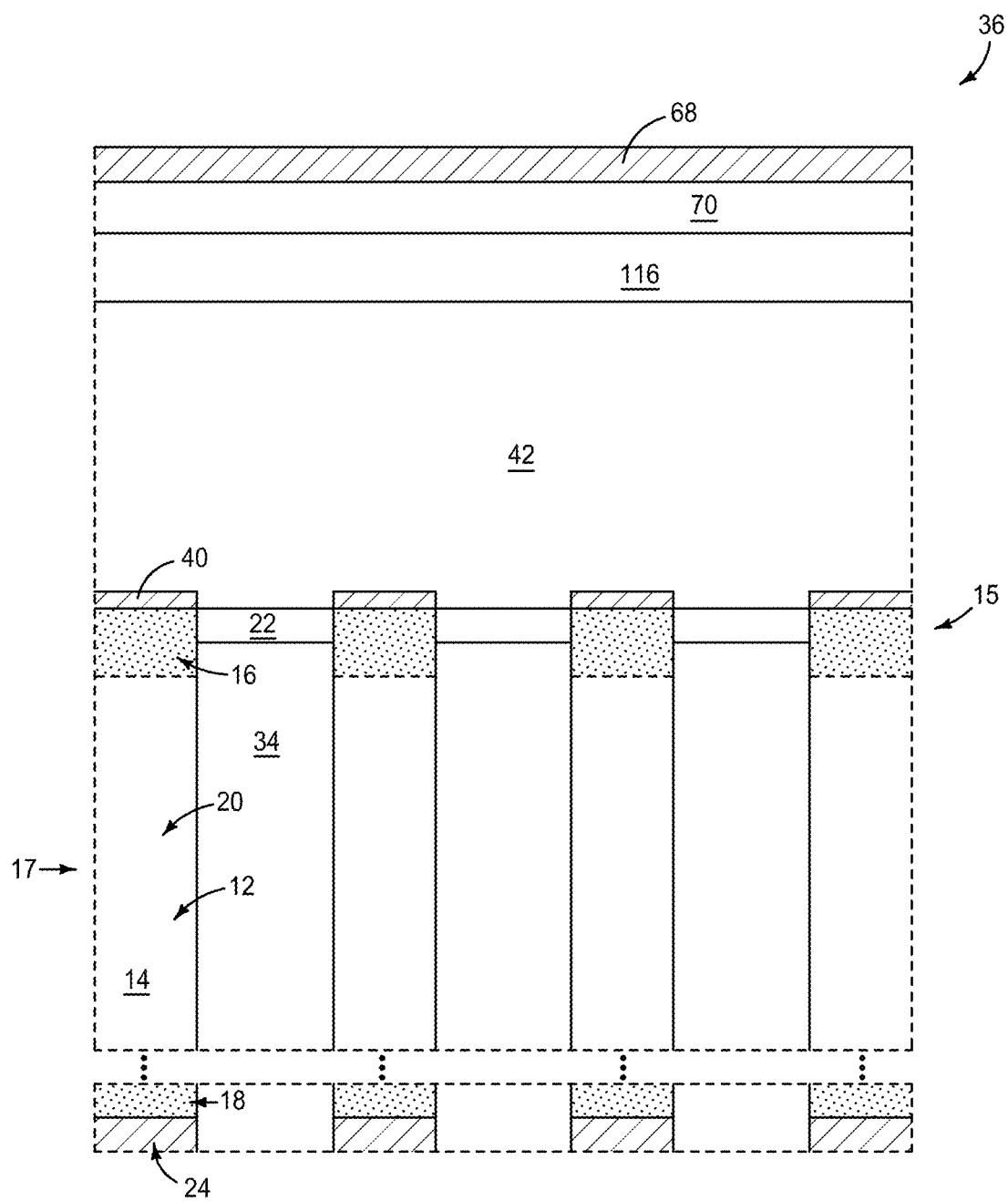

Referring to FIGS. 13-13B, insulative-material (e.g., ferroelectric-insulative-material) 70 and top-electrode-material 68 are formed over the bottom-electrode-structures (bottom electrodes) 54 and within the trenches 118. The materials 68 and 70 narrow the trenches (with the narrowed trenches 118 being shown along the cross-sectional side view of FIG. 13A). The insulative-material 70 is directly against regions of the bottom-electrode-structures 54.

The insulative-material 70 may comprise any suitable composition or combination of compositions; and in some example embodiments comprising silicon dioxide, silicon nitride, etc. In some example embodiments, the material 70 may be ferroelectric-insulative-material which includes one or more of transition metal oxide, zirconium, zirconium oxide, niobium, niobium oxide, hafnium, hafnium oxide, lead zirconium titanate, and barium strontium titanate. Also, in some example embodiments the ferroelectric-insulative-material may have dopant therein which comprises one or more of silicon, aluminum, lanthanum, yttrium, erbium, calcium, magnesium, strontium, and a rare-earth element.

The insulative-material 70 may be formed to any suitable thickness; and in some embodiments may be formed to a thickness within a range of from about 30 Å to about 250 Å; within a range of from about 3 nm to about 30 nm, etc.

The top-electrode-material 68 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the top-electrode-material 68 may comprise, consist essentially of, or consist of one or more of molybdenum silicide, titanium nitride, titanium silicon nitride, ruthenium silicide, ruthenium, molybdenum, tantalum nitride, tantalum silicon nitride and tungsten. In some embodiments, the top electrode material 68 may comprise, consist essentially of, or consist of titanium nitride. The electrode materials 40 and 68 may comprise a same composition as one another in some embodiments, or may comprise different compositions relative to one another. In some embodiments, the electrode materials 40 and 68 may both comprise, consist essentially of, or consist of titanium nitride.

The top-electrode-material 68 may have any suitable thickness, and in some embodiments may have a thickness within a range of from about 3 nm to about 30 nm.

Figure 14:
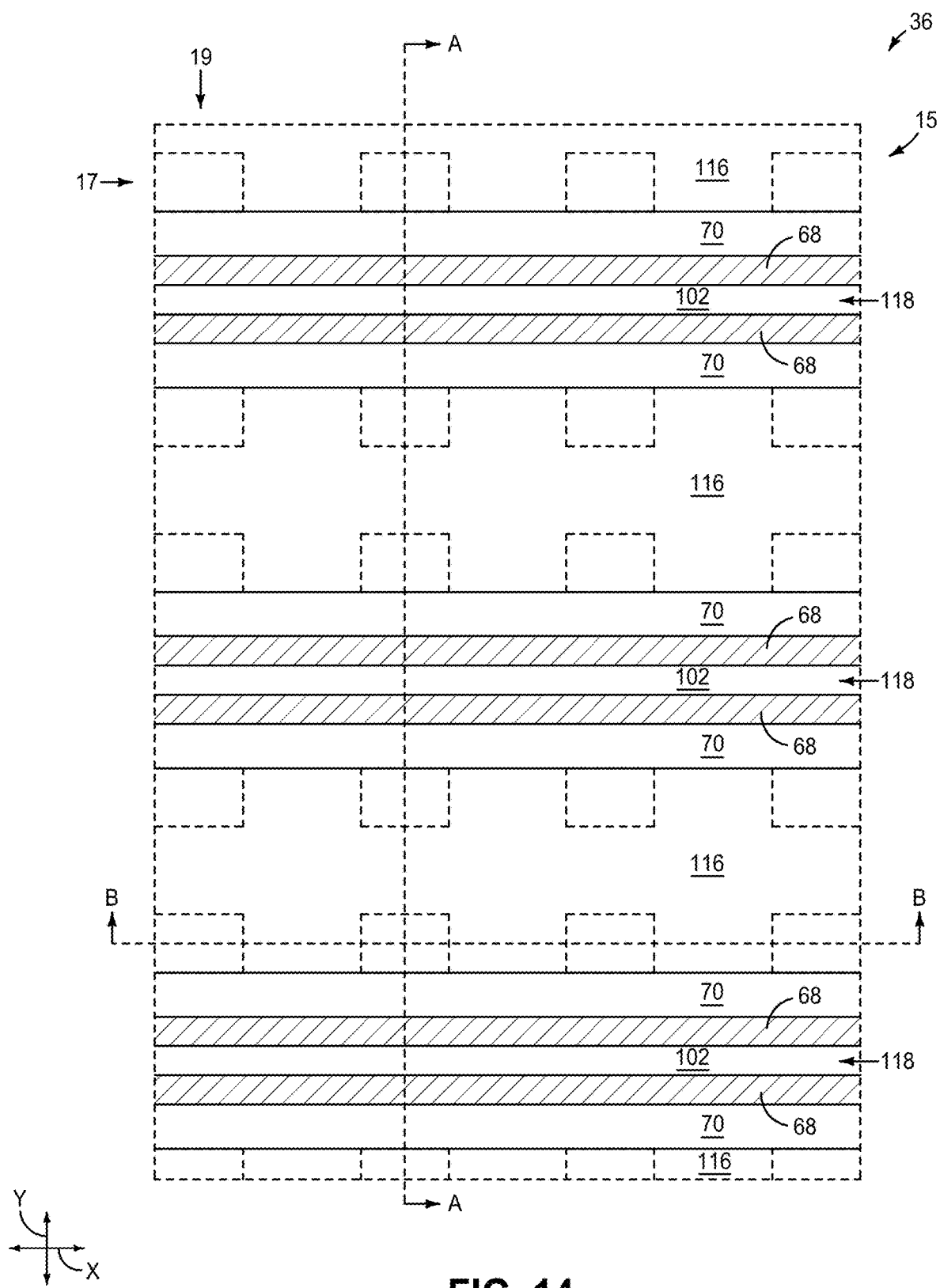
FIGS. 14-14B are diagrammatic views of the region of FIGS. 1-1B at an example process stage following that of FIGS. 13-13B.
Figure 14A:
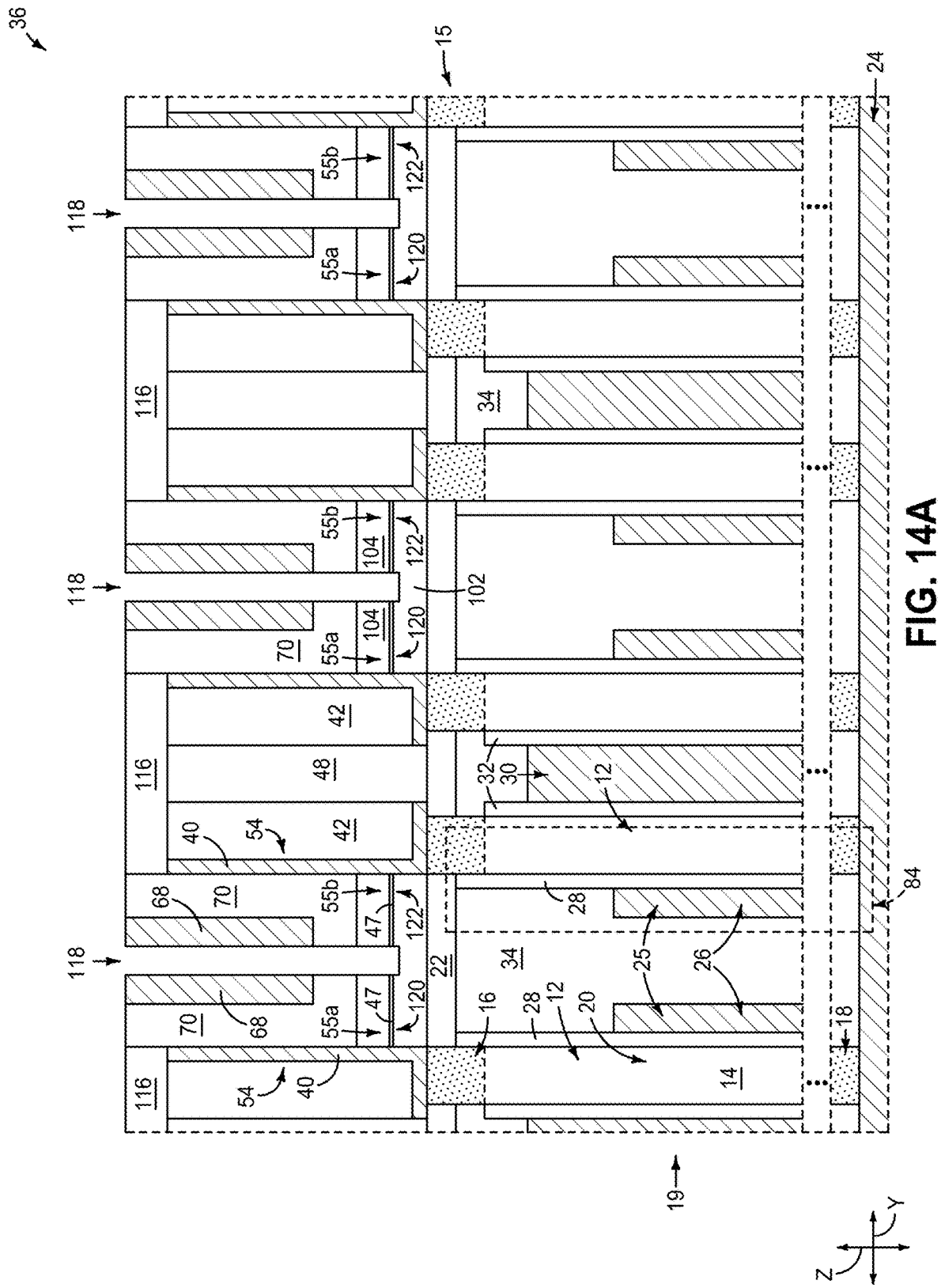
Figure 14B:
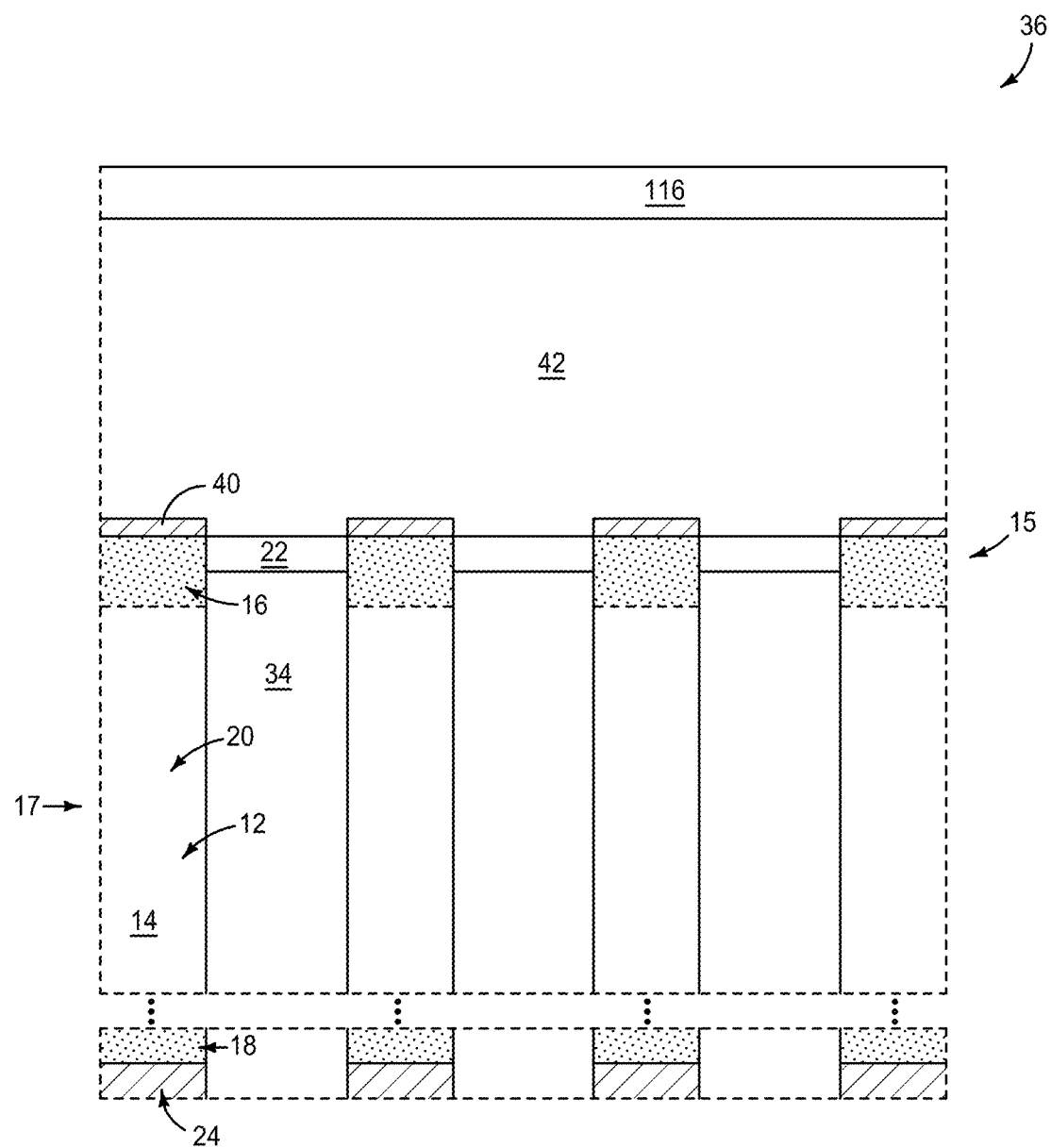

Referring to FIGS. 14-14B, the materials 68, 70 (and possibly also 116) are etched back, and the trenches (openings) 118 are extended to expose regions of the leaker-device-material 47. In the illustrated embodiment, the openings 118 penetrate through the leaker-device-material 47 to break the regions 108 of such leaker-device-material (shown in FIG. 3A) into segments 120 and 122 of the leaker-device-material. In some embodiments, the segments 120 and 122 may be considered to correspond to leaker-device-structures 55*a* and 55*b*, respectively.

Figure 15:
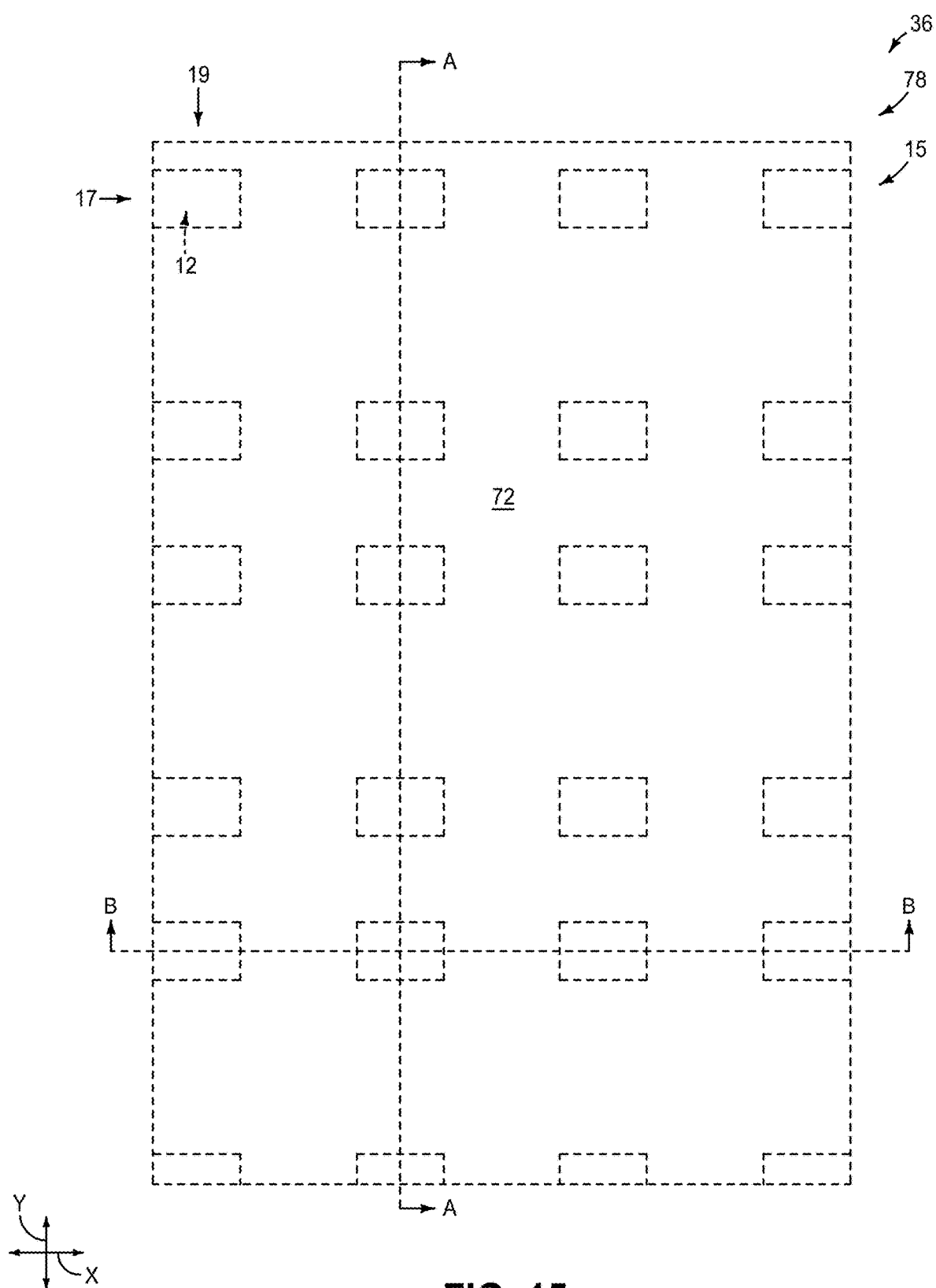
FIGS. 15-15B are diagrammatic views of the region of FIGS. 1-1B at an example process stage following that of FIGS. 14-14B.
Figure 15A:
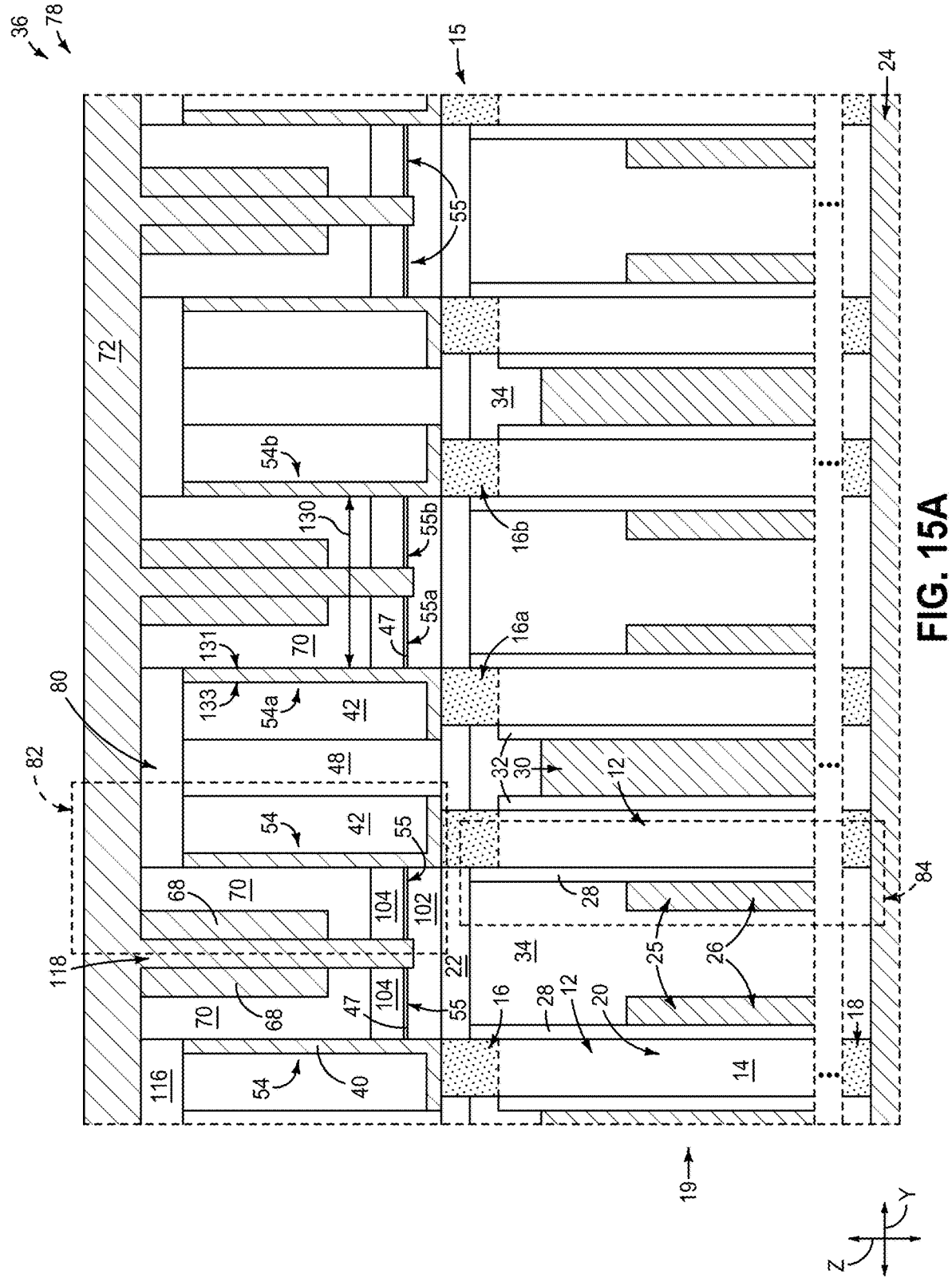
Figure 15B:
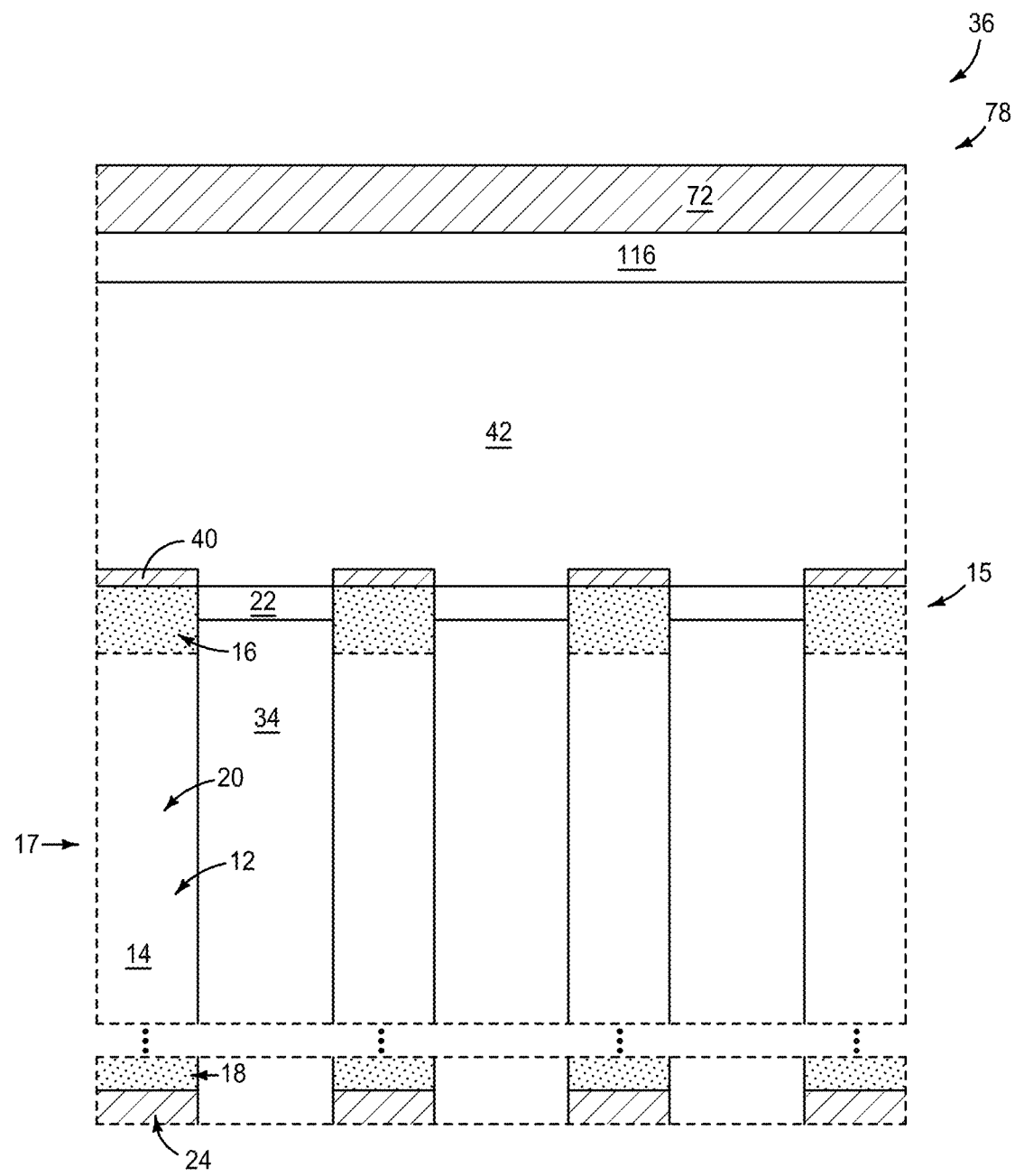

Referring to FIGS. 15-15B, additional top-electrode-material 72 is formed over the top-electrode-material 68 and within the narrowed openings 118. The material 72 may be referred to as plate material. The material 72 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The material 72 may or may not comprise a same composition as the material 68. In some embodiments, the material 68 comprises, consists essentially of, or consists of titanium nitride, and the material 72 comprises, consists essentially of, or consists of tungsten.

The conductive materials 68 and 72 together form a top electrode (or a plate electrode) 68/72.

The leaker-device-structures 55 extend between the bottom electrodes 54 and the top electrode 68/72. The leaker-device-structures 55 are directly against the bottom-electrode-material 40 (alternatively considered, are directly against the bottom electrodes 54), and are directly against the top-electrode-material 72 (alternatively considered, are directly against the plate electrode 68/72).

The bottom electrodes 54, insulative-material 70, and plate electrode 68/72 together form capacitors 82 (one of which is labeled in FIG. 15A). The capacitors are incorporated into memory cells 80 (one of which is labeled in FIG. 15A), with the individual memory cells 80 each including an access transistor 84 coupled with a capacitor 82 (one of the access transistors 84 is diagrammatically labeled in FIG. 15A). Each of the access transistors 84 includes a pillar 12 and a region of a transistor gate 26 adjacent such pillar. A memory array 78 (memory device) comprises the memory cells 80.

The cross-sectional view of FIG. 15A shows two of the source/drain regions 16 labeled as 16a and 16b. The regions 16a and 16b may be referred to as first and second source/drain regions, respectively. First and second bottom electrodes 54a and 54b are shown to be electrically coupled with the first and second source/drain regions, respectively. The first and second bottom electrodes 54a and 54b are laterally spaced from one another by an intervening region 130. First and second leaker-device-structures 55a and 55b extend into such intervening region from the first and second bottom electrodes 54a and 54b, and are in direct contact with the top-electrode-material 72.

In some embodiments, the leaker-device-structures (leaker devices) 55 may be considered to be resistive interconnects coupling bottom electrodes 54 to the top electrode 68/72 within the individual capacitors 82, and may be utilized to drain excess charge from the bottom electrodes 54 to alleviate or prevent undesired charge build-up. If the leaker devices 55 are too leaky, then one or more memory cells 80 may experience cell-to-cell disturb. If the leaker devices 55 are not leaky (conductive) enough, then excess charge from the bottom electrodes 54 may not be adequately drained. Persons of ordinary skill in the art will recognize how to calculate the resistance needed for the leaker devices 55 for a given memory array. In some embodiments, the leaker devices 55 may have resistance within a range of from about 0.1 megaohms to about 5 megaohms. Factors such as separation between adjacent memory cells, physical dimensions of the memory cells, the amount of charge placed in the memory cells, a size of the memory array, a frequency of operations conducted by the memory array, etc., may be considered when making a determination of the resistance appropriate for the leaker devices 55.

The insulative-material 70 extends into the intervening regions 130 in the illustrated embodiment of FIG. 15A. In other embodiments, the ferroelectric-insulative-material may not extend into such intervening regions.

The bottom electrodes 54 (e.g., 54a) may be considered to have inner surfaces 131 adjacent to the intervening regions 130, and to have outer surfaces 133 in opposing relation to the inner surfaces. In the shown embodiment of FIG. 15A, the insulative-material 70 is directly adjacent to the inner surfaces 131, and is not directly adjacent to the outer surfaces 133 (instead, the material 42 is directly adjacent to the outer surfaces 133).

In some embodiments, the bottom electrodes 54a and 54b of FIG. 15A may be considered to represent a pair of neighboring electrodes along the column direction (i.e., the y-axis direction), and may be referred to as paired-neighboring-electrodes. The intervening region 130 is between the paired-neighboring-electrodes 54a and 54b. The leaker-device-structures 55a and 55b extend from the paired-neighboring-electrodes 54a and 54b, respectively, and join to the plate electrode 68/72.

The embodiment of FIG. 15A has the leaker-device-structures 55a and 55b extending from lower regions of the bottom electrodes 54a and 54b. In other embodiments, the leaker-device-structures may extend from upper regions of the bottom electrodes as described with reference to FIGS. 16-24.

Figure 16:
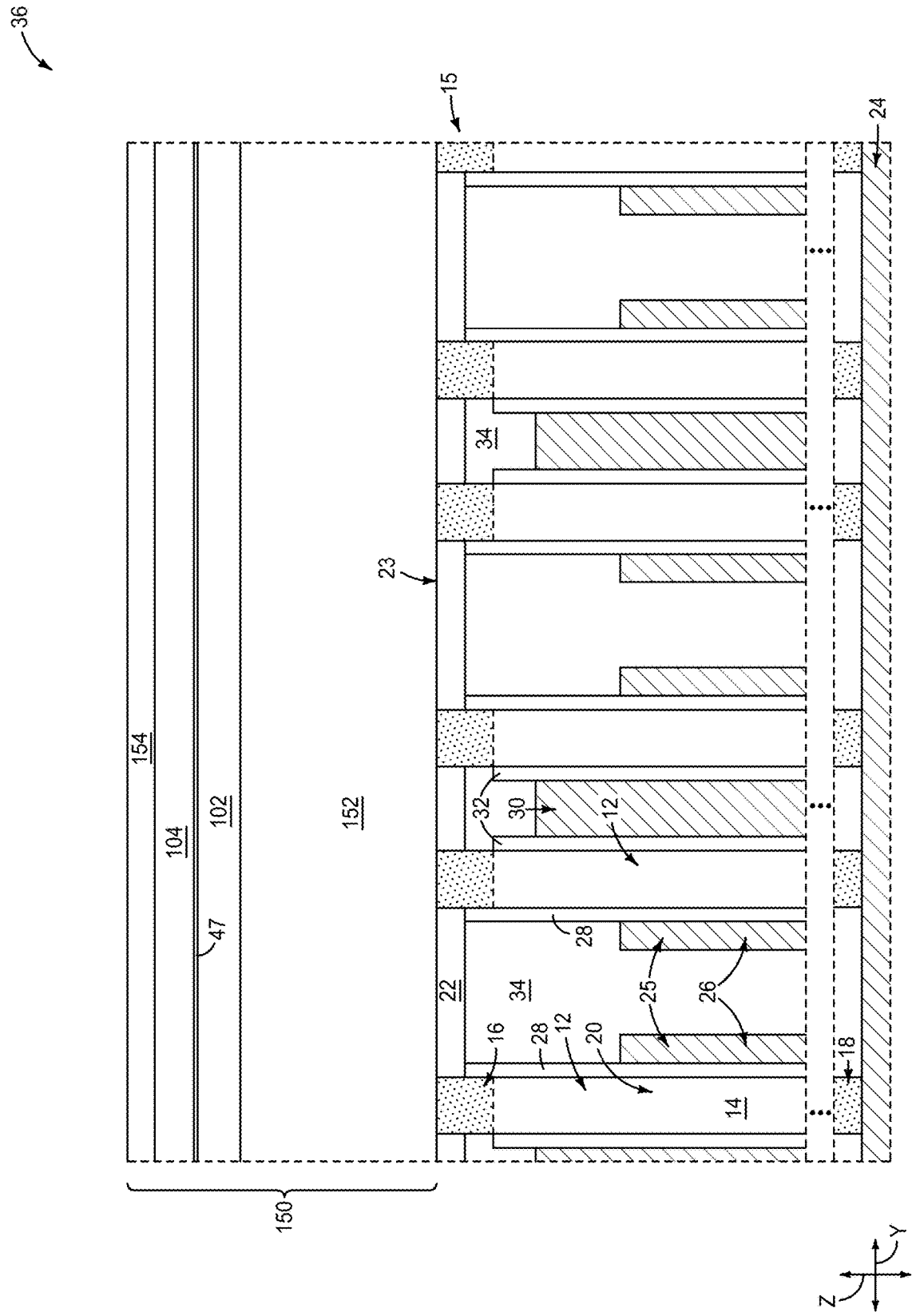
FIGS. 16-24 are diagrammatic cross-sectional side views of an example assembly at example sequential process stages of an example method. The process stage of FIG. 16 may follow that of FIG. 1A, and may be alternative to that of FIG. 2A.

FIG. 16 shows the assembly 36 at a process stage which may follow that of FIG. 1A. A stack 150 is formed over the planarized surface 23. The stack 150 is analogous to the stack 100 of FIG. 2A, but comprises the leaker-device-material 47 within an upper portion of the stack rather than within a lower portion of the stack. In the illustrated embodiment, the stack 150 comprises a first material 152, the materials 102, 47 and 104, and another material 154 over the material 104. The materials 152 and 154 may comprise any suitable composition(s), and may or may not comprise the same composition as one another. In some embodiments, the materials 152 and 154 may comprise, consist essentially of, or consist of silicon dioxide.

The material 47 may be within an upper half of the stack 150, an upper third of the stack 150, an upper quarter of the stack 150, etc.

Figure 17:
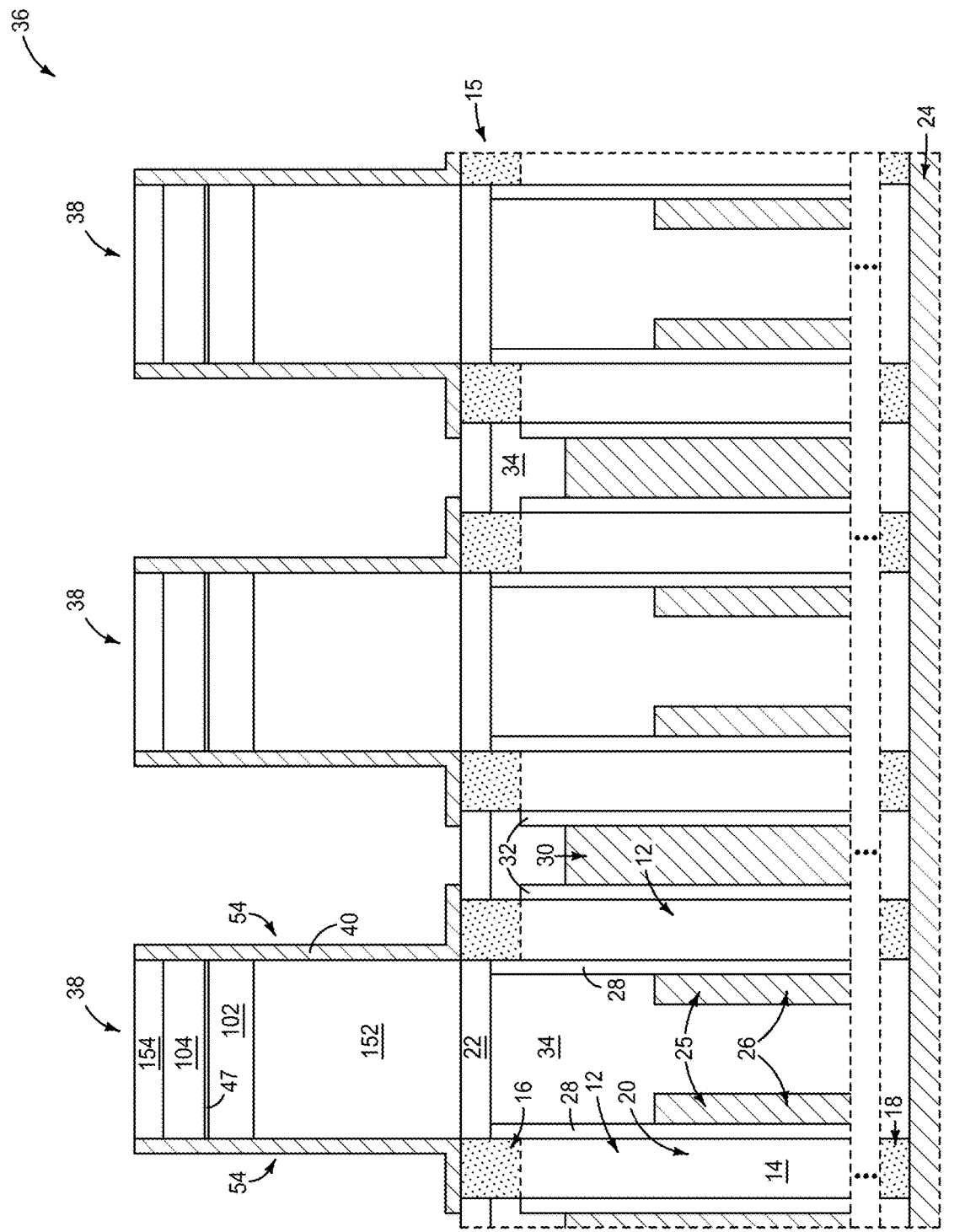

Referring to FIG. 17, the assembly 36 of FIG. 16 is shown after processing analogous to that described above with reference to FIGS. 3-9. Such processing patterns the materials 152, 102, 47, 104 and 154 into linear structures 38, and patterns bottom electrodes 54 to be along lateral edges of such linear structures.

Figure 18:
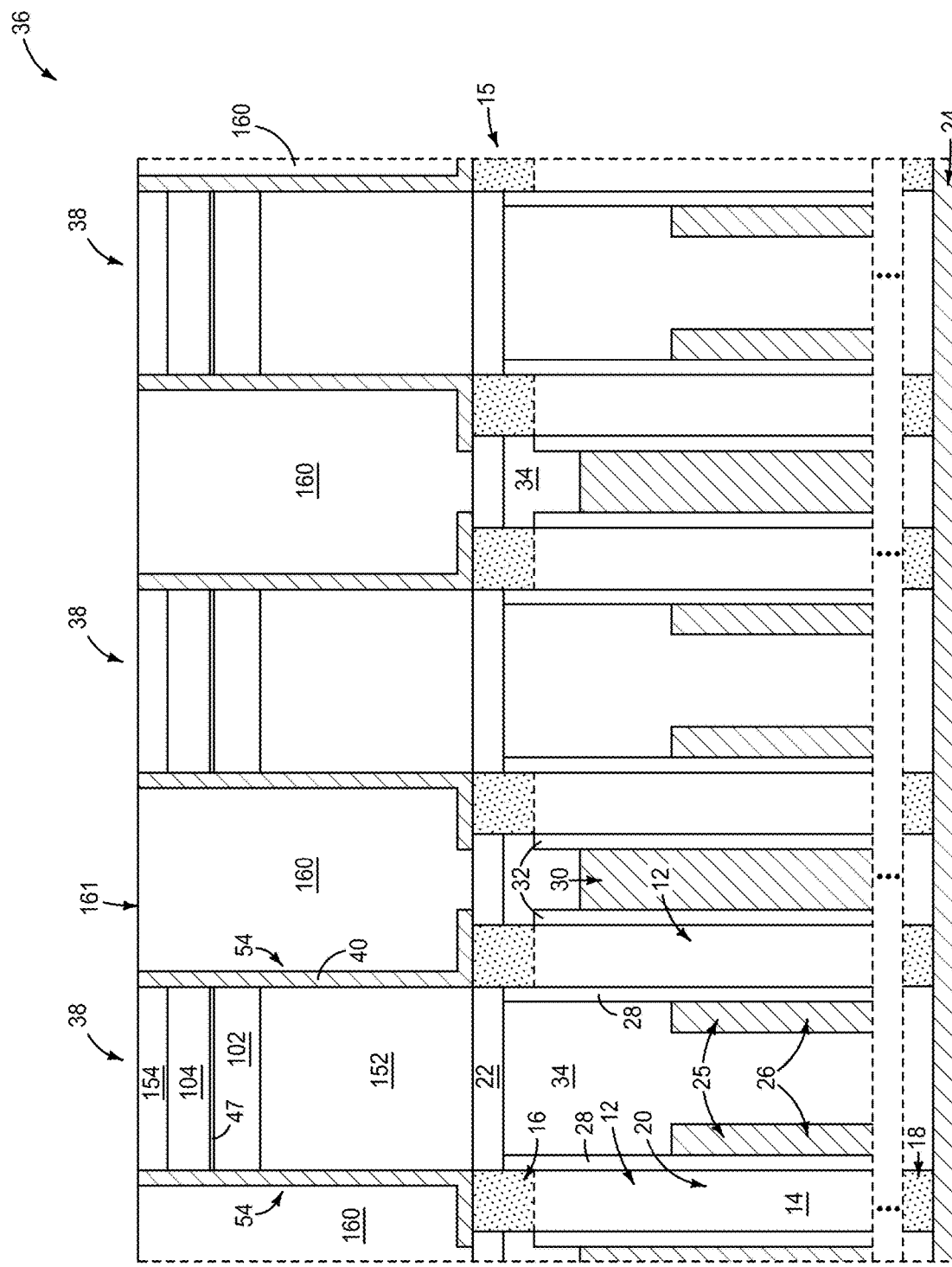

Referring to FIG. 18, fill material 160 is provided between the linear structures 38, and a planarized surface 161 is formed to extend across the materials 40, 154 and 160.

The material 160 may comprise any suitable composition(s), and in some embodiments may comprise any of the compositions described above as being suitable for the material 110 (e.g., may comprise carbon-doped silicon dioxide).

The planarized surface 161 may be formed with any suitable processing, including, for example, CMP.

Figure 19:
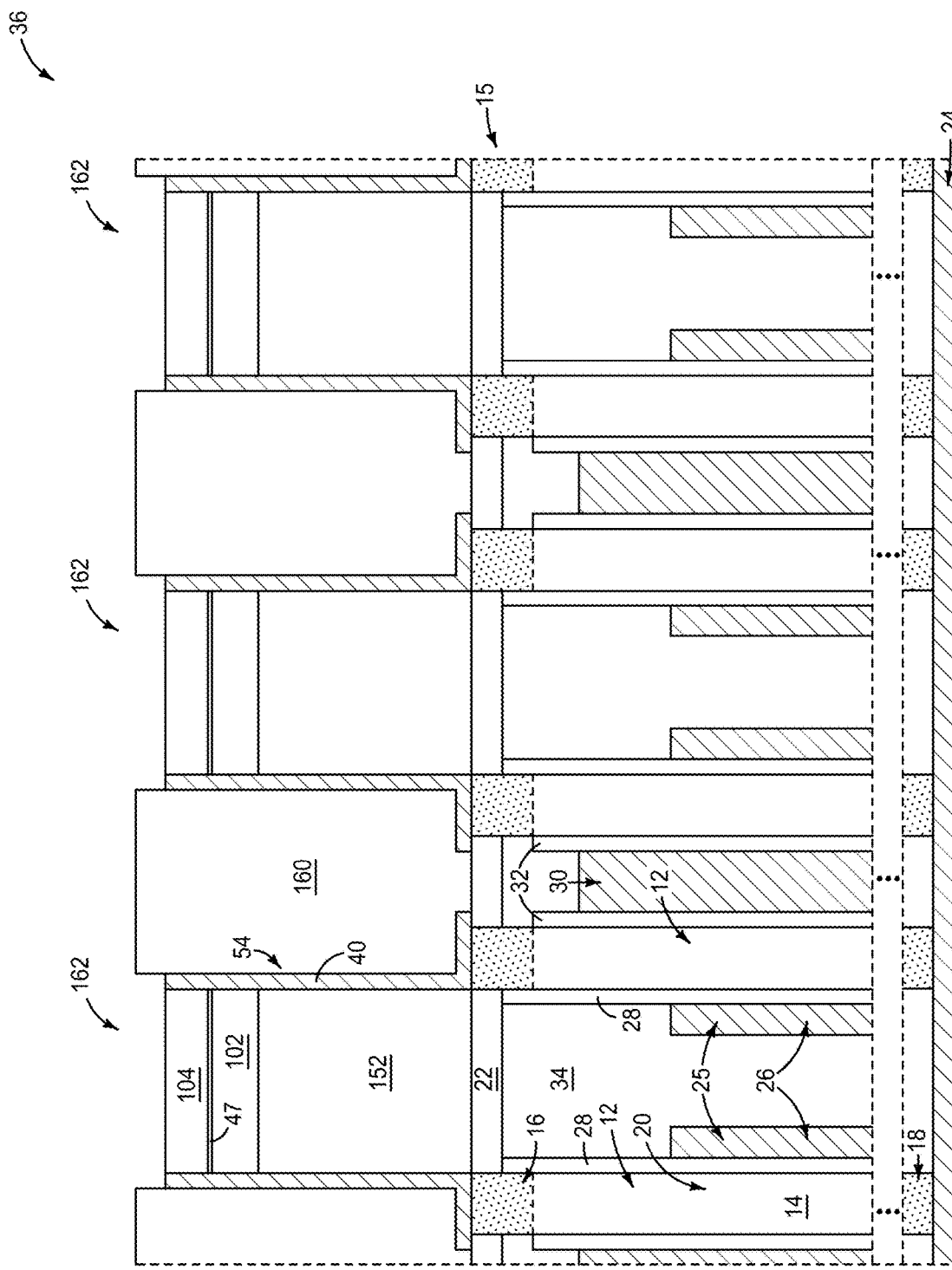

Referring to FIG. 19, trenches 162 (analogous to the trenches 118 of FIG. 12A) are formed with processing analogous to that described above with reference to FIGS. 12-12B.

Figure 20:
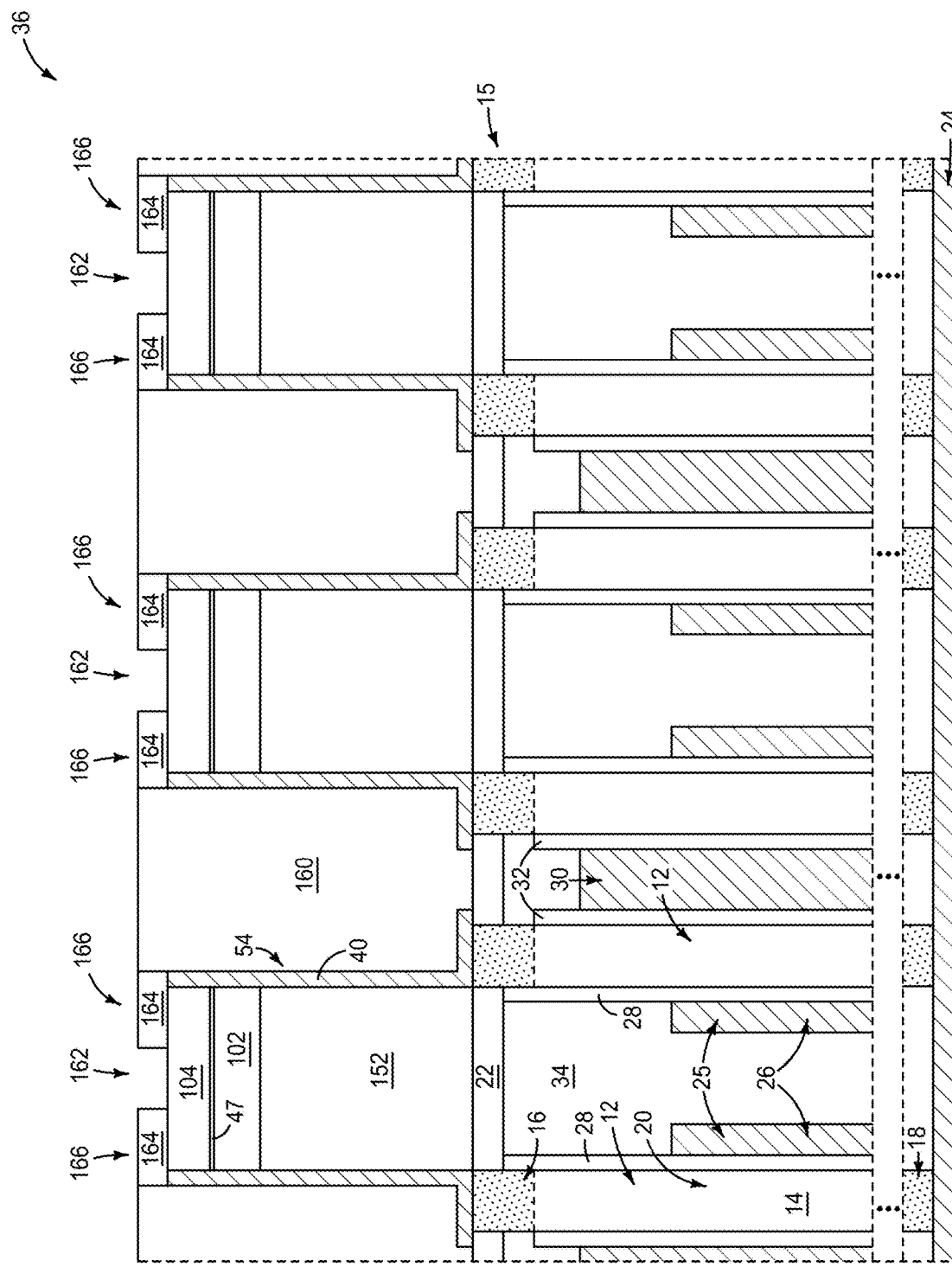

Referring to FIG. 20, spacer material 164 is patterned into spacers 166 which narrow the trenches (openings, cavities) 162. The spacer material 164 may comprise any suitable composition(s), and in some embodiments may comprise, consist essentially of, or consist of silicon dioxide. The spacers 166 may be formed with any suitable processing, including, for example, deposition of the material 164 across an upper surface of the assembly 36, followed by anisotropic etching of such material to pattern the material into the spacers.

Figure 21:
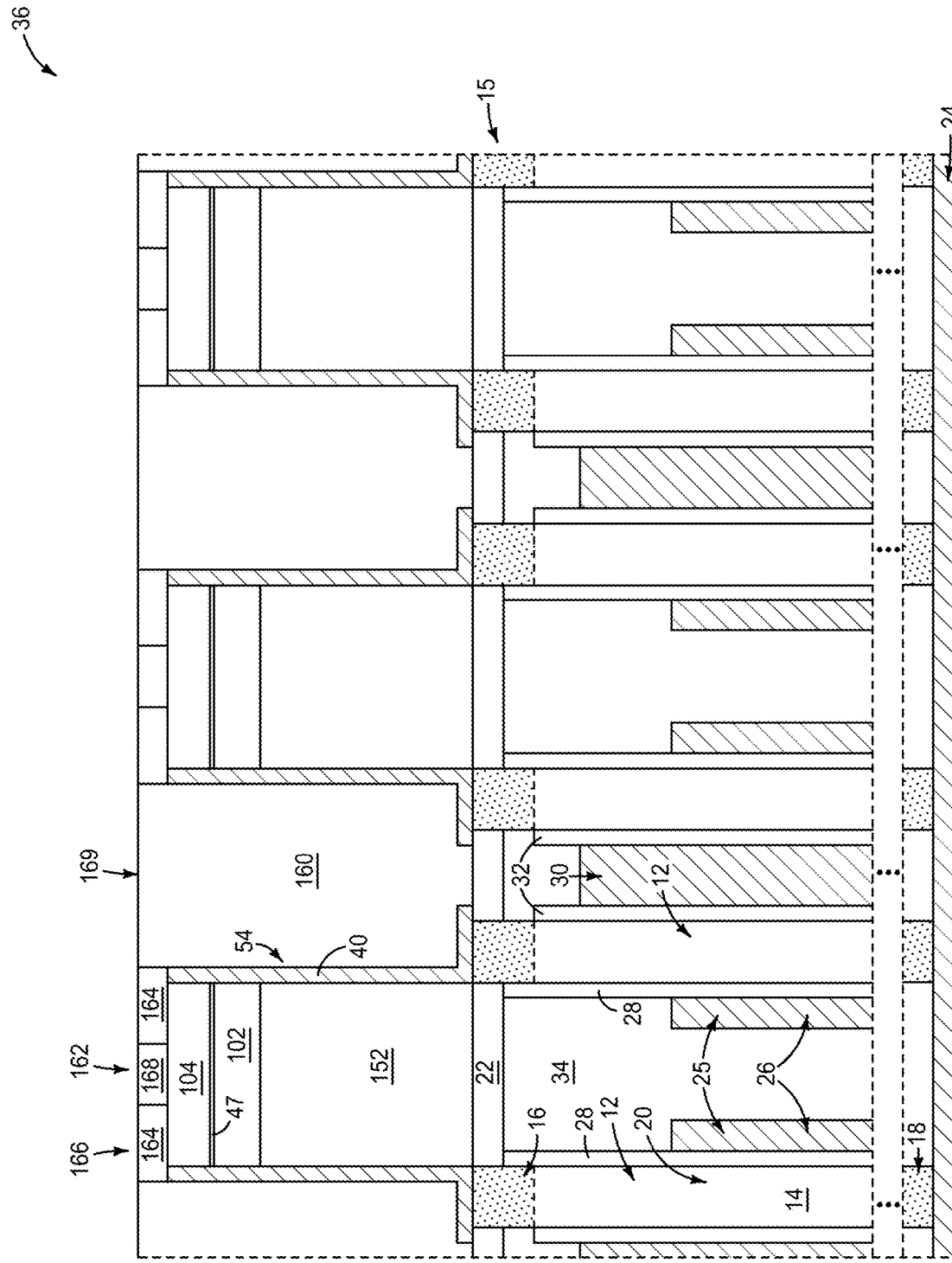

Referring to FIG. 21, fill material 168 is provided within the narrowed openings 162, and a planarized surface 169 is formed to extend across the materials 160, 164 and 168.

The fill material 168 may comprise any suitable composition(s), and in some embodiments may comprise, consist essentially of, or consist of silicon nitride.

The planarized surface 169 may be formed with any suitable processing, including, for example, CMP.

Figure 22:
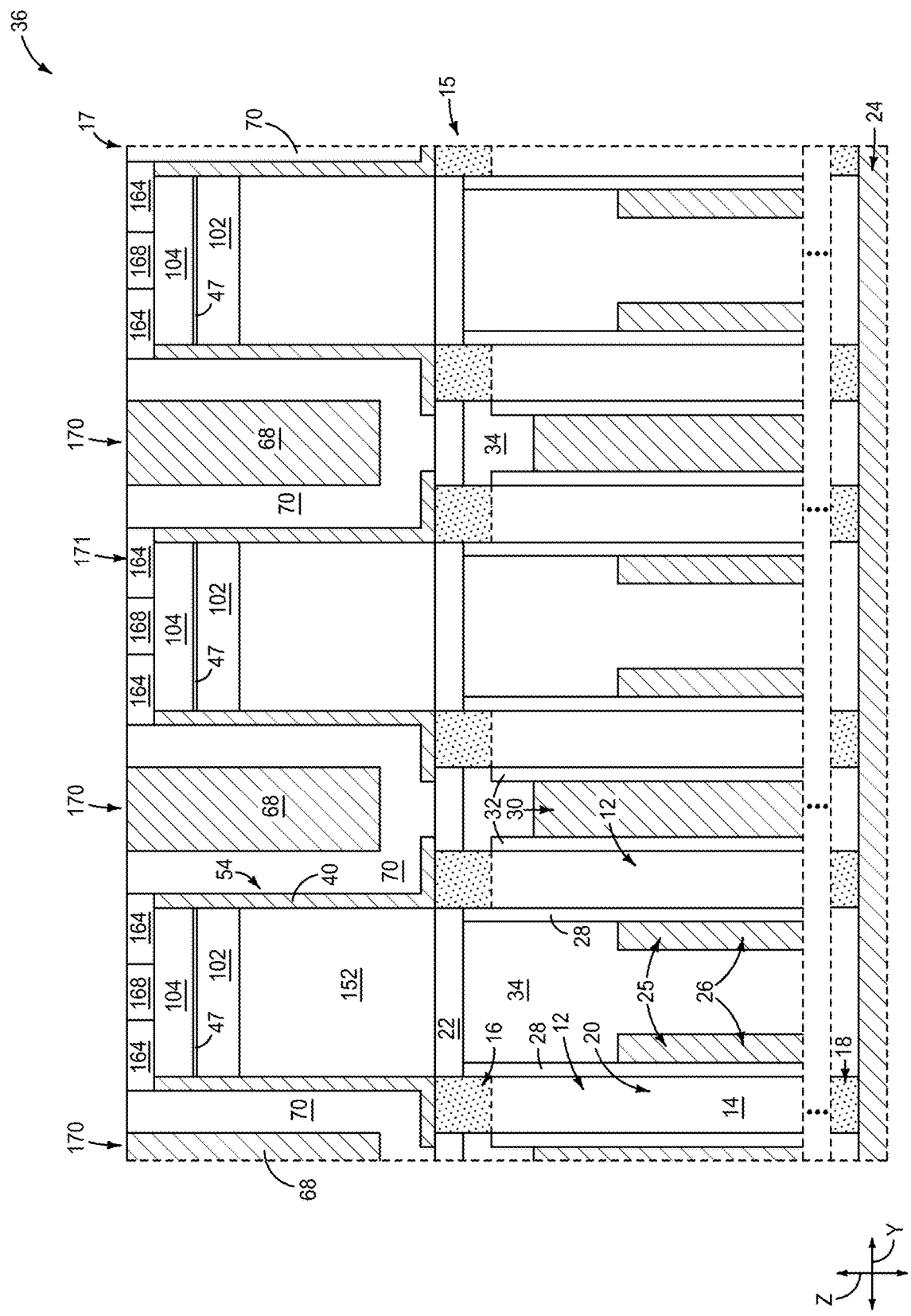

Referring to FIG. 22, the material 160 (FIG. 21) is selectively removed relative to the materials 22, 40, 164 and 168 to form openings 170. The insulative-material 70 and the top-electrode-material 68 are formed within such openings. A planarized surface 171 is formed to extend across the materials 68, 70, 164 and 168. The planarized surface 171 may be formed with any suitable processing, including, for example, CMP. Although the materials 68 and 70 are shown to fill the openings 170, in other embodiments, the materials 68 and 70 may only partially fill the openings 170 to narrow the openings. In such embodiments, sacrificial material may be formed within the narrowed openings prior to forming the planarized surface 171, and such sacrificial material may be removed prior to forming the material 72 at a process stage described below with reference to FIG. 24.

Figure 23:
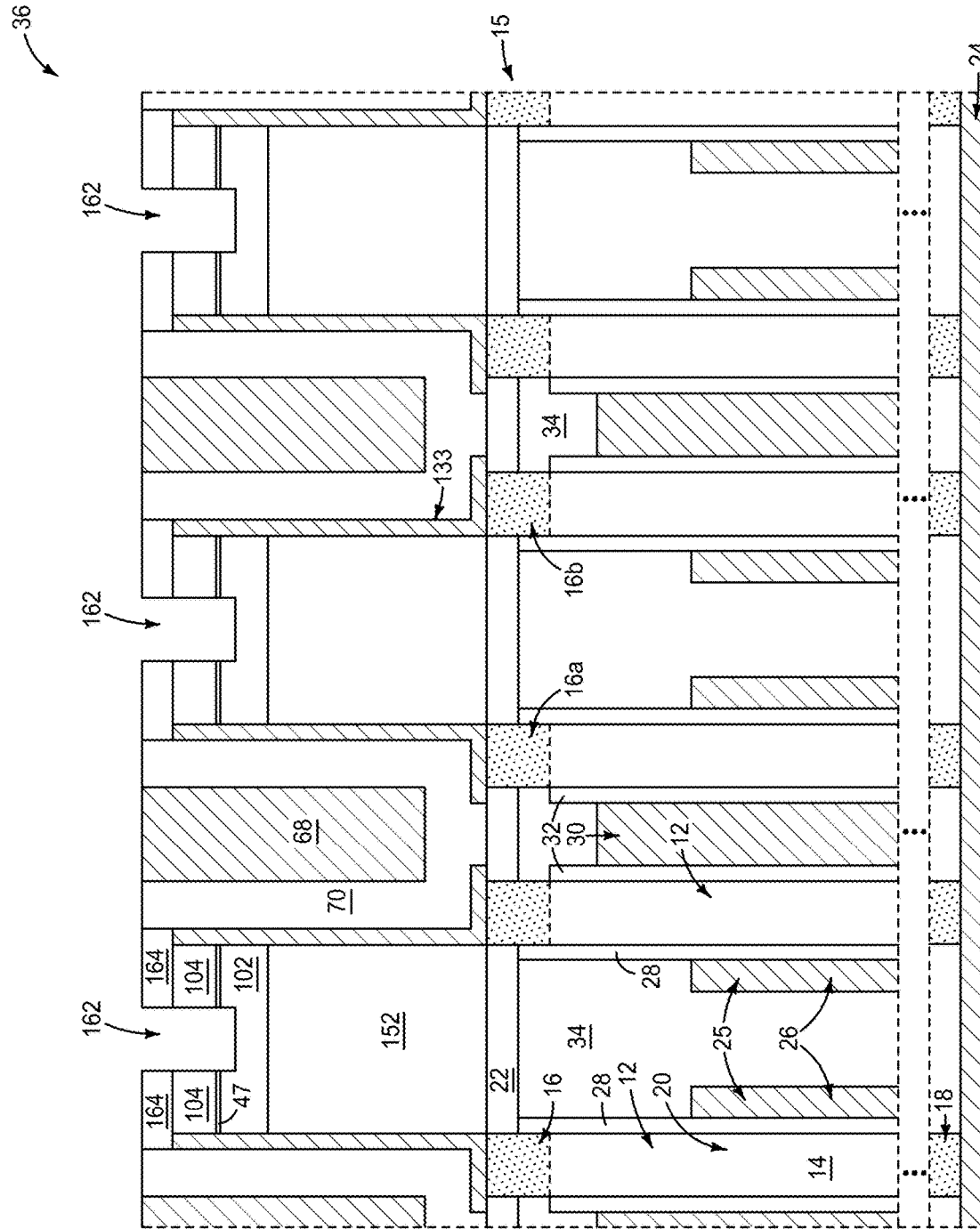

Referring to FIG. 23, the material 168 (FIG. 22) is removed to reestablish the openings 162, and subsequently such openings are extended through the leaker-device-material 47.

Figure 24:
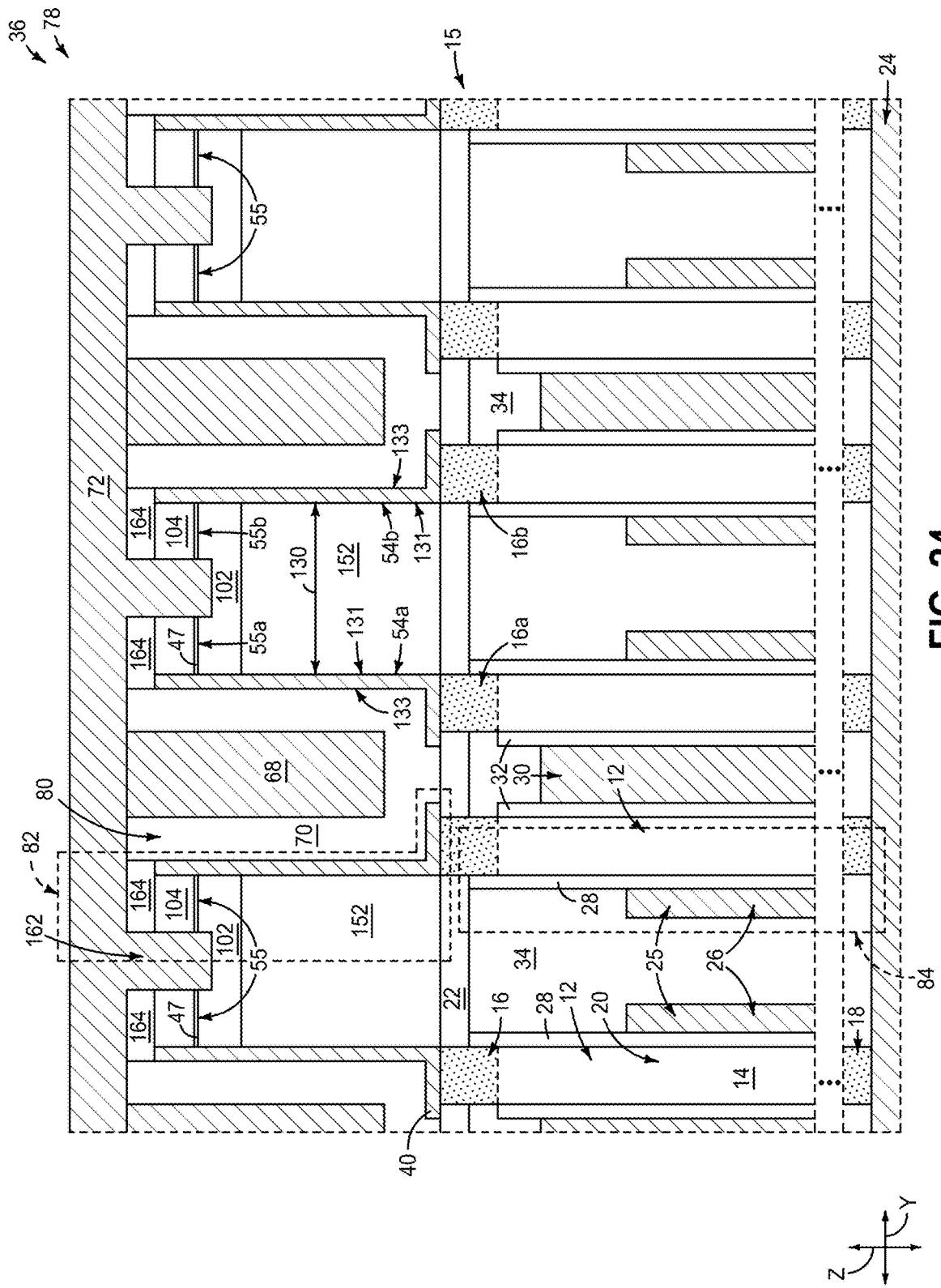

Referring to FIG. 24, the additional top-electrode-material 72 is formed to extend into the openings 162, as well as to be directly adjacent to the first top-electrode-material 68. The materials 68 and 72 together form the plate electrode 68/72.

Two of the source/drain regions 16 of FIG. 24 are labeled as 16a and 16b, and may be referred to as first and second source/drain regions, respectively (similar to the embodiment of FIG. 15A). The first and second bottom electrodes 54a and 54b are shown to be electrically coupled with the first and second source/drain regions, respectively. The first and second bottom electrodes 54a and 54b are laterally spaced from one another by the intervening region 130. First and second leaker-device-structures 55a and 55b extend into such intervening region from the first and second bottom electrodes 54a and 54b, and are in direct contact with the top-electrode-material 72. The first and second leaker-device-structures 55a and 55b are along upper regions of the bottom electrodes 54 in the embodiment of FIG. 24, in contrast to the embodiment of FIG. 15A in which analogous leaker-device-structures are along lower regions of the bottom electrodes.

The bottom electrodes 54 (e.g., 54a) have the inner surfaces 131 adjacent to the intervening regions 130, and have outer the surfaces 133 in opposing relation to the inner surfaces. In the shown embodiment of FIG. 24, the insulative-material 70 is directly adjacent to the outer surfaces 133, and is not directly adjacent to the inner surfaces 131, in contrast to the embodiment of FIG. 15A.

The embodiment of FIG. 24 has materials 152 and 102 under the leaker-device-structures 55 within the intervening regions. In some embodiments, the materials 152 and 102 may be referred to as first and second materials, respectively. In some embodiments, the first material 152 may comprise, consist essentially of, or consist of silicon dioxide, and the second material 102 may comprise, consist essentially of, or consist of silicon nitride. In the illustrated embodiment, the second material 102 is directly against the leaker-device-structures 55, and is also directly against an upper surface of the first material 152.

The integrated assembly 36 of FIG. 24 includes capacitors 82 analogous to those described above with reference to FIG. 15A, and includes access transistors 84 analogous to those described above with reference to FIG. 15A. The capacitors 82 and access transistors 84 are together incorporated into memory cells 80 of a memory array 78.

Each of the memory cells 80 of FIGS. 15A and 24 is uniquely addressed by one of the wordlines 25 in combination with one of the digit lines 24.

The capacitors 82 of FIGS. 15A and 24 are ferroelectric capacitors comprising the ferroelectric-insulative-material. Accordingly, the memory array 78 may comprise FeRAM.

The memory array 78 may have any suitable configuration. An example FeRAM array 78 is described schematically with reference to FIG. 25. The memory array includes a plurality of substantially identical ferroelectric capacitors 82. The wordlines 25 extend along rows of the memory array, and the digit lines 24 extend along columns of the memory array. Each of the capacitors 82 is within a memory cell 80 which is uniquely addressed utilizing a combination of a wordline and a digit line. The wordlines extend to driver circuitry 192, and the digit lines 24 extend to detecting (sensing) circuitry 190. In the illustrated embodiment, the top electrodes of the capacitors 38 are shown coupled with plate lines 180 which extend to an appropriate reference source 196 (the plate lines 180 may be coupled with, or extensions of, the plates 68/72 described above).

In some embodiments, the memory cells 80 of the memory array 78 may be considered to be substantially identical to one another, and to be representative of a large number of substantially identical memory cells which may be formed across the memory array. For instance, the memory array may comprise hundreds, thousands, hundreds of thousands, millions, hundreds of millions, etc., of the memory cells. The wordlines 25 may be representative of a large number of substantially identical wordlines that may extend along rows of the memory array, and the digit lines 24 may be representative of a large number of substantially identical digit lines that may extend along columns of the memory array. The term "substantially identical" means identical to within reasonable tolerances of fabrication and measurement.

At least some of the circuitry 190, 192 and 196 of FIG. 25 may be directly under the memory array 78 in some embodiments. One or more of the circuitries 190, 192 and 196 may include CMOS, and accordingly some embodiments may include CMOS-under-array architecture.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having first and second pillars of semiconductor material. The first pillar includes, in ascending order, a first lower source/drain region, a first channel region and a first upper source/drain region. The second pillar includes, in ascending order, a second lower source/drain region, a second channel region and a second upper source/drain region. A conductive structure is coupled with the first and second lower source/drain regions, and extends along a first direction. A first bottom electrode is coupled with the first upper source/drain region. A second bottom electrode is coupled with the second upper source/drain region, and is spaced from the first bottom electrode by an intervening region. First and second leaker-device-structures extend into the intervening region from the first and second bottom electrodes, respectively. Top-electrode-material extends into the intervening region and contacts the first and second leaker-device-structures. Ferroelectric-insulative-material is between the top-electrode-material and the bottom electrodes.

Some embodiments include an integrated assembly having pillars arranged in an array. The array comprises a row direction and a column direction. The pillars have upper source/drain regions, lower source/drain regions, and channel regions between the upper and lower source/drain regions. Gating structures are proximate the channel regions and extend along the row direction. Conductive structures are beneath the pillars and are coupled with the lower source/drain regions. The conductive structures extend along the column direction. Bottom electrodes are coupled with the upper source/drain regions. The bottom electrodes are configured as angle plates. The angle plates have horizontal segments adjacent the upper source/drain regions and have vertical segments extending upwardly from the horizontal segments. Pairs of the bottom electrodes along the column direction are configured as paired-neighboring-electrodes. Intervening regions are between the neighboring electrodes of the paired-neighboring-electrodes. Leaker-device-structures extend from the bottom electrodes into the intervening regions. Ferroelectric-insulative-material is over the bottom electrodes. Top-electrode-material is over the ferroelectric-insulative-material. Regions of the top electrode material extend downwardly into the intervening regions and contact the leaker-device-structures.

Some embodiments include a method of forming an integrated assembly. A construction is formed to have an array of pillars. The pillars comprise semiconductor material. The array comprises rows and columns, with the rows extending along a row direction and with the columns extending along a column direction. The pillars have upper source/drain regions, lower source/drain regions, and channel regions between the upper and lower source/drain regions. The construction includes gating structures extending along the row direction and proximate the channel regions, and includes conductive structures extending along the column direction and coupled with the lower source/drain regions. The construction includes a first insulative material between the upper source/drain regions of the pillars. An upper surface of the construction extends across the first insulative material and across upper surfaces of the upper source/drain regions. Linear structures are formed over the upper surface and extend along the row direction. Each of the linear structures has a first lateral side and an opposing second lateral side. The linear structures include regions of leaker-device-material that extend laterally through the linear structures. Outer edges of said regions of the leaker-device-material are along the first and second lateral sides. Bottom-electrode-material is formed conformally along the linear structures. The bottom electrode material directly contacts the outer edges of the regions of the leaker-device-material. The bottom-electrode-material is patterned into bottom-electrode-structures. The bottom-electrode-structures have first segments along the upper surfaces of the upper source/drain regions and have second segments along the lateral sides of the linear structures. Ferroelectric-insulative-material is formed over the bottom-electrode-structures. Openings are formed to extend into the linear structures to expose the regions of the leaker-device-material. Top-electrode-material is formed over the ferroelectric-insulative-material and within the openings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A capacitor, comprising:
   a bottom electrode;
   a top electrode;
   an insulative material between the top electrode and the bottom electrode; and
   a leaker device extending to the bottom electrode and to the top electrode, the entire structure of the leaker device is in a single plane.

2. The capacitor of claim 1 wherein the leaker device is along a lower portion of the bottom electrode.

3. The capacitor of claim 1 wherein the leaker device is along an upper portion of the bottom electrode.

4. The capacitor of claim 1 wherein the bottom electrode is configured as angle plates.

5. The capacitor of claim 1 wherein the bottom electrode is configured as L-shaped plates.

6. The capacitor of claim 1 wherein the bottom electrode comprises a vertically-extending leg joining to a horizontally-extending leg.

7. The capacitor of claim 6 wherein the vertically-extending leg is longer than the horizontally-extending leg.

8. The capacitor of claim 1 wherein the leaker device has a thickness within a range of from about 2 Å to about 20 Å.

9. The capacitor of claim 1 wherein the leaker device has a thickness within a range of from about 6 Å to about 15 Å.

10. The capacitor of claim 1 wherein the leaker device comprises one or more of Ti, Ni and Nb, in combination with one or more of Ge, Si, O, N and C.

11. The capacitor of claim 1 wherein the leaker device comprises one or more of Si, Ge, SiN, TiSiN, TiO, TiN, NiO, NiON and TiON, where the chemical formulas indicate primary constituents rather than particular stoichiometries.

12. The capacitor of claim 1 wherein the leaker device comprises titanium, oxygen and nitrogen.

13. A capacitor, comprising:
    a bottom electrode;
    a top electrode;
    a ferroelectric-insulative-material between the top electrode and the bottom electrode; and
    a leaker device extending to the bottom electrode and to the top electrode, and contacting opposite sides of the top electrode.

14. The capacitor of claim 13 wherein the ferroelectric-insulative-material comprises one or more of zirconium, zirconium oxide, niobium, niobium oxide, hafnium, hafnium oxide, lead zirconium titanate, and barium strontium titanate.

15. The capacitor of claim 13 wherein the ferroelectric-insulative-material comprises dopant comprising one or more of silicon, aluminum, lanthanum, yttrium, erbium, calcium, magnesium and strontium.

16. The capacitor of claim 13 wherein the bottom electrode is configured as angle plates.

17. The capacitor of claim 13 wherein the bottom electrode is configured as L-shaped plates.

18. The capacitor of claim 13 wherein the bottom electrode comprises a vertically-extending leg joining to a horizontally-extending leg.

19. The capacitor of claim 18 wherein the vertically-extending leg is longer than the horizontally-extending leg.

20. The capacitor of claim 18 wherein the leaker device contacts the vertically-extending leg of the bottom electrode.

21. A capacitor, comprising:
    a bottom electrode;
    a top electrode;
    an insulative material between the top electrode and the bottom electrode; and
    a leaker device extending to the bottom electrode and to the top electrode, and extending through the insulative material.

22. The capacitor of claim 21 wherein the leaker device contacts only one side of the bottom electrode.

23. The capacitor of claim 21 wherein the leaker device contacts opposite sides of the top electrode.

24. A capacitor, comprising:
    a bottom electrode;
    a top electrode;
    an insulative material between the top electrode and the bottom electrode; and
    a leaker device extending to the bottom electrode and to the top electrode, and contacting only one side of bottom electrode.

25. The capacitor of claim 24 wherein the entire structure of the leaker device is in a single plane.

26. The capacitor of claim 24 wherein the leaker device contacts opposite sides of the top electrode.

* * * * *